(12) United States Patent
Ohshita et al.

(10) Patent No.: US 12,082,391 B2
(45) Date of Patent: Sep. 3, 2024

(54) MEMORY DEVICE

(71) Applicant: Semiconductor Energy Laboratory Co., Ltd., Atsugi (JP)

(72) Inventors: Satoru Ohshita, Atsugi (JP); Hitoshi Kunitake, Isehara (JP); Kazuki Tsuda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 253 days.

(21) Appl. No.: 17/762,473

(22) PCT Filed: Sep. 25, 2020

(86) PCT No.: PCT/IB2020/058976
§ 371 (c)(1),
(2) Date: Mar. 22, 2022

(87) PCT Pub. No.: WO2021/069998
PCT Pub. Date: Apr. 15, 2021

(65) Prior Publication Data
US 2022/0344334 A1  Oct. 27, 2022

(30) Foreign Application Priority Data
Oct. 11, 2019 (JP) .................. 2019-187386

(51) Int. Cl.
*H01L 27/14* (2006.01)
*H01L 27/12* (2006.01)
(Continued)

(52) U.S. Cl.
CPC ......... *H10B 12/00* (2023.02); *H01L 27/1207* (2013.01); *H01L 27/1225* (2013.01);
(Continued)

(58) Field of Classification Search
CPC ..... H10B 12/00; H10B 69/00; H01L 27/1207; H01L 27/1225; H01L 27/124;
(Continued)

(56) References Cited

U.S. PATENT DOCUMENTS

| 7,674,650 B2 | 3/2010 | Akimoto et al. |
| 7,732,819 B2 | 6/2010 | Akimoto et al. |

(Continued)

FOREIGN PATENT DOCUMENTS

| JP | 2007-123861 A | 5/2007 |
| JP | 2011-151383 A | 8/2011 |

(Continued)

OTHER PUBLICATIONS

International Search Report (Application No. PCT/IB2020/058976) Dated Dec. 15, 2020.

(Continued)

*Primary Examiner* — Tan N Tran
(74) *Attorney, Agent, or Firm* — Eric J. Robinson; Robinson Intellectual Property Law Office, P.C.

(57) ABSTRACT

A memory device with large storage capacity is provided. A NAND memory device includes a plurality of connected memory cells each provided with a writing transistor, a reading transistor, and a capacitor. An oxide semiconductor is used in a semiconductor layer of the writing transistor. The reading transistor includes a back gate. When a reading voltage is applied to the back gate, information stored in the memory cell is read out.

12 Claims, 39 Drawing Sheets

(51) Int. Cl.
    *H01L 29/786*     (2006.01)
    *H10B 12/00*     (2023.01)

(52) U.S. Cl.
    CPC ........ *H01L 27/124* (2013.01); *H01L 27/1255* (2013.01); *H01L 29/78648* (2013.01); *H01L 29/7869* (2013.01)

(58) Field of Classification Search
    CPC ........... H01L 27/1255; H01L 29/78648; H01L 29/7869; G11C 11/405
    USPC .............................................. 257/43, 59, 72
    See application file for complete search history.

(56) References Cited

U.S. PATENT DOCUMENTS

| | | | |
|---|---|---|---|
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,455,868 | B2 | 6/2013 | Yamazaki et al. |
| 8,466,463 | B2 | 6/2013 | Akimoto et al. |
| 8,598,648 | B2 | 12/2013 | Kato et al. |
| 8,629,069 | B2 | 1/2014 | Akimoto et al. |
| 8,669,550 | B2 | 3/2014 | Akimoto et al. |
| 8,790,959 | B2 | 7/2014 | Akimoto et al. |
| 8,796,069 | B2 | 8/2014 | Akimoto et al. |
| 9,099,562 | B2 | 8/2015 | Akimoto et al. |
| 9,349,735 | B2 | 5/2016 | Yamazaki et al. |
| 9,570,116 | B2 | 2/2017 | Kato |
| 9,852,778 | B2 | 12/2017 | Kato |
| 9,990,997 | B2 | 6/2018 | Matsuzaki et al. |
| 9,991,265 | B2 | 6/2018 | Yamazaki et al. |
| 10,304,962 | B2 | 5/2019 | Akimoto et al. |
| 10,553,589 | B2 | 2/2020 | Yamazaki et al. |
| 10,600,469 | B2 | 3/2020 | Kimura et al. |
| 10,839,883 | B2 | 11/2020 | Kimura et al. |
| 11,450,371 | B2 | 9/2022 | Kimura et al. |
| 2008/0308805 | A1 | 12/2008 | Akimoto et al. |
| 2011/0104851 | A1 | 5/2011 | Akimoto et al. |
| 2011/0121290 | A1 | 5/2011 | Akimoto et al. |
| 2017/0117283 | A1 | 4/2017 | Matsuzaki et al. |
| 2018/0269327 | A1* | 9/2018 | Endo .................. H01L 27/1225 |
| 2019/0051759 | A1 | 2/2019 | Akimoto et al. |
| 2019/0326444 | A1 | 10/2019 | Akimoto et al. |
| 2020/0176450 | A1 | 6/2020 | Yamazaki et al. |
| 2023/0005518 | A1 | 1/2023 | Kimura et al. |

FOREIGN PATENT DOCUMENTS

| | | |
|---|---|---|
| JP | 2011-216878 A | 10/2011 |
| JP | 2016-115387 A | 6/2016 |
| JP | 2017-168809 A | 9/2017 |
| JP | 2019-008862 A | 1/2019 |
| WO | WO-2017/068478 | 4/2017 |

OTHER PUBLICATIONS

Written Opinion (Application No. PCT/IB2020/058976) Dated Dec. 15, 2020.

\* cited by examiner

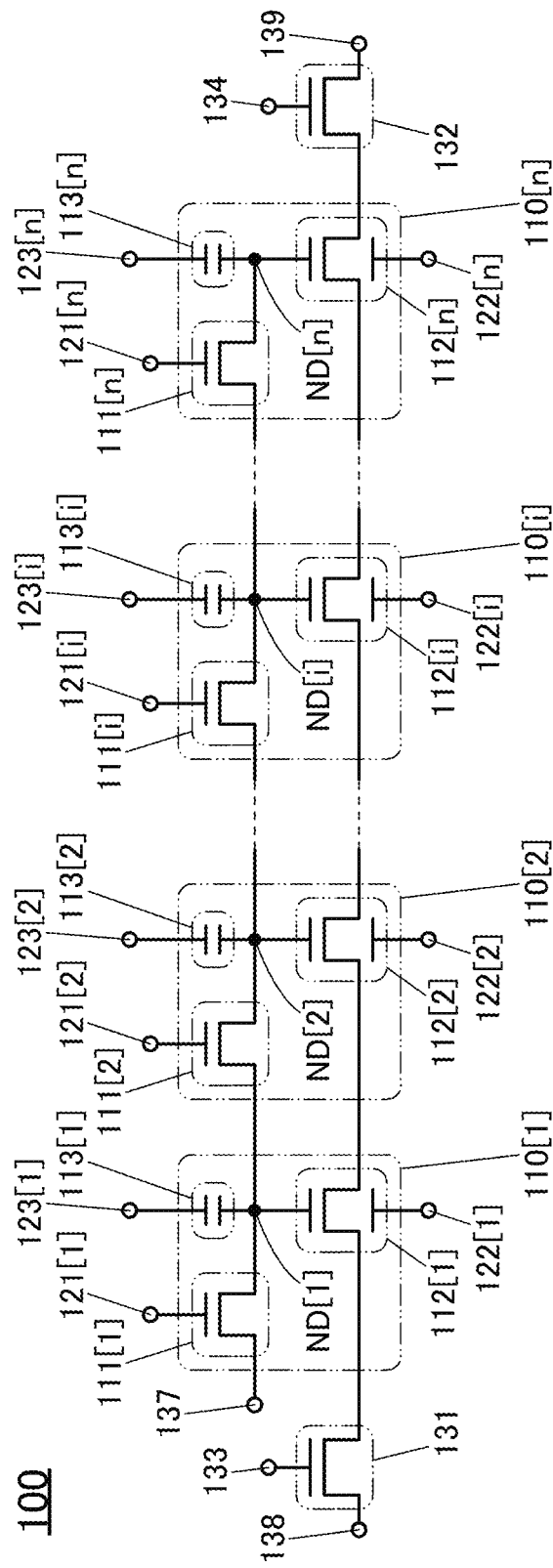
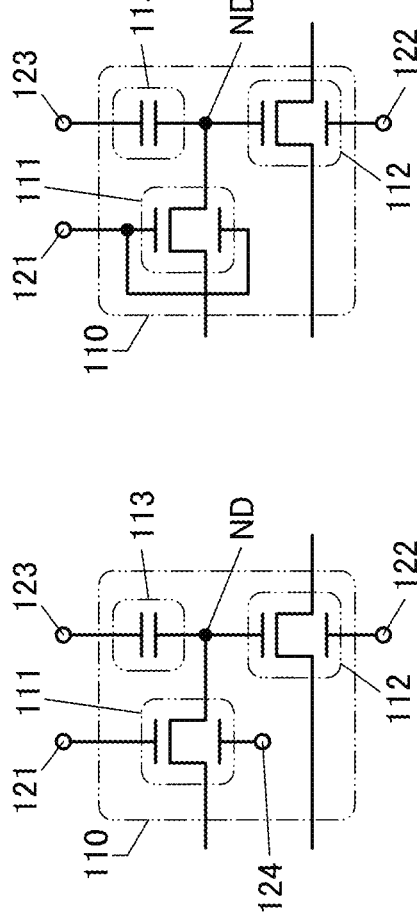
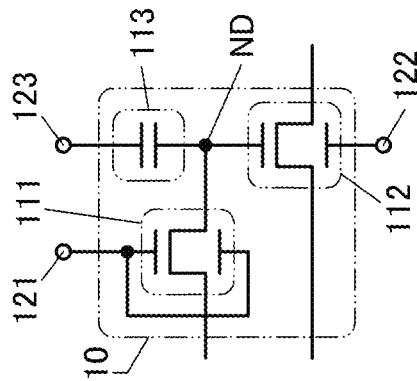
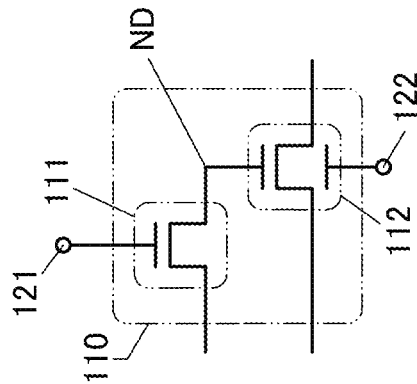
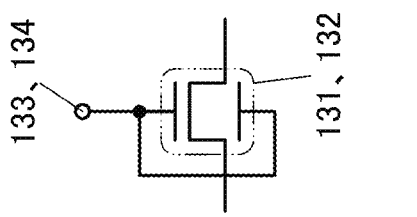

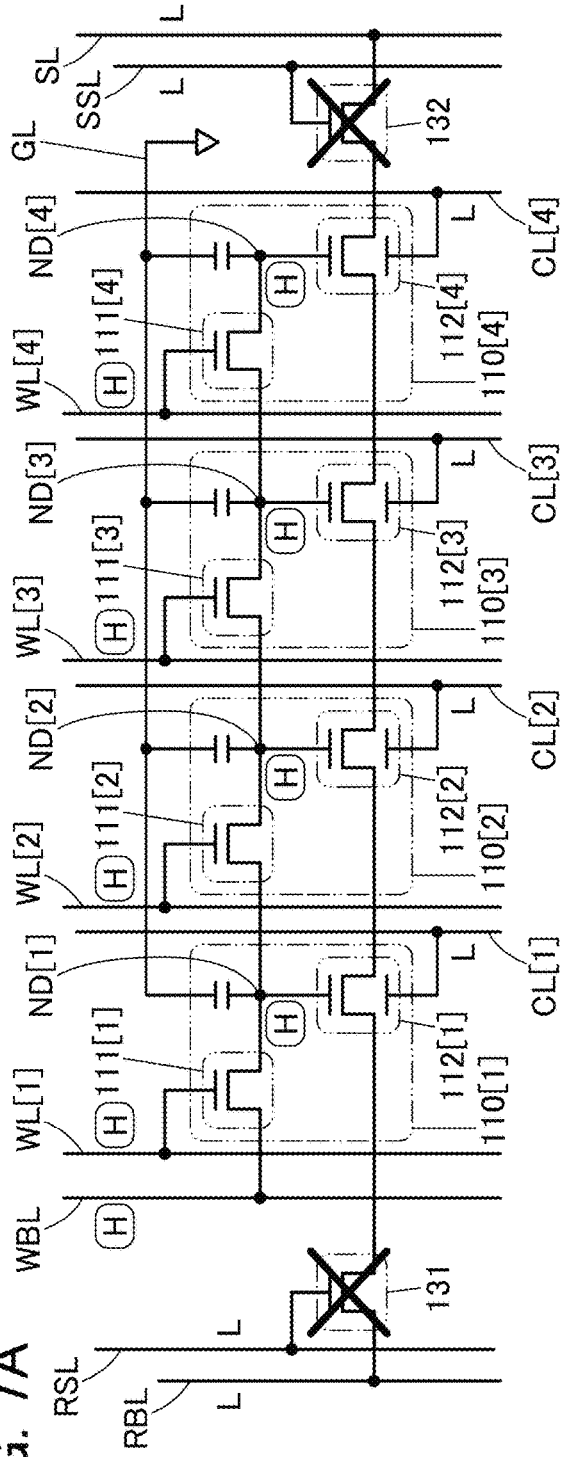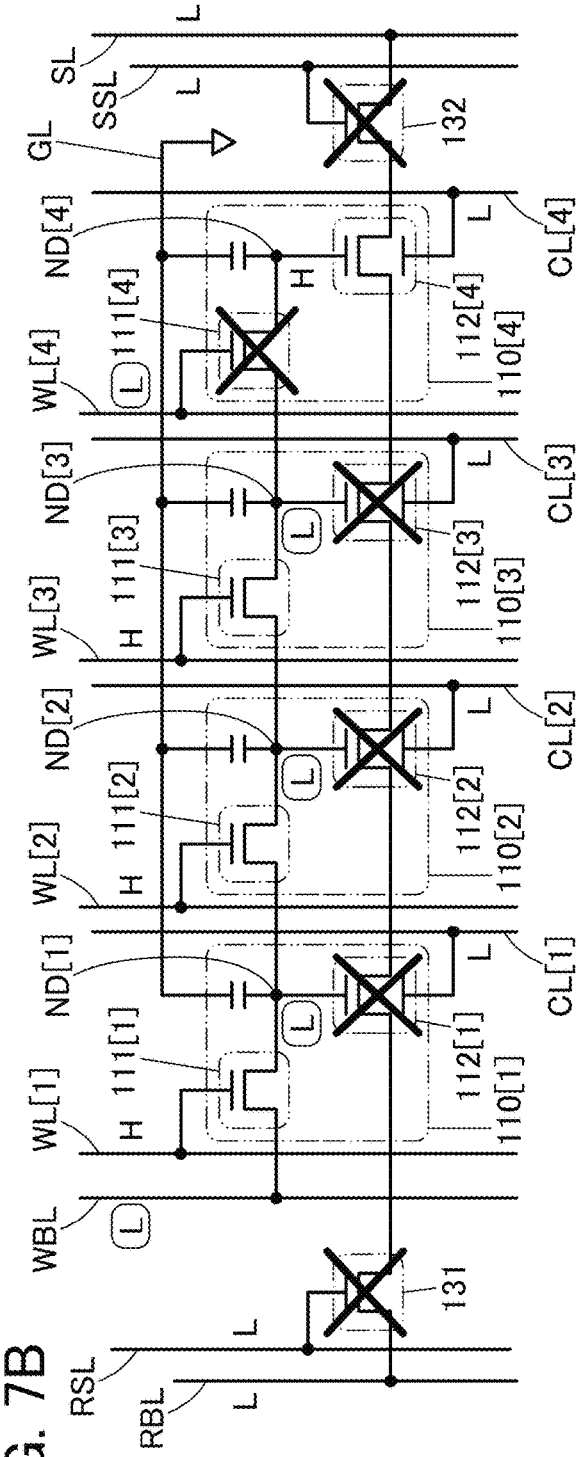

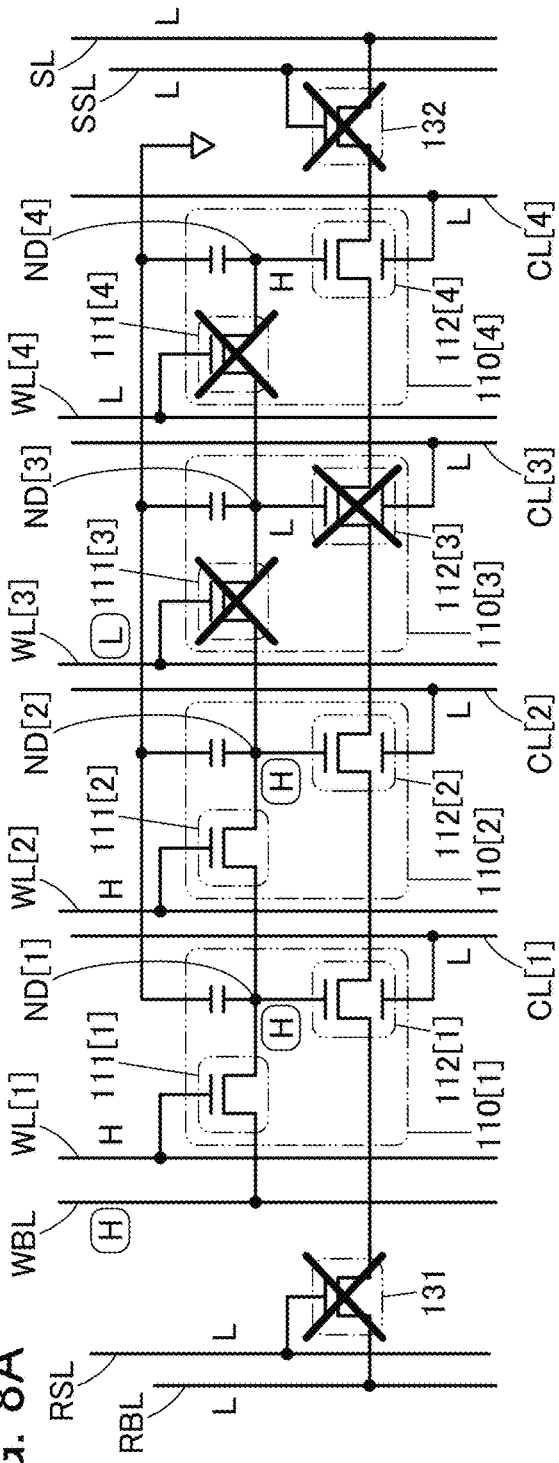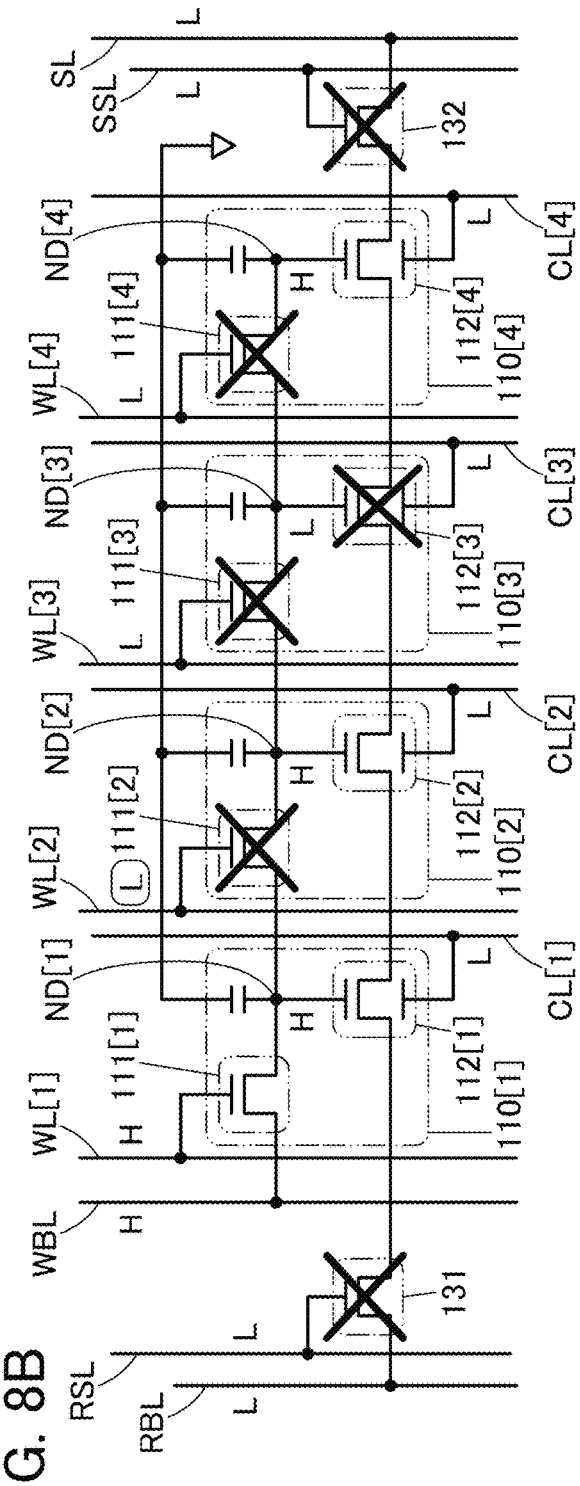

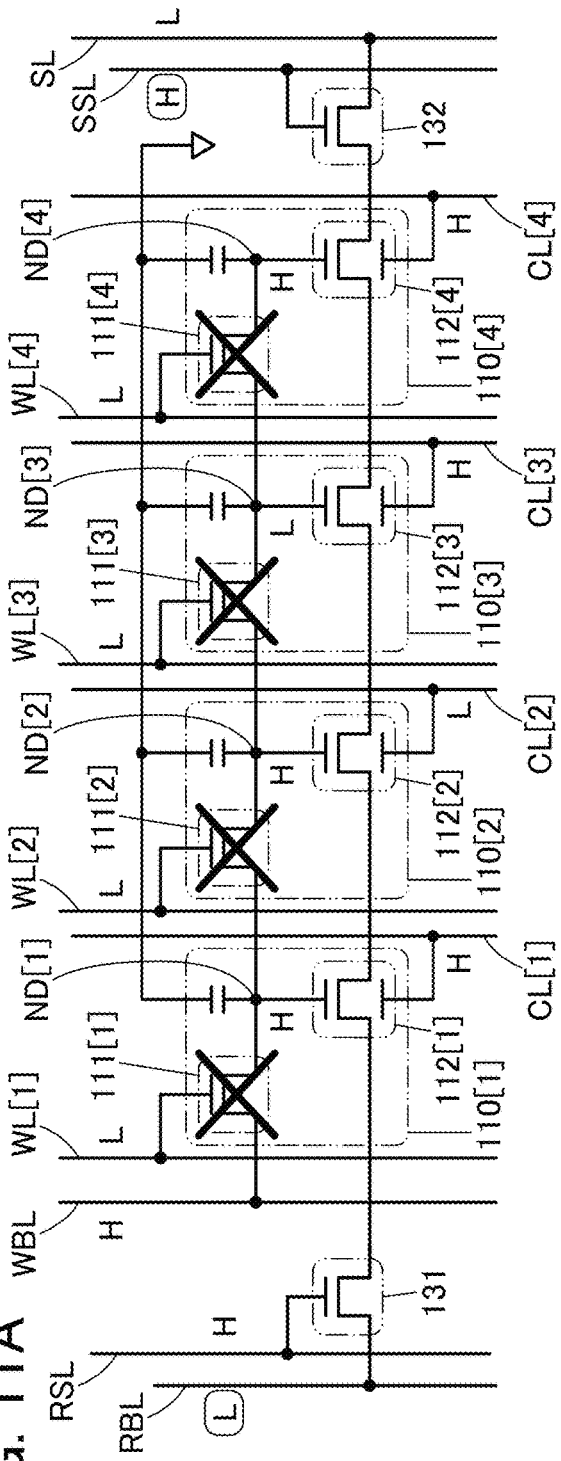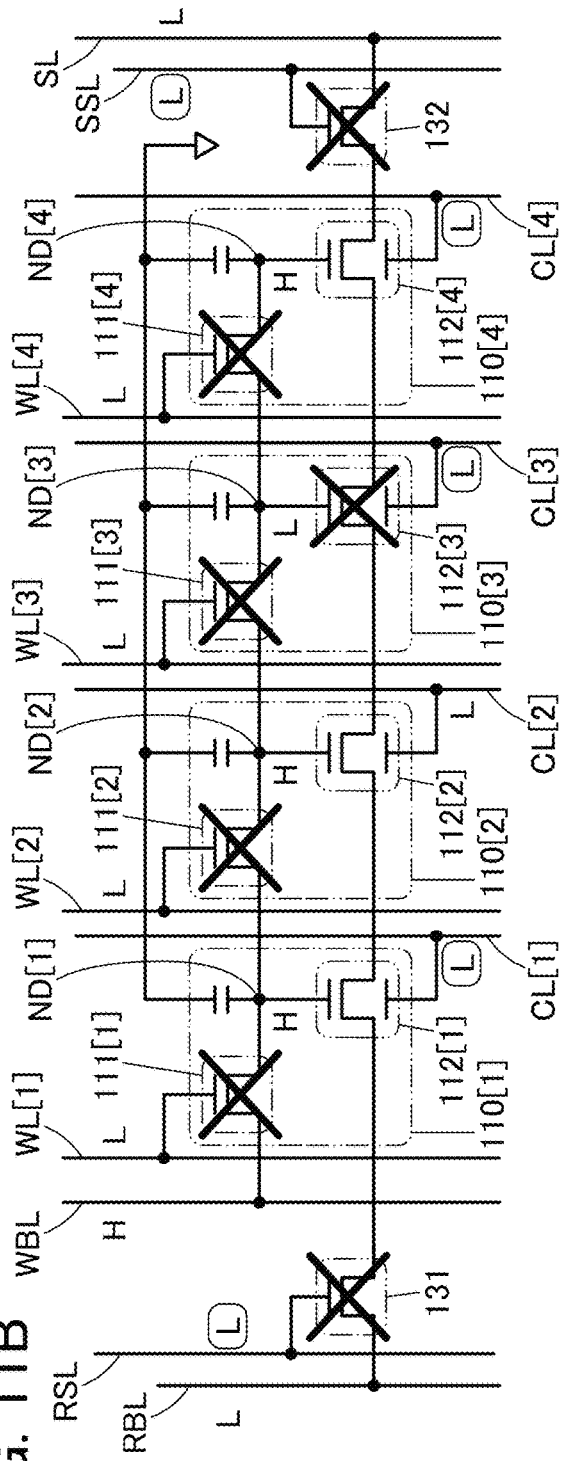

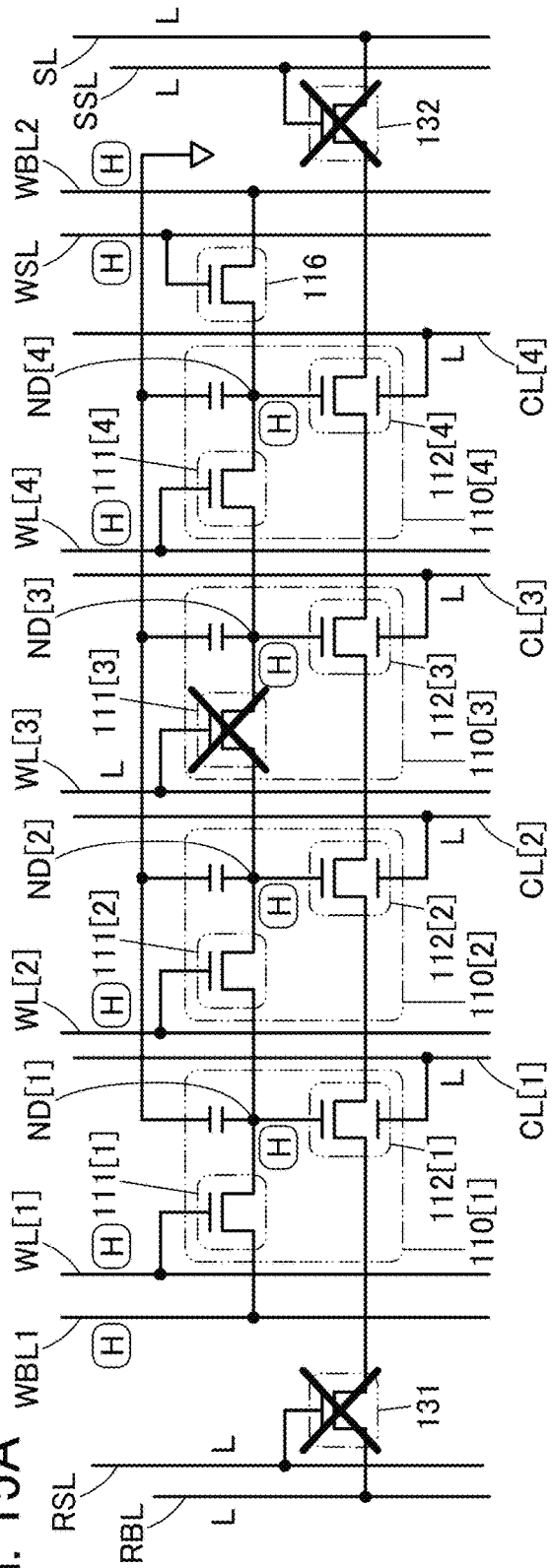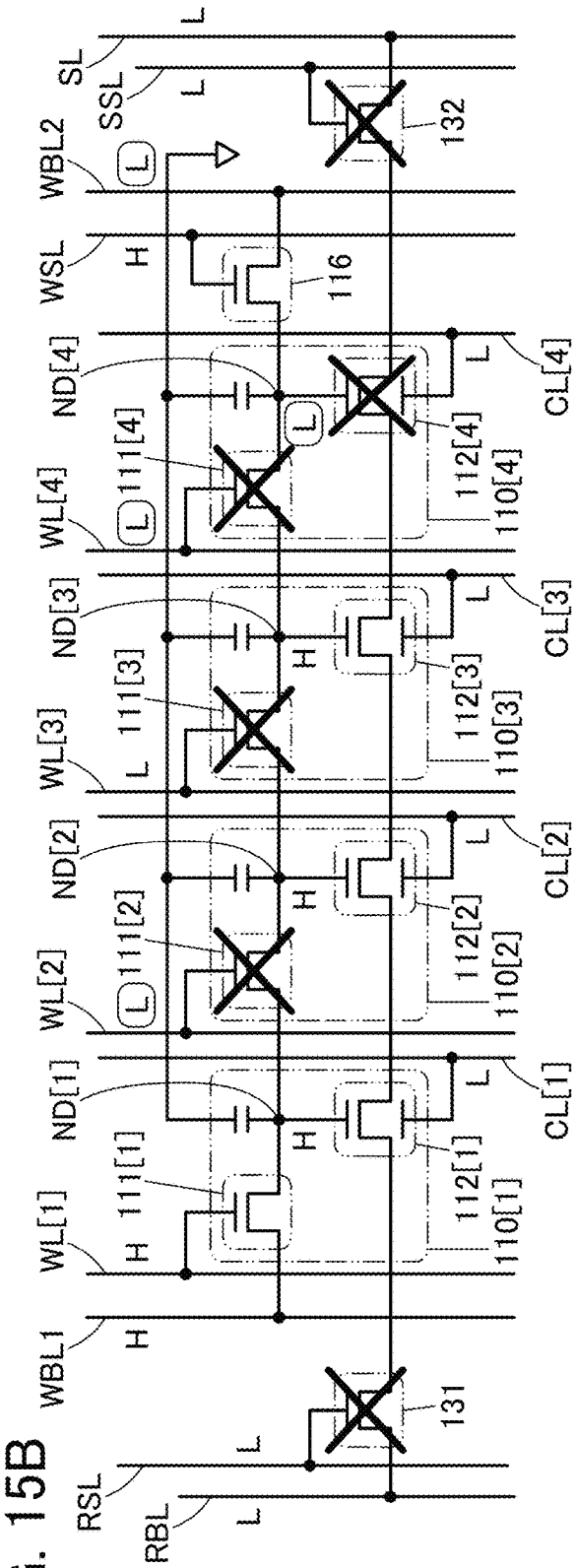

FIG. 26A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 26B
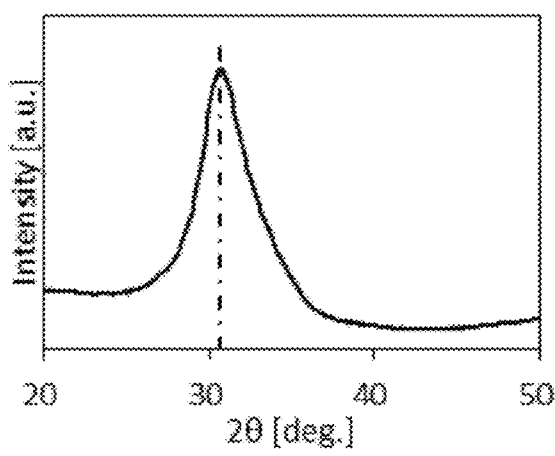
FIG. 26C
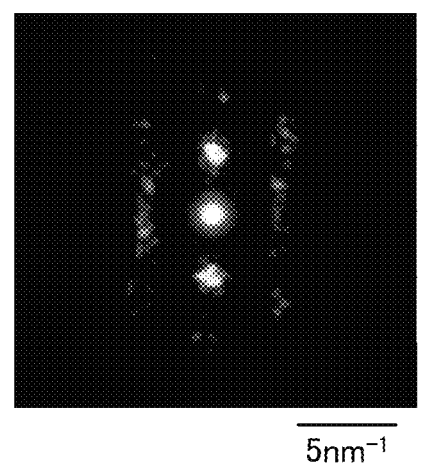

MEMORY DEVICE

TECHNICAL FIELD

One embodiment of the present invention relates to a memory device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including the semiconductor element are semiconductor devices. A display device, a light-emitting device, a lighting device, an electro-optical device, an imaging device, a memory device, a communication device, an electronic device, and the like may include a semiconductor element or a semiconductor circuit. Therefore, a display device, a light-emitting device, a lighting device, an electro-optical device, an imaging device, a memory device, a communication device, an electronic device, and the like are referred to as a semiconductor device in some cases.

BACKGROUND ART

In recent years, transistors using oxide semiconductors or metal oxides in their channel formation regions (Oxide Semiconductor transistors, hereinafter referred to as "OS transistors" or "OS-FETs") have attracted attention (Patent Document 1).

An OS transistor has an extremely low off-state current (a current flowing between the source and the drain when the transistor is in an off-state). A nonvolatile memory using this feature is disclosed in Patent Documents 2 and 3. The nonvolatile memory including the OS transistor does not have a limit on the number of times of data rewriting and consumes low power in data rewriting. In addition, Patent Document 3 discloses an example where a memory cell of a nonvolatile memory is configured with only OS transistors.

Note that in this specification, the nonvolatile memory including the OS transistor is sometimes referred to as a NOSRAM (registered trademark). The NOSRAM stands for "Nonvolatile Oxide Semiconductor RAM", which is a RAM including a gain cell (2T or 3T) memory cell.

REFERENCES

Patent Documents

[Patent Document 1] Japanese Published Patent Application No. 2007-123861
[Patent Document 2] Japanese Published Patent Application No. 2011-151383
[Patent Document 3] Japanese Published Patent Application No. 2016-115387

SUMMARY OF THE INVENTION

Problems to be Solved by the Invention

An object of one embodiment of the present invention is to provide a highly reliable memory device. Another object of one embodiment of the present invention is to provide a memory device with large storage capacity. Another object of one embodiment of the present invention is to provide a memory device that occupies a small area. Another object of one embodiment of the present invention is to provide a memory device with low production costs. Another object of one embodiment of the present invention is to provide a highly reliable semiconductor device. Another object of one embodiment of the present invention is to provide a semiconductor device with low production costs. Another object of one embodiment of the present invention is to provide a novel semiconductor device.

Note that the description of these objects does not preclude the existence of other objects. In one embodiment of the present invention, there is no need to achieve all the objects. Other objects will be apparent from and can be derived from the description of the specification, the drawings, the claims, and the like.

Means for Solving the Problems

One embodiment of the present invention is a NAND memory device including a plurality of connected memory cells each provided with a writing transistor and a reading transistor. When an oxide semiconductor is used in a semiconductor layer of the writing transistor, a storage capacitor is not necessary or the size of the storage capacitor can be reduced. The reading transistor includes a back gate. When a reading voltage is applied to the back gate, data stored in the memory cell can be read.

One embodiment of the present invention is a memory device including n memory cells (n is an integer greater than or equal to 3), n first wirings, n second wirings, and a third wiring. An i-th memory cell (i is an integer greater than or equal to 2 and less than n) includes a first transistor[i], a second transistor[i], and a capacitor[i]. An i−1-th memory cell includes a first transistor[i−1], a second transistor[i−1], and a capacitor[i−1]. An i+1-th memory cell includes a first transistor[i+1], a second transistor[i+1], and a capacitor[i+1]. A gate of the first transistor[i] is electrically connected to an i-th first wiring. A source of the first transistor[i] is electrically connected to a drain of the first transistor[i−1]. A drain of the first transistor[i] is electrically connected to a source of the first transistor[i+1]. A gate of the second transistor[i] is electrically connected to the drain of the first transistor[i]. A source of the second transistor[i] is electrically connected to a drain of the second transistor[i−1]. A drain of the second transistor[i] is electrically connected to a source of the second transistor[i+1]. A back gate of the second transistor[i] is electrically connected to an i-th second wiring. A back gate of the second transistor[i−1] is electrically connected to an i−1-th second wiring. A back gate of the second transistor[i+1] is electrically connected to an i+1-th second wiring. The capacitor[i] is between the gate of the second transistor[i] and the third wiring. The capacitor [i−1] is between a gate of the second transistor[i−1] and the third wiring. The capacitor[i+1] is between a gate of the second transistor[i+1] and the third wiring.

The first transistor[i] preferably includes an oxide semiconductor in a semiconductor layer. The second transistor[i] preferably includes an oxide semiconductor in a semiconductor layer. The oxide semiconductor preferably includes at least one of indium and zinc.

Effect of the Invention

According to one embodiment of the present invention, a highly reliable memory device can be provided. According to another embodiment of the present invention, a memory device with large storage capacity can be provided. According to another embodiment of the present invention, a memory device that occupies a small area can be provided. According to another embodiment of the present invention, a memory device with low production costs can be provided. According to another embodiment of the present invention, a highly reliable semiconductor device can be provided. According to another embodiment of the present invention, a semiconductor device with low production costs can be provided. According to another embodiment of the present invention, a novel semiconductor device can be provided.

Note that the description of these effects does not preclude the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

FIG. 1A is a circuit diagram showing a configuration example of a memory device, FIGS. 1B to 1D are circuit diagrams showing configuration examples of a memory cell, and FIG. 1E is a circuit diagram showing a configuration example of a transistor.

FIG. 7A and FIG. 7B are circuit diagrams for describing the writing operation.

FIG. 8A and FIG. 8B are circuit diagrams for describing the writing operation.

FIG. 11A and FIG. 11B are circuit diagrams for describing the reading operation.

FIG. 15A and FIG. 15B are circuit diagrams for describing the writing operation.

FIG. 26A is a diagram showing classification of IGZO crystal structures, FIG. 26B is a diagram showing an XRD spectrum of a CAAC-IGZO film, and FIG. 26C is a diagram showing a nanobeam electron diffraction pattern of the CAAC-IGZO film.

MODE FOR CARRYING OUT THE INVENTION

Figure 2:
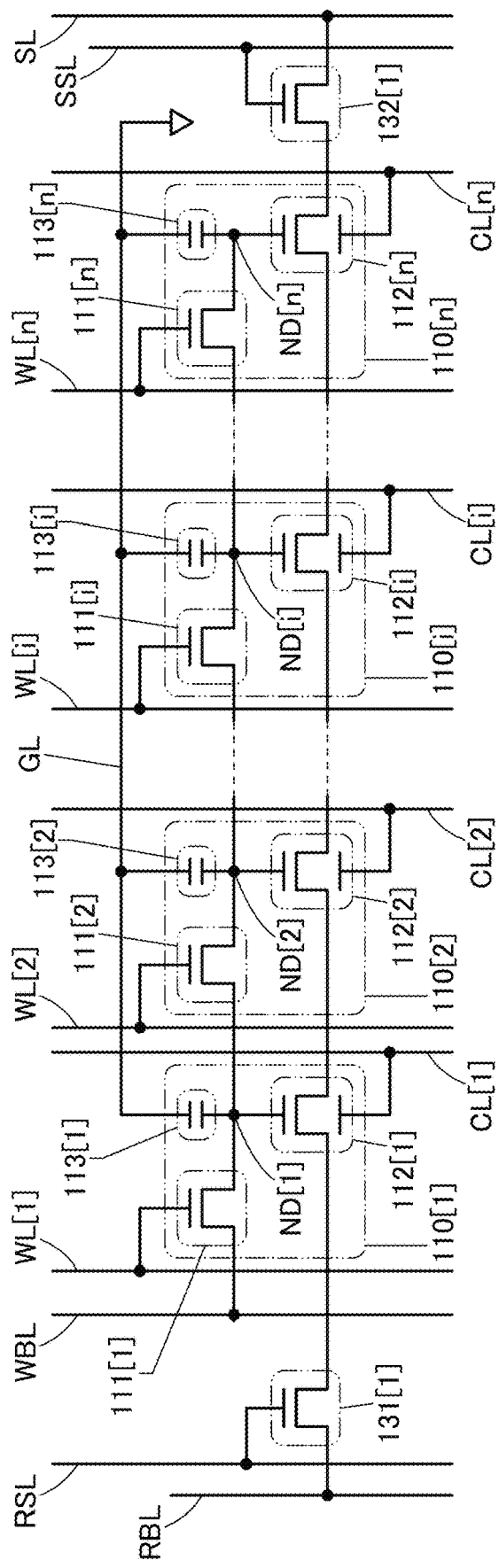
FIG. 2 is a circuit diagram showing a configuration example of a memory device.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might not be illustrated for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, functions of a source and a drain might be switched depending on operation conditions, e.g., when a transistor of opposite polarity is employed or a direction of current flow is changed in circuit operation. Therefore, it is difficult to define which is a source or a drain. Thus, the terms "source" and "drain" can be interchanged with each other in this specification. For easy understanding of the description in one embodiment of the present invention, one of a source and a drain is referred to as a "source" and the other is referred to as a "drain" in some cases in this specification and the like.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

Furthermore, in this specification and the like, "parallel" indicates a state where two straight lines are placed at an angle greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and actual measurement values allow for a margin of error of ±20% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that the ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state, and "off-state current" means a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). Moreover, VSS is a power supply potential lower than VDD. A ground potential (hereinafter, also simply referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Similarly, unless otherwise specified, "an L potential is supplied to a gate of a transistor" means that "the transistor is brought into an off state" in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potential of a wiring, an electrode, or the like, "H" representing an H potential or "L" representing an L potential is sometimes written near the wiring, the electrode, or the like. In addition, enclosed "H" or "L" is sometimes written near a wiring, an electrode, or the like whose potential changes. Moreover, a symbol "x" is sometimes written on a transistor in an off state.

In general, a "capacitor" has a structure where two electrodes face each other with an insulator (dielectric) therebetween. This specification and the like include a case where a "capacitor element" is the above-described "capacitor". That is, this specification and the like include cases where a "capacitor element" is one having a structure where two electrodes face each other with an insulator therebetween, one having a structure where two wirings face each other with an insulator therebetween, or one where two wirings are positioned with an insulator therebetween.

In this specification and the like, when a plurality of components are denoted by the same reference signs, and in particular need to be distinguished from each other, an identification numeral such as "_1", "_2", "[n]", or "[m,n]" is sometimes added to the reference signs. For example, a second wiring GL is referred to as a wiring GL[2] in some cases.

Embodiment 1

FIG. 1A shows a circuit diagram of a memory device 100 of one embodiment of the present invention. The memory device 100 includes a plurality of memory cells 110 between a transistor 131 and a transistor 132.

In this embodiment and the like, a first memory cell 110 is referred to as a memory cell 110[1] and an n-th memory cell 110 (n is an integer of 3 or more) is referred to as a memory cell 110[n]. An i-th memory cell 110 (i is an integer greater than or equal to 2 and less than n) is referred to as a memory cell 110[i]. Note that the "memory cell 110" may simply be used in the case of description common to the memory cell 110[1] to the memory cell 110[n].

The memory cell 110 includes a transistor 111, a transistor 112, and a capacitor 113. In this embodiment and the like, the transistor 111, the transistor 112, and the capacitor 113 included in the i-th memory cell 110 are referred to as a transistor 111[i], a transistor 112[i], and a capacitor 113[i], respectively.

<Configuration Example of Memory Device>

A circuit configuration example of the memory device 100 shown in FIG. 1A will be described in detail. A gate of the transistor 111[1] included in the memory cell 110[1] is electrically connected to a terminal 121[1]. One of a source and a drain of the transistor 111[1] is electrically connected to a terminal 137, and the other is electrically connected to one electrode of the capacitor 113[1]. The other electrode of the capacitor 113[1] is electrically connected to a terminal 123[1].

A gate of the transistor 112[1] is electrically connected to the other of the source and the drain of the transistor 111[1]. One of a source and a drain of the transistor 112[1] is electrically connected to the transistor 131. The other of the source and the drain of the transistor 112[1] is electrically connected to one of a source and a drain of the transistor 112[2]. A back gate of the transistor 112[1] is electrically connected to a terminal 122[1].

A node where the other of the source and the drain of the transistor 111[1], one electrode of the capacitor 113[1], and the gate of the transistor 112[1] are electrically connected to each other is referred to as a node ND[1].

One of a source and a drain of the transistor 131 is electrically connected to a terminal 138, and the other is electrically connected to one of the source and the drain of the transistor 112[1]. A gate of the transistor 131 is electrically connected to a terminal 133.

A gate of the transistor 111[2] included in the memory cell 110[2] is electrically connected to a terminal 121[2]. One of a source and a drain of the transistor 111[2] is electrically connected to a node ND[1], and the other is electrically connected to one electrode of the capacitor 113[2]. The other electrode of the capacitor 113[2] is electrically connected to a terminal 123[2].

A gate of the transistor 112[2] is electrically connected to the other of the source and the drain of the transistor 111[2]. One of the source and the drain of the transistor 112[2] is electrically connected to the other of the source and the drain of the transistor 112[1]. The other of the source and the drain of the transistor 112[2] is electrically connected to one of a source and a drain of the transistor 112[3] (not illustrated). A back gate of the transistor 112[2] is electrically connected to a terminal 122[2].

A node where the other of the source and the drain of the transistor 111[2], one electrode of the capacitor 113[2], and the gate of the transistor 112[2] are electrically connected to each other is referred to as a node ND[2].

A gate of the transistor 111[i] included in the memory cell 110[i] is electrically connected to a terminal 121[i]. One of a source and a drain of the transistor 111[i] is electrically connected to a node ND[i−1] (not illustrated), and the other is electrically connected to one electrode of the capacitor 113[i]. The other electrode of the capacitor 113[i] is electrically connected to a terminal 123[i].

A gate of the transistor 112[i] is electrically connected to the other of the source and the drain of the transistor 111[i]. One of a source and a drain of the transistor 112[i] is electrically connected to the other of a source and a drain of the transistor 112[i−1]. The other of the source and the drain of the transistor 112[i] is electrically connected to one of a source and a drain of the transistor 112[i+1] (not illustrated). A back gate of the transistor 112[i] is electrically connected to a terminal 122[i].

A node where the other of the source and the drain of the transistor 111[i], one electrode of the capacitor 113[i], and the gate of the transistor 112[i] are electrically connected to each other is referred to as a node ND[i].

A gate of the transistor 111[n] included in the memory cell 110[n] is electrically connected to a terminal 121[n]. One of a source and a drain of the transistor 111[n] is electrically connected to a node ND[n−1] (not illustrated), and the other is electrically connected to one electrode of the capacitor 113[n]. The other electrode of the capacitor 113[n] is electrically connected to a terminal 123[n].

A gate of the transistor 112[n] is electrically connected to the other of the source and the drain of the transistor 111[n]. One of a source and a drain of the transistor 112[n] is electrically connected to the other of a source and a drain of the transistor 112[n−1] (not illustrated). The other of the source and the drain of the transistor 112[n] is electrically connected to the transistor 132. A back gate of the transistor 112[n] is electrically connected to a terminal 122[n].

A node where the other of the source and the drain of the transistor 111[n], one electrode of the capacitor 113[n], and the gate of the transistor 112[n] are electrically connected to each other is referred to as a node ND[n].

One of a source and a drain of the transistor 132 is electrically connected to the other of the source and the drain of the transistor 112[n]. The other of the source and the drain of the transistor 132 is electrically connected to a terminal 139. A gate of the transistor 132 is electrically connected to a terminal 134.

The memory device 100 illustrated in FIG. 1A includes the n memory cells 110 between the transistor 131 and the transistor 132. The transistor 111[1] to the transistor 111[n] are connected in series while the source of one transistor and the drain of the adjacent transistor are shared (electrically connected). The transistor 112[1] to the transistor 112[n] are also connected in series while the source and the drain are shared by adjacent transistors (electrically connected).

More specifically, the source of the transistor 111[i] is electrically connected to a drain of a transistor 111[i−1] and the drain of the transistor 111[i] is electrically connected to a source of a transistor 111[i+1]. The source of the transistor 112[i] is electrically connected to a drain of a transistor 112[i−1] and the drain of the transistor 112[i] is electrically connected to a source of a transistor 112[i+1].

In this specification and the like, in some cases, a gate of a transistor is referred to as a first terminal; one of a source and a drain, a second terminal; the other of the source and the drain, a third terminal; and a back gate, a fourth terminal. For example, the following description is possible: a second terminal of the transistor 111[i] is electrically connected to a third terminal of the transistor 111[i−1]; a third terminal of the transistor 111[i] is electrically connected to a second terminal of the transistor 111[1+1]; and the third terminal of the transistor 111[i] is electrically connected to a first terminal of the transistor 112[i].

Such a configuration of the memory cells 110, in which a transistor in one memory cell 110 is connected in series with a transistor in the adjacent memory cell 110, is referred to as a "string", a "cell string", or a "memory cell string" in some cases. For example, one memory device 100 having a string structure is sometimes referred to as "one string" or simply a "string". Note that the words "string", "cell string", and "memory cell string" are also used as units in some cases.

[Memory Cell]

The memory cell 110 has a function of retaining a potential (charge) written to the node ND. Specifically, a voltage for turning on the transistor 111 is supplied to a gate of the transistor 111, and charge for setting the node ND to a predetermined voltage is supplied to the node ND through a source and a drain of the transistor 111. Then, a voltage for turning off the transistor 111 is supplied to the gate of the transistor 111. The charge written to the node ND can be retained when the transistor 111 is turned off.

For semiconductor layers of the transistor 111 and the transistor 112, a single crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor can be used. Similar semiconductor materials can be used for semiconductor layers of the transistor 131 and the transistor 132.

Note that the semiconductor layers may be stacked in the transistor. In that case, the stacked semiconductor layers may include different semiconductor materials or semiconductors with different crystal states.

In particular, the transistor 111 is preferably an OS transistor. The oxide semiconductor has a band gap of 2 eV or more, achieving an extremely low off-state current. When the OS transistor is used as the transistor 111, the charge written to the node ND can be retained for a long period. In the case where the OS transistor is used as the transistor 111, the memory cell 110 can be referred to as an "OS memory".

The OS memory can retain information written thereto for a year or more, or ten years or more even after power supply is stopped. Hence, the OS memory can be regarded as a nonvolatile memory.

Since the amount of charge written to the OS memory hardly changes for a long period, multilevel (multi-bit) information as well as binary (1-bit) information can be retained in the OS memory.

Furthermore, an OS memory employs a method in which charge is written to a node through the OS transistor; hence, a high voltage, which a conventional flash memory requires, is unnecessary and a high-speed writing operation is possible. The OS memory does not require an erasing operation that is performed in a flash memory before data rewriting. Furthermore, the OS memory does not conduct charge injection and extraction to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level. Hence, the OS memory has higher write endurance than the magneto-resistive memory and the resistance-change memory.

The off-state current of the OS transistor hardly increases even in a high-temperature environment. Specifically, the off-state current hardly increases even at an environment temperature of from room temperature to 200° C. In addition, the on-state current of the OS transistor is unlikely to decrease even in a high-temperature environment. A memory device including the OS memory achieves a stable operation and high reliability even in a high-temperature environment. Furthermore, the withstand voltage between the source and the drain of the OS transistor is high. When OS transistors are used as transistors included in a semiconductor device, the semiconductor device achieves a stable operation and high reliability even in a high-temperature environment.

As illustrated in FIG. 1B and FIG. 1C, a transistor having a back gate may be used as the transistor 111 included in the memory cell 110. FIG. 1B shows an example in which the back gate of the transistor 111 is electrically connected to a terminal 124. FIG. 1C shows an example in which the gate and the back gate of the transistor 111 are electrically connected.

When a transistor with a low off-state current is used as the transistor 111 as illustrated in FIG. 1D, the capacitor 113 can be omitted.

As illustrated in FIG. 1E, the transistor 131 and/or the transistor 132 may have a back gate. FIG. 1E shows an example in which the gate and the back gate of the transistor are electrically connected.

The gate of the transistor 111 may be electrically connected to a wiring WL. Alternatively, the gate of the transistor 111 may be electrically connected to the wiring WL through the terminal 121. The back gate of the transistor 112 may be electrically connected to a wiring CL. Alternatively, the back gate of the transistor 112 may be electrically connected to the wiring CL through the terminal 122. The other terminal of the capacitor 113 may be electrically connected to the wiring GL. Alternatively, the other terminal of the capacitor 113 may be electrically connected to the wiring GL through the terminal 123.

FIG. 2 shows an example in which the gate of the transistor 111[1] is electrically connected to a wiring WL[1], the gate of the transistor 111[2] is electrically connected to a wiring WL[2], the gate of the transistor 111[i] is electrically connected to a wiring WL[i], and the gate of the transistor 111[n] is electrically connected to a wiring WL[n].

FIG. 2 also shows an example in which the back gate of the transistor 112[1] is electrically connected to the wiring CL[1], the back gate of the transistor 112[2] is electrically connected to a wiring CL[2], the back gate of the transistor 112[i] is electrically connected to a wiring CL[i], and the back gate of the transistor 112[n] is electrically connected to a wiring CL[n].

FIG. 2 shows an example in which the other terminal of each of the capacitor 113[1], the capacitor 113[2], the capacitor 113[i], and the capacitor 113[n] is electrically connected to the wiring GL. A fixed potential is preferably supplied to the wiring GL. For example, a fixed potential such as VSS or GND is preferably supplied to the wiring GL. Note that a potential other than VSS or GND may be used as long as it is a fixed potential. For example, VDD may be used.

The gate of the transistor 131 may be electrically connected to a wiring RSL. Alternatively, the gate of the transistor 131 may be electrically connected to the wiring RSL through the terminal 133. One of the source and the drain of the transistor 131 may be electrically connected to a wiring RBL. Alternatively, one of the source and the drain of the transistor 131 may be electrically connected to the wiring RBL through the terminal 138.

The gate of the transistor 132 may be electrically connected to a wiring SSL. Alternatively, the gate of the transistor 132 may be electrically connected to the wiring SSL through the terminal 134. The other of the source and the drain of the transistor 132 may be electrically connected to a wiring SL. Alternatively, the other of the source and the drain of the transistor 132 may be electrically connected to the wiring SL through the terminal 139.

Figure 3:
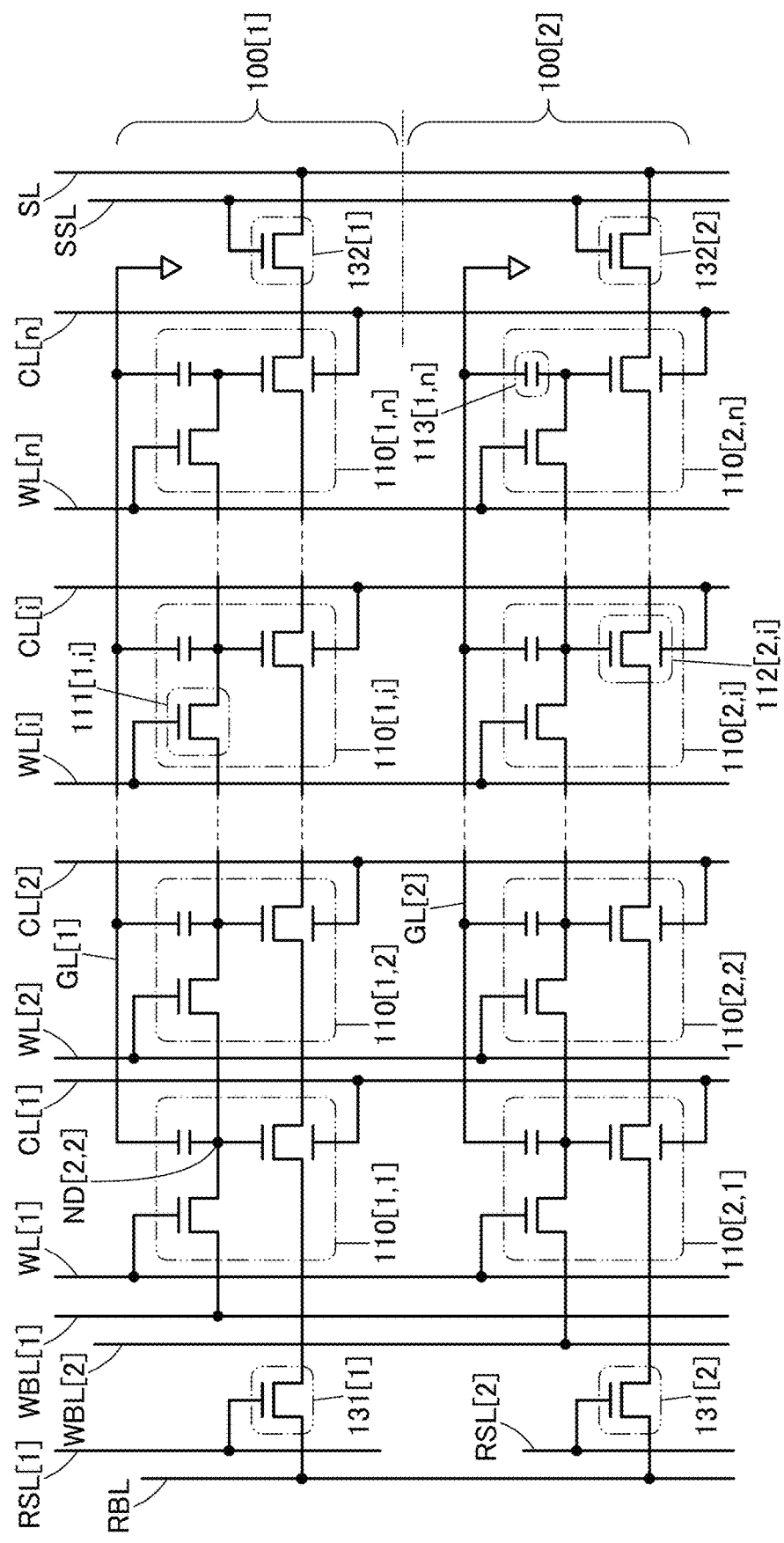
FIG. 3 is a circuit diagram showing a configuration example of a memory device.
Figure 4:
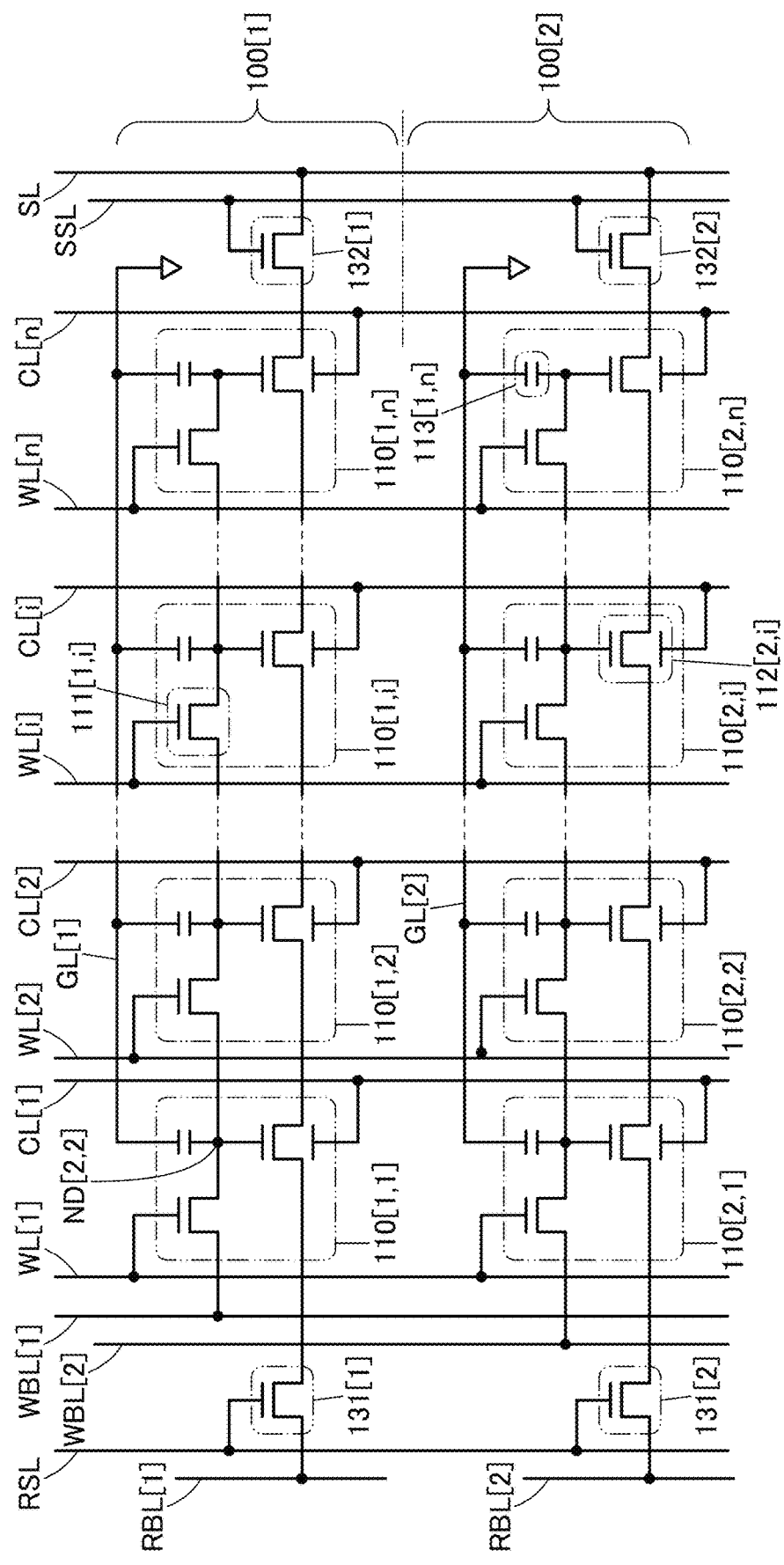
FIG. 4 is a perspective circuit diagram showing a configuration example of a memory device.

The use of a plurality of memory devices 100 increases the storage capacity of a semiconductor device including the memory devices 100. In other words, an increase in the number of strings increases the storage capacity of the semiconductor device. As an example, FIG. 3 and FIG. 4 show circuit diagrams including two memory devices 100 (two strings) connected in parallel. In FIG. 3 and FIG. 4, the first memory device 100 and the second memory device 100 are denoted by a memory device 100[1] and a memory device 100[2], respectively.

In this case, for example, as illustrated in FIG. 3, the wiring RBL, the wiring SSL, the wiring SL, the wiring WL, and the wiring CL can be used as wirings common to the plurality of memory devices 100. Thus, the size of the semiconductor device including the plurality of memory devices 100 can be reduced. As illustrated in FIG. 4, the wiring RBL may be provided for each memory device 100 with the use of the wiring RSL as a common wiring. When the wiring RBL is provided for each memory device 100, information retained in the memory devices 100 can be read at a time. This results in an increase in the information reading speed of the semiconductor device including a plurality of memory devices 100.

Note that each string is usually provided extending in one direction. A wiring that controls writing or reading of information (e.g., the wiring WL and the wiring CL) usually extends in a direction perpendicular to the extending direction of the string.

Modification Example 1

Figure 5:
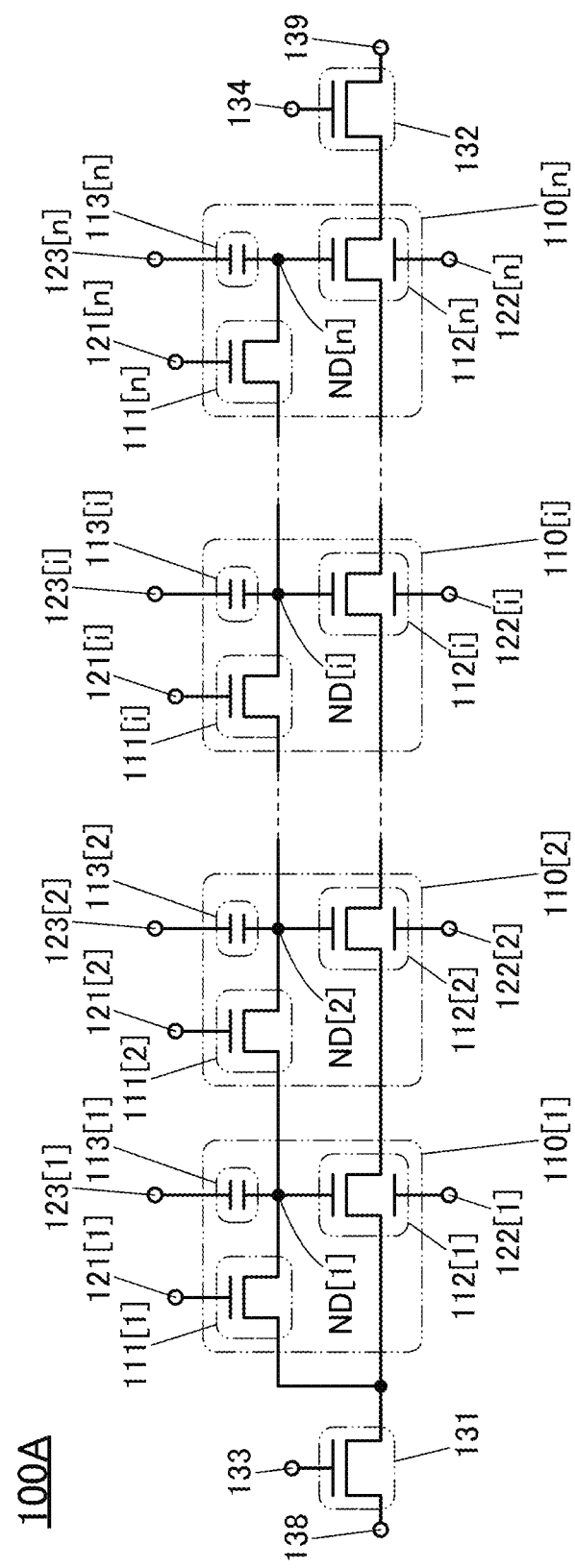
FIG. 5 is a perspective circuit diagram showing a configuration example of a memory device.

FIG. 5 illustrates a memory device 100A, which is a modification example of the memory device 100. The memory device 100A is different from the memory device 100 in that one of the source and the drain of the transistor 111[1] is electrically connected to the other of the source and the drain of the transistor 131. In the memory device 100A, the wiring WBL illustrated in FIG. 2 to FIG. 4 can be omitted. Thus, the area occupied by the memory device 100 can be reduced.

<Operation Example of Memory Device>

An operation example of the memory device 100 will be described with reference to drawings. In this embodiment, the description is made on an example of the memory device 100 illustrated in FIG. 2, which includes four memory cells 110.

[Writing Operation]

Figure 6A:
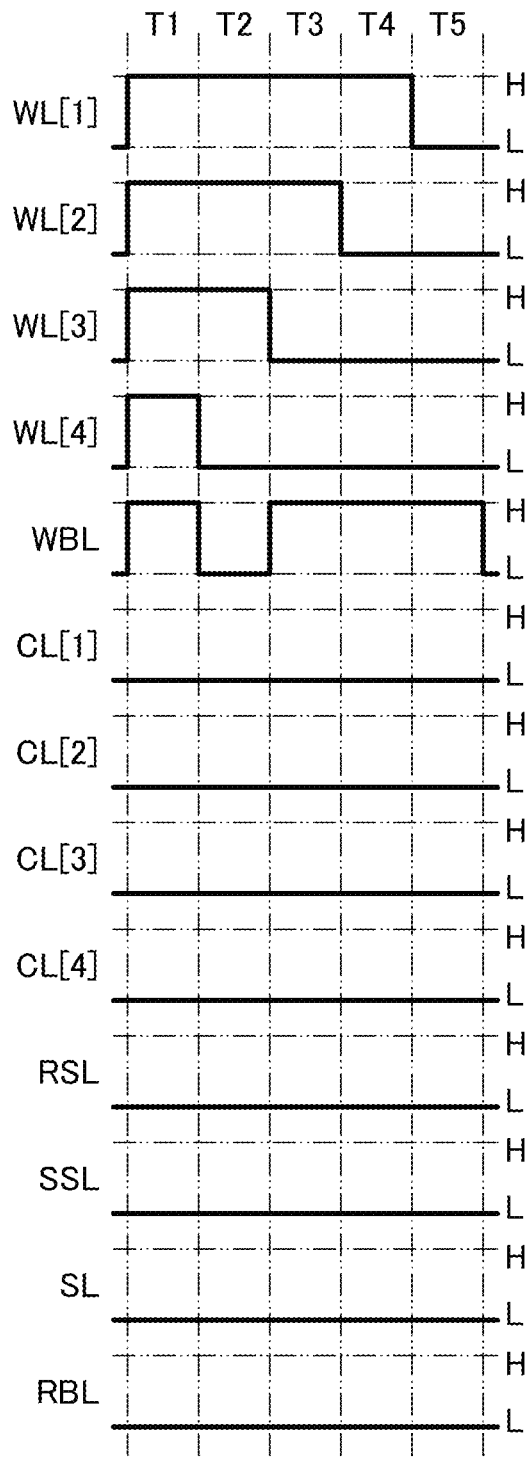
FIG. 6A is a timing chart showing a writing operation and FIG. 6B is a timing chart showing a reading operation.

This embodiment shows an operation example where an H potential is written to the memory cell 110[1], the memory cell 110[2], and a memory cell 110[4] whereas an L potential is written to a memory cell 110[3]. FIG. 6A is a timing chart showing a writing operation. FIG. 7A, FIG. 7B, FIG. 8A, FIG. 8B, and FIG. 9 are circuit diagrams for showing the writing operation.

It is assumed that in the initial state, the L potential is written to the memory cell 110[1] to the memory cell 110[4]. It is also assumed that the L potential is supplied to the wiring WL[1] to the wiring WL[4], the wiring CL[1] to the wiring CL[4], the wiring RSL, the wiring RBL, the wiring SSL, and the wiring SL. The potential of the wiring GL is assumed GND.

[Period T1]

In Period T1, the H potential is supplied to the wiring WL[1] to the wiring WL[4] and the wiring WBL (see FIG. 7A). Then, the node ND[1] to the node ND[4] have the H potential, so that the transistor 112[1] to a transistor 112[4] are turned on.

[Period T2]

In Period T2, the L potential is supplied to the wiring WL[4] (see FIG. 7B). Then, a transistor 111[4] is turned off and charge written to the node ND[4] is retained. Here, the charge equivalent to the H potential is retained. After the transistor 111[4] is turned off, the L potential is supplied to the wiring WBL. Then, the node ND[1] to the node ND[3]

have the L potential, so that the transistor 112[1] to the transistor 112[3] are turned off.
[Period T3]
In Period T3, the L potential is supplied to the wiring WL[3] (see FIG. 8A). Then, a transistor 111[3] is turned off and charge written to the node ND[3] is retained. Here, the charge equivalent to the L potential is retained. After the transistor 111[3] is turned off, the H potential is supplied to the wiring WBL. Then, the node ND[1] and the node ND[2] have the H potential, so that the transistor 112[1] and the transistor 112[2] are turned on.
[Period T4]
In Period T4, the L potential is supplied to the wiring WL[2] (see FIG. 8B). Then, a transistor 111[2] is turned off and charge written to the node ND[2] is retained. Here, the charge equivalent to the H potential is retained.
[Period T5]
In Period T5, the L potential is supplied to the wiring WL[1] (see FIG. 9). Then, a transistor 111[1] is turned off and charge written to the node ND[1] is retained. Here, the charge equivalent to the H potential is retained. In this manner, information can be written to the memory cell 110[1] to the memory cell 110[4].

As mentioned above, the memory device 100 of one embodiment of the present invention does not require an erasing operation that is performed in flash memories before data rewriting. Hence, data rewriting can be performed in a manner similar to that of the above writing operation.

In the case where information is written to the memory cell 110 that is close to the wiring WBL, the information does not need to be written to the other memory cells 110 farther from the wiring WBL than the one memory cell 110. For example, in the case where information is written to the memory cell 110[1], the information does not need to be written to the memory cell 110[2] to the memory cell 110[4]. In the case where information is written to the memory cell 110[2], the information does not need to be written to the memory cell 110[3] and the memory cell 110[4]. Thus, information that is rewritten frequently is stored in the memory cell 110 close to the wiring WBL, so that the information can be written (rewritten) in a shorter time. That is, the speed of writing (rewriting) information can be increased.

Figure 6B:
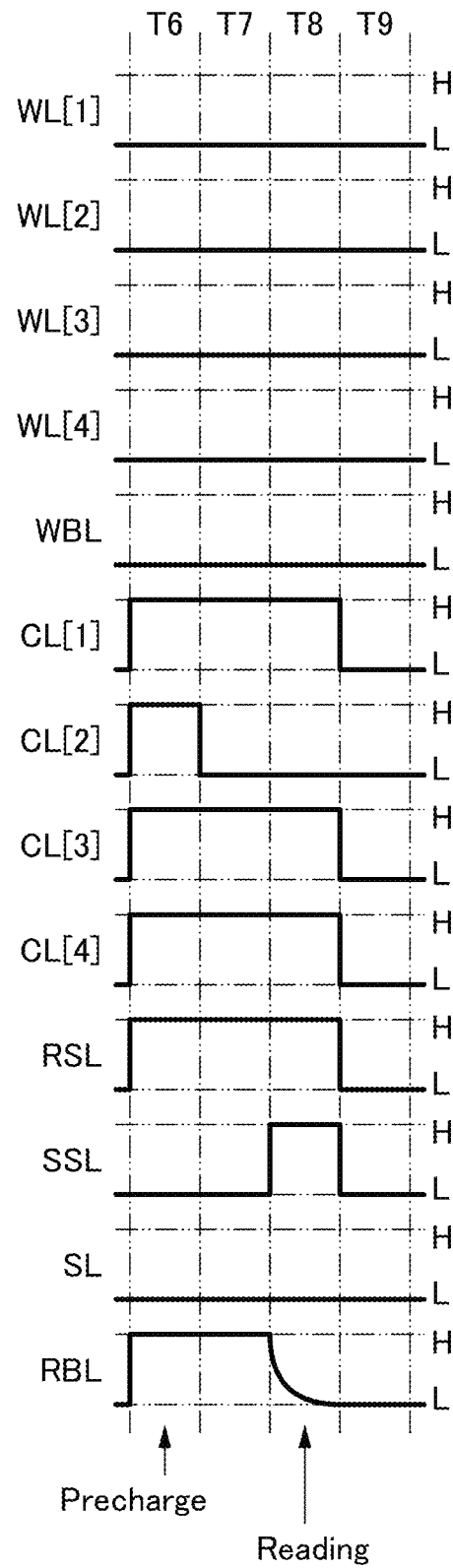

[Reading Operation]
Described in this embodiment is an operation example of reading information retained in the memory cell 110[2] among the information retained in the memory cell 110[1] to the memory cell 110[4]. It is assumed that an H potential is retained in the memory cell 110[2]. FIG. 6B is a timing chart showing a reading operation. FIG. 10A, FIG. 10B, FIG. 11A, and FIG. 11B are circuit diagrams for describing the reading operation.
[Period T6]
In Period T6, the H potential is supplied to the wiring CL[1] to the wiring CL[4] and the wiring RSL, so that the transistor 112[1] to the transistor 112[4] and the transistor 131 are turned on. Furthermore, the wiring RBL is precharged to the H potential (see FIG. 10A). Specifically, after the H potential is supplied to the wiring RBL, the wiring RBL is brought into a floating state.
[Period T7]
In Period T7, the L potential is supplied to the wiring CL[2] (see FIG. 10B). Since the H potential is retained in the node ND[2], the transistor 112[2] remains on.
[Period T8]
In Period T8, the H potential is supplied to the wiring SSL, so that the transistor 132 is turned on (see FIG. 11A).

The transistor 112[1] to the transistor 112[4] are all on; accordingly, the wiring RBL and the wiring SL are electrically connected and the potential of the wiring RBL is changed to the L potential.

Note that in the case where the node ND[2] has the L potential, the transistor 112[2] is turned off when the L potential is supplied to the wiring CL[2]. In that case, the potential of the wiring RBL remains H even when the transistor 132 is turned on. What information is retained in the memory cell 110 is known from a change in the potential of the wiring RBL.

That is, in order to read information retained in the memory cell 110, in Period T8, the L potential is supplied to the wiring CL corresponding to the memory cell 110 from which the information is to be read.
[Period T9]
In Period T9, the L potential is supplied to the wiring CL[1] to the wiring CL[4], the wiring RSL, and the wiring SSL (see FIG. 11B). Then, the transistor 131 and the transistor 132 are turned off.

In this manner, the memory device 100 shown in this embodiment and the like serves as a NAND memory device.

This embodiment can be implemented in an appropriate combination with the structures described in the other embodiments and the like.

Embodiment 2

Figure 12:
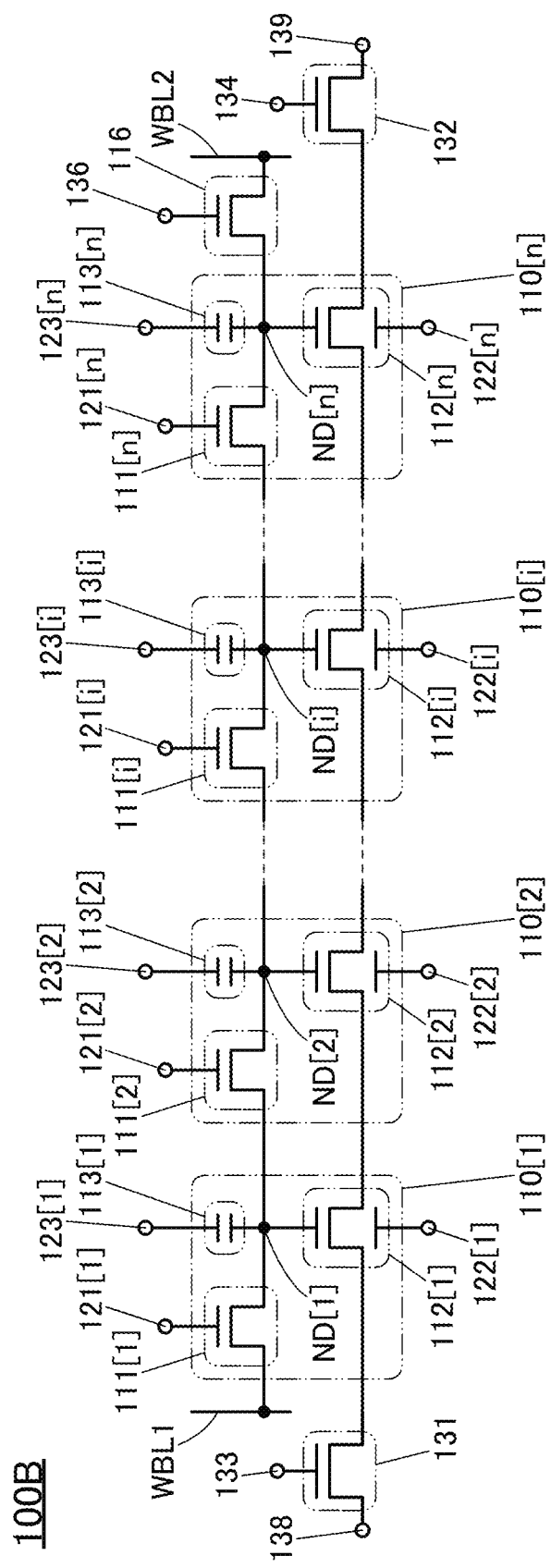
FIG. 12 is a circuit diagram showing a configuration example of a memory device.
Figure 13:
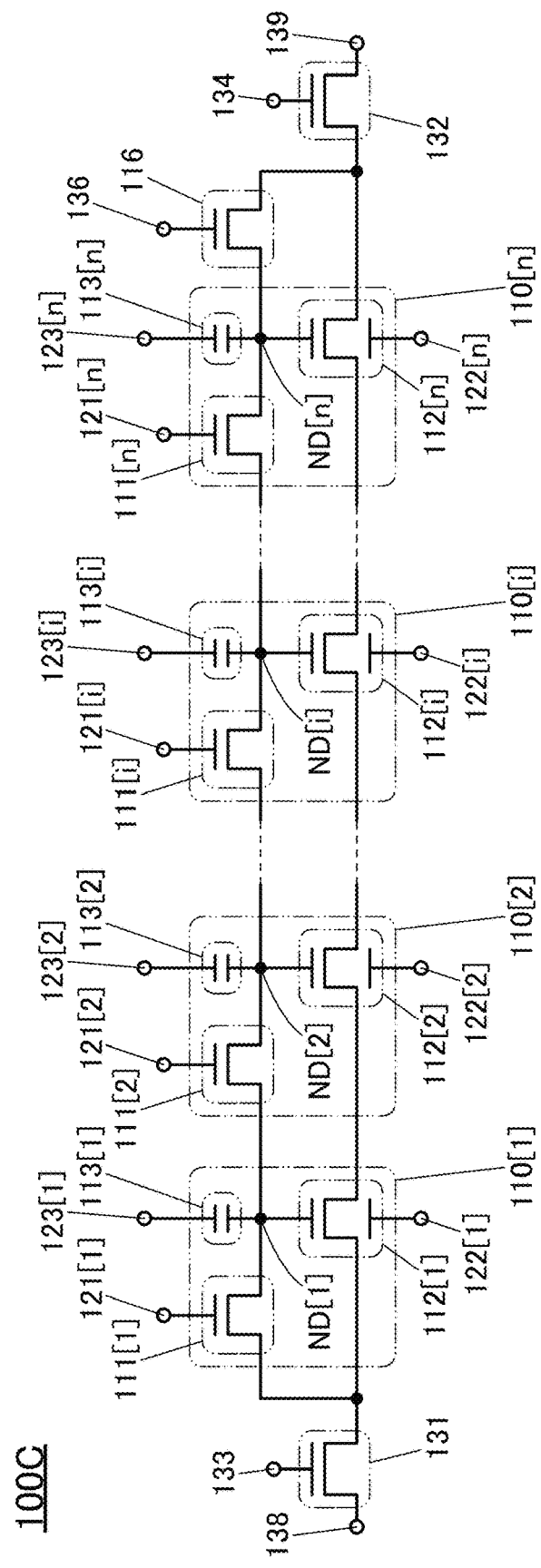
FIG. 13 is a circuit diagram showing a configuration example of a memory device.

Described in this embodiment are other configuration examples of the memory device 100 shown in the above embodiment and operation examples thereof.
<Configuration Example of Memory Device>
FIG. 12 shows a circuit diagram of a memory device 100B. FIG. 13 shows a circuit diagram of a memory device 100C. The memory device 100B and the memory device 100C are modification examples of the memory device 100 shown in the above embodiment. In order to avoid repeated description, differences between the memory device 100 and the memory devices 100B and 100C will be explained mainly in this embodiment.

The memory device 100B and the memory device 100C each have a configuration in which a transistor 116 is added to the memory device 100.

In the memory device 100B illustrated in FIG. 12, one of the source and the drain of the transistor 111[1] is electrically connected to a wiring WBL1. One of a source and a drain of the transistor 116 is electrically connected to the node ND[n], and the other is electrically connected to a wiring WBL2. A gate of the transistor 116 is electrically connected to a terminal 136.

The memory device 100C illustrated in FIG. 13 is a modification example of the memory device 100B. In the memory device 100C, one of the source and the drain of the transistor 111[1] is electrically connected to the other of the source and the drain of the transistor 131. In the memory device 100C, the other of the source and the drain of the transistor 116 is electrically connected to one of the source and the drain of the transistor 132.

As in the memory device 100, the gate of the transistor 111 included in the memory device 100B and the memory device 100C may be electrically connected to the wiring WL. Alternatively, the gate of the transistor 111 may be electrically connected to the wiring WL through the terminal 121. The back gate of the transistor 112 may be electrically connected to the wiring CL. Alternatively, the back gate of the transistor 112 may be electrically connected to the wiring CL through the terminal 122. The gate of the transistor 116 may be electrically connected to a wiring WSL described later. Alternatively, the gate of the transistor 116 may be electrically connected to the wiring WSL through the terminal 136.

The same transistor can be used as the transistor 111 and the transistor 116. An OS transistor is preferably used as the transistor 116. The transistor may have a back gate.

<Operation Example of Memory Device>

An operation example of the memory device 100B will be described with reference to FIG. 14, FIG. 15A, FIG. 15B, and FIG. 16. Here, the description is made on an example of the memory device 100B including four memory cells 110. In the memory device 100B, the gate of the transistor 111[1] is electrically connected to the wiring WL[1], the gate of the transistor 111[2] is electrically connected to the wiring WL[2], a gate of the transistor 111[3] is electrically connected to the wiring WL[3], a gate of the transistor 111[4] is electrically connected to the wiring WL[4], and the gate of the transistor 116 is electrically connected to the wiring WSL.

Also in the memory device 100B, the back gate of the transistor 112[1] is electrically connected to the wiring CL[1], a back gate the transistor 112[2] is electrically connected to the wiring CL[2], a back gate of the transistor 112[3] is electrically connected to a wiring CL[3], and a back gate of the transistor 112[4] is electrically connected to the wiring CL[4].

It is assumed that the gate of the transistor 131 is electrically connected to the wiring RSL and one of the source and the drain of the transistor 131 is electrically connected to the wiring RBL in the memory device 100B. It is also assumed that the gate of the transistor 132 is electrically connected to the wiring SSL and the other of the source and the drain of the transistor 132 is electrically connected to the wiring SL.

[Writing Operation]

Figure 14:
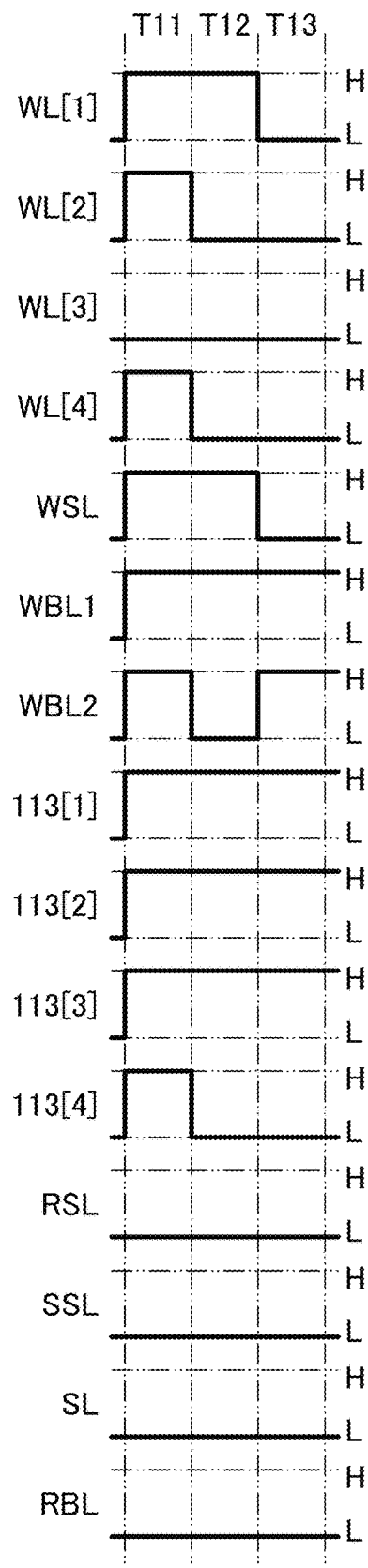
FIG. 14 is a timing chart showing the writing operation.
Figure 16:
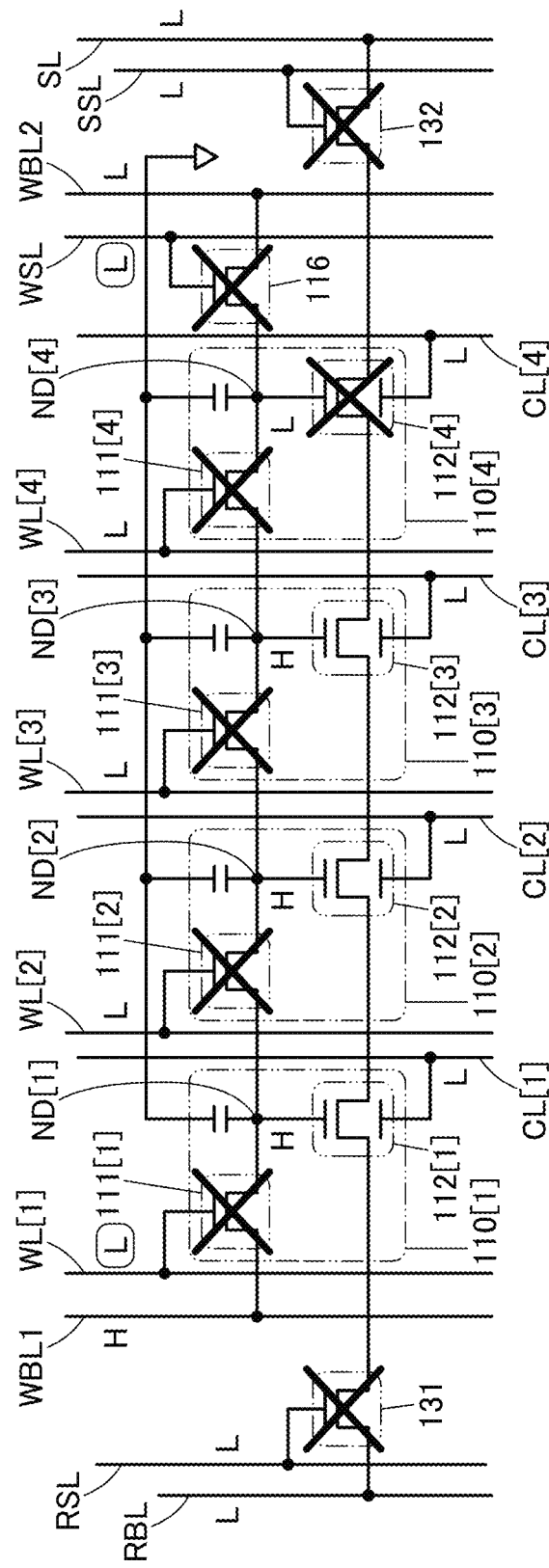
FIG. 16 is a circuit diagram for describing the writing operation.

In the operation example described in this embodiment, an H potential is written to the memory cell 110[1] to the memory cell 110[3] whereas an L potential is written to the memory cell 110[4]. FIG. 14 is a timing chart showing a writing operation. FIG. 15A, FIG. 15B, and FIG. 16 are circuit diagrams for describing the writing operation.

It is assumed that in the initial state, the L potential is written to the memory cell 110[1] to the memory cell 110[4]. It is also assumed that the L potential is supplied to the wiring WL[1] to the wiring WL[4], the wiring CL[1] to the wiring CL[4], the wiring RSL, the wiring RBL, the wiring SSL, the wiring SL, the wiring WSL, the wiring WBL1, and the wiring WBL2.

[Period T11]

In Period T11, the H potential is supplied to the wiring WL[1], the wiring WL[2], the wiring WL[4], the wiring WSL, the wiring WBL1, and the wiring WBL2 (see FIG. 15A). The potential of the wiring WL[3] remains L. Then, transistor 111[1], the transistor 111[2], the transistor 111[4], and the transistor 116 are turned on and the node ND[1] to the node ND[4] have the H potential, so that the transistor 112[1] to the transistor 112[4] are turned on.

[Period T12]

In Period T12, the L potential is supplied to the wiring WL[2] and the wiring WL[4] (see FIG. 15B). Then, the transistor 111[2] and the transistor 111[4] are turned off and charge written to the node ND[2] and the node ND[3] is retained. In this embodiment, the charge equivalent to the H potential is retained. In addition, the L potential is supplied to the wiring WBL2. This brings the potential of the node ND[4] to the L potential. Accordingly, the transistor 112[4] is brought turned off.

[Period T13]

In Period T13, the L potential is supplied to the wiring WL[1] and the wiring WSL (see FIG. 16). Then, the transistor 111[1] and the transistor 116 are turned off and charge written to the node ND[1] and the node ND[4] is retained. In this embodiment, the charge equivalent to the H potential is retained in the node ND[1], and the charge equivalent to the L potential is retained in the node ND[4].

In the memory device 100B, information can be written from both the wiring WBL1 and the wiring WBL2, allowing the writing operation to be completed in a shorter time than in the memory device 100.

The memory device 100C can be operated in a manner similar to that of the memory device 100B. Note that in the memory device 100C, the wiring RBL functions as the wiring WBL1 and the wiring SL functions as the wiring WBL2 in the writing operation. In the memory device 100C, the transistor 131 and the transistor 132 are turned on in the writing operation. At this time, the L potential is supplied to at least one of the wirings CL, whereby a short circuit between the wiring RBL and the wiring SL can be prevented.

In the memory device 100B and the memory device 100C, n is preferably an even number. When n is an even number, a n/2+1-th transistor 111 is turned off in Period T11.

[Reading Operation]

The reading operation in the memory device 100B and the memory device 100C can be performed in a manner similar to that in the memory device 100; thus, the description is omitted in this embodiment.

Modification Example

Figure 17:
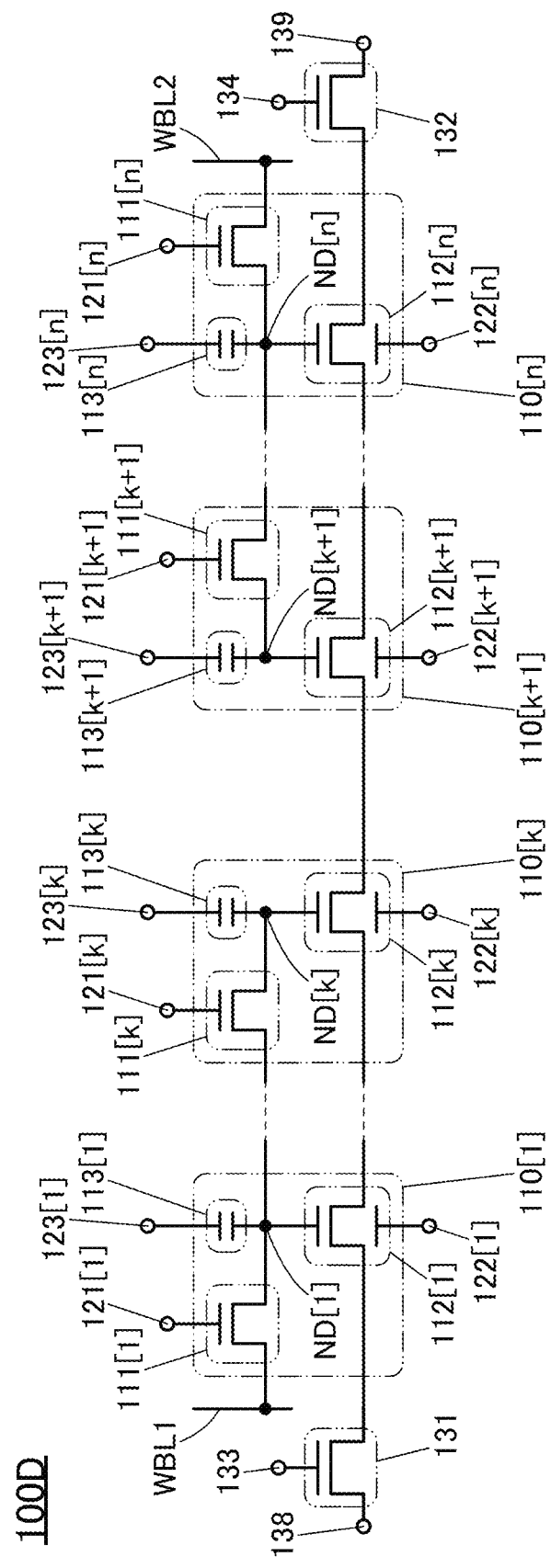
FIG. 17 is a circuit diagram showing a configuration example of a memory device.
Figure 18:
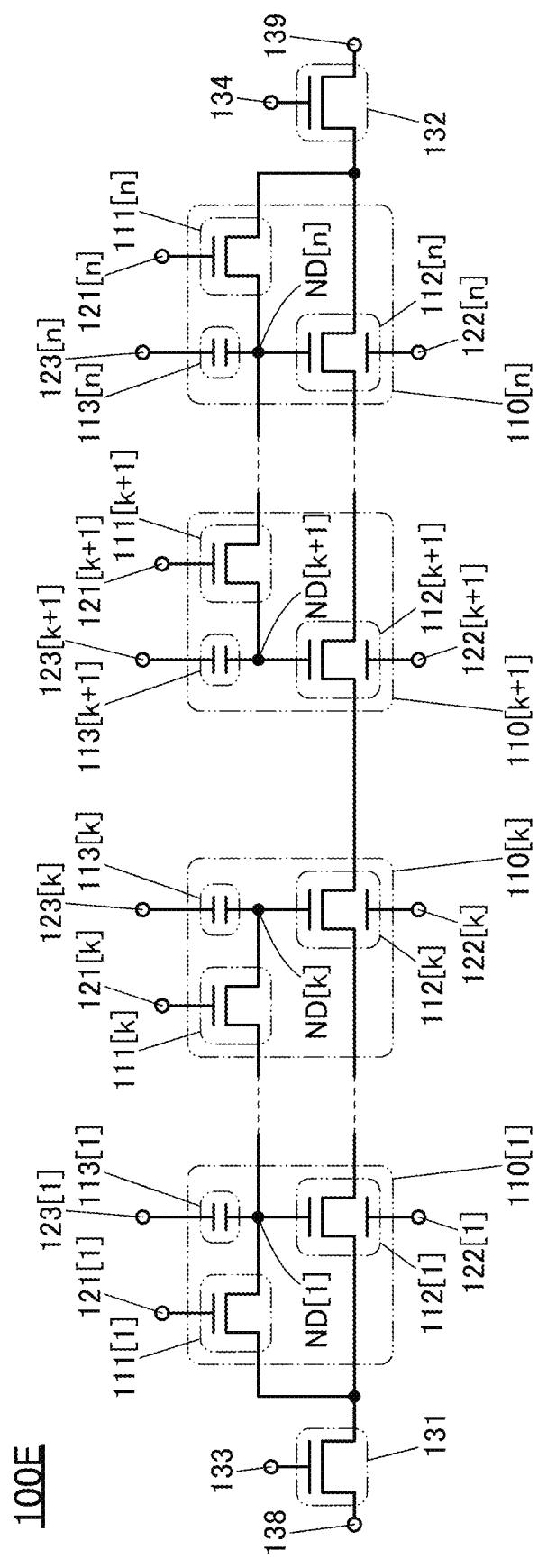
FIG. 18 is a circuit diagram showing a configuration example of a memory device.

As a modification example of the memory device 100B, a memory device 100D is shown in FIG. 17. As a modification example of the memory device 100C, a memory device 100E is shown in FIG. 18. The memory device 100D and the memory device 100E each have a configuration in which the transistor 116 is removed from the memory device 100B and the memory device 100C and a transistor 111[k] and a transistor 111[k+1] are electrically isolated from each other.

In the memory device 100D and the memory device 100E, n is preferably an even number. When n is an even number, k is n/2.

In a memory cell 110[k+1], one of a source and a drain of the transistor 111[k+1] is electrically connected to a gate of a transistor 112[k+1], and the other is electrically connected to one of a source and a drain of a transistor 111[k+2] (not illustrated).

In the memory cell 110[n], one of the source and the drain of the transistor 111[n] is electrically connected to the gate of the transistor 112[n], and the other is electrically connected to the wiring WBL2. One of the source and the drain of the transistor 111[n] is also electrically connected to the other of a source and a drain of a transistor 111[n−1] (not illustrated).

In the memory cell 110[k+1] to the memory cell 110[n], a connection point between one of the source and the drain of the transistor 111 and the gate of the transistor 112 functions as the node ND.

The writing operation in the memory device 100D and the memory device 100E can be performed in a manner similar to that in the memory device 100B and the memory device 100C except that the transistor 111 (e.g., the transistor 111[3]

in the above description of the writing operation) is not turned off in Period T11. The reading operation can also be performed in a manner similar to that in the memory device 100B and the memory device 100C.

In the memory device 100D and the memory device 100E, the writing operation in the memory cell 110[1] to the memory cell 110[k] and the writing operation in the memory cell 110[k+1] to the memory cell 110[n] can be performed separately. Accordingly, power consumption needed for the writing operation can be reduced.

This embodiment can be implemented in an appropriate combination with the structures described in the other embodiments and the like.

Embodiment 3

In this embodiment, a configuration example of a semiconductor device 200 including the memory device 100 will be described.

Figure 19:
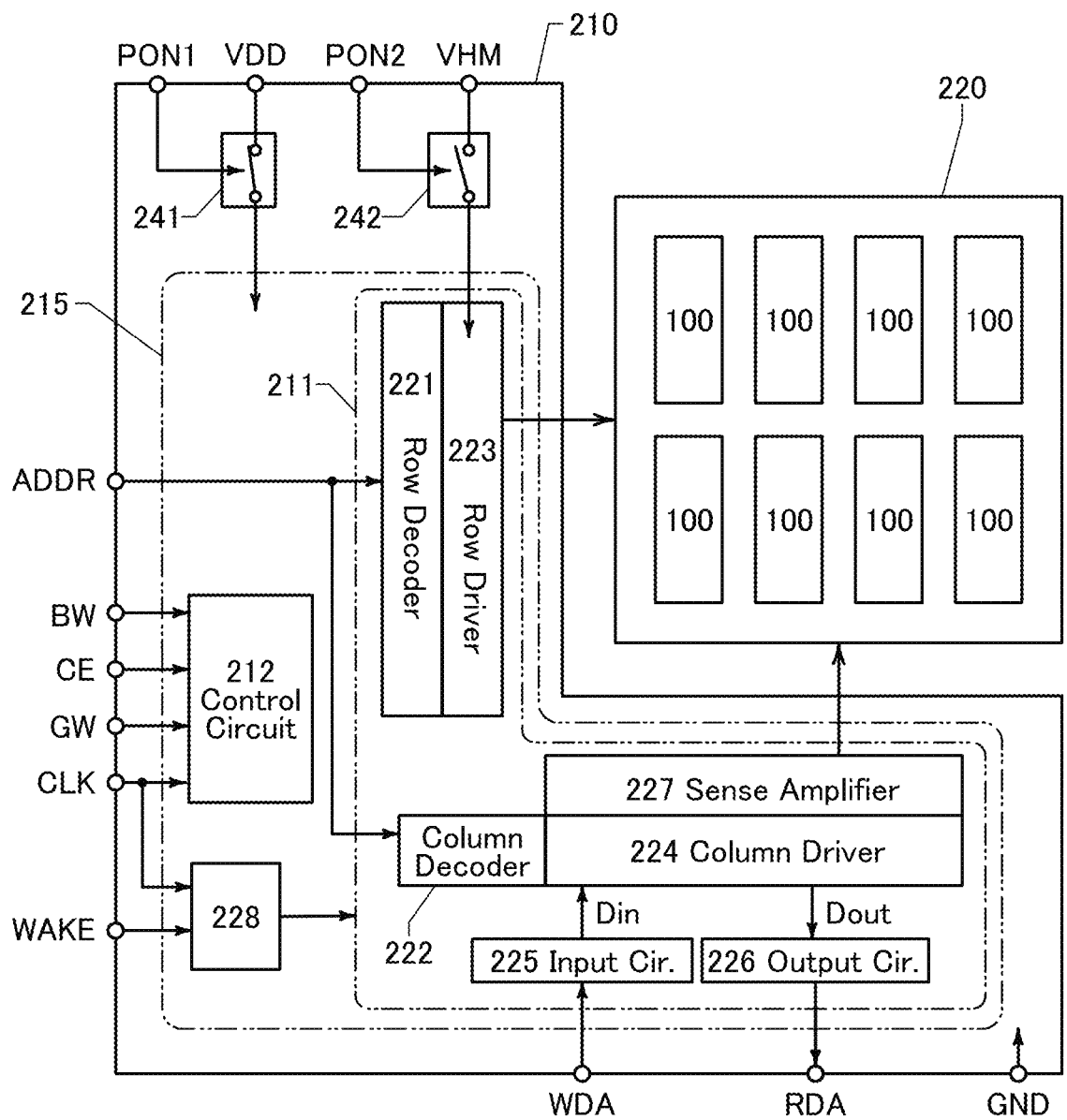
FIG. 19 is a block diagram showing a configuration example of a semiconductor device.

FIG. 19 is a block diagram showing a structure example of the semiconductor device 200 of one embodiment of the present invention. The semiconductor device 200 illustrated in FIG. 19 includes a driver circuit 210 and a memory array 220. The memory array 220 includes one or more memory devices 100. FIG. 19 illustrates an example in which the memory array 220 includes a plurality of memory devices 100 (a plurality of strings) arranged in a matrix.

The driver circuit 210 includes a PSW 241 (a power switch), a PSW 242, and a peripheral circuit 215. The peripheral circuit 215 includes a peripheral circuit 211, a control circuit 212, and a voltage generation circuit 228.

In the semiconductor device 200, each circuit, each signal, and each voltage can be appropriately selected as needed. Alternatively, another circuit or another signal may be added. For example, a power supply circuit, a boosting circuit, or the like may be provided. Signals BW, CE, GW, CLK, WAKE, ADDR, WDA, PON1, and PON2 are signals input from the outside, and a signal RDA is a signal output to the outside. The signal CLK is a clock signal.

The signals BW and CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 212.

The control circuit 212 is a logic circuit having a function of controlling the overall operation of the semiconductor device 200. For example, the control circuit performs a logical operation on the signal CE, the signal GW, and the signal BW to determine an operation mode of the semiconductor device 200 (e.g., a writing operation or a reading operation). Alternatively, the control circuit 212 generates a control signal for the peripheral circuit 211 so that the operation mode is executed.

The voltage generation circuit 228 has a function of generating a negative voltage. WAKE has a function of controlling the input of CLK to the voltage generation circuit 228. For example, when an H-level signal is applied as WAKE, the signal CLK is input to the voltage generation circuit 228, and the voltage generation circuit 228 generates a negative voltage.

The peripheral circuit 211 is a circuit for writing and reading data to/from the memory device 100. The peripheral circuit 211 includes a row decoder 221 (Row Decoder), a column decoder 222 (Column Decoder), a row driver 223 (Row Driver), a column driver 224 (Column Driver), an input circuit 225 (Input Cir.), an output circuit 226 (Output Cir.), and a sense amplifier 227.

The row decoder 221 and the column decoder 222 have a function of decoding the signal ADDR. The row decoder 221 is a circuit for specifying a row to be accessed, and the column decoder 222 is a circuit for specifying a column to be accessed. The row driver 223 has a function of selecting the wiring WL specified by the row decoder 221. The column driver 224 has a function of writing data to the memory device 100, a function of reading data from the memory device 100, a function of retaining the read data, and the like.

The input circuit 225 has a function of retaining the signal WDA. Data retained by the input circuit 225 is output to the column driver 224. Data output from the input circuit 225 is data (Din) to be written to the memory device 100. Data (Dout) read from the memory device 100 by the column driver 224 is output to the output circuit 226. The output circuit 226 has a function of retaining Dout. In addition, the output circuit 226 has a function of outputting Dout to the outside of the semiconductor device 200. Data output from the output circuit 226 is the signal RDA.

The PSW 241 has a function of controlling the supply of VDD to the peripheral circuit 215. The PSW 242 has a function of controlling the supply of VHM to the row driver 223. Here, in the semiconductor device 200, a high power supply voltage is VDD and a low power supply voltage is GND (a ground potential). In addition, VHM is a high power supply voltage used to set the word line to the H level and is higher than VDD. The on/off of the PSW 241 is controlled by the signal PON1, and the on/off of the PSW 242 is controlled by the signal PON2. The number of power domains to which VDD is supplied is one in the peripheral circuit 215 in FIG. 19 but can be more than one. In this case, a power switch is provided for each power domain.

Figure 20A:
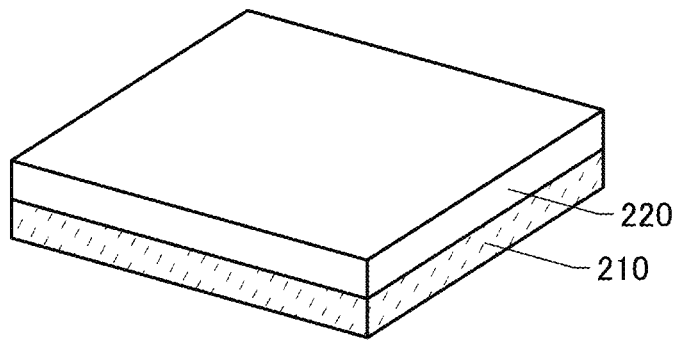
FIG. 20A, FIG. 20B, and FIG. 20C are perspective views showing configuration examples of a semiconductor device.
Figure 20B:
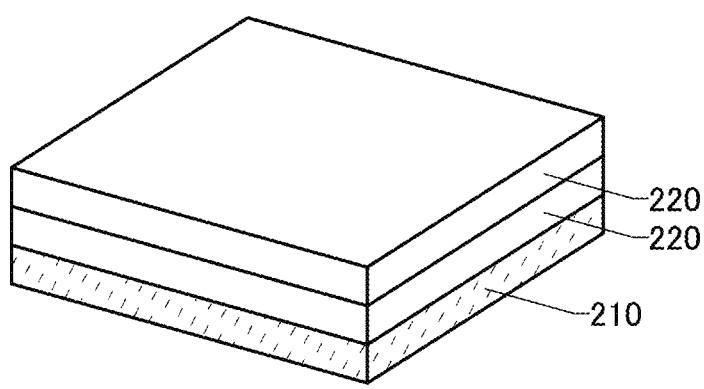

The driver circuit 210 and the memory array 220 may be provided on the same plane. As illustrated in FIG. 20A, the driver circuit 210 and the memory array 220 may be provided to overlap with each other. When the driver circuit 210 and the memory array 220 overlap with each other, the signal transmission distance can be shortened. Alternatively, a plurality of memory arrays 220 may be provided over the driver circuit 210 as illustrated in FIG. 20B.

Figure 20C:
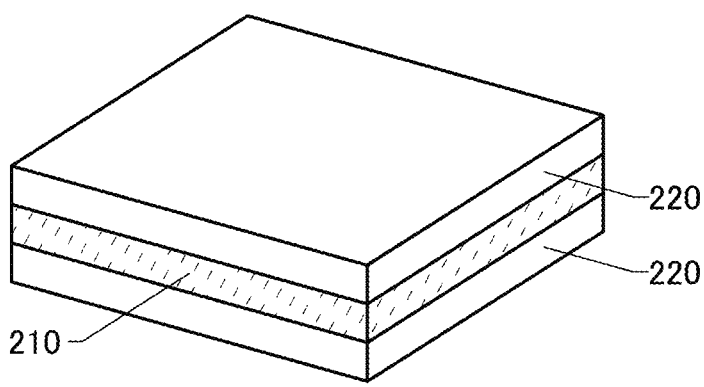

As illustrated in FIG. 20C, the memory array 220 may be provided over and under the driver circuit 210. FIG. 20C illustrates an example in which one memory array 220 is provided over and under the driver circuit 210. Providing a plurality of memory arrays 220 so that the driver circuit 210 is sandwiched therebetween can further shorten the signal propagation distance. The number of memory arrays 220 stacked over the driver circuit 210 and the number of memory arrays 220 stacked under the driver circuit 210 may each be one or more. The number of memory arrays 220 stacked over the driver circuit 210 is preferably equal to the number of memory arrays 220 stacked under the driver circuit 210.

This embodiment can be implemented in an appropriate combination with the structures described in the other embodiments and the like.

Embodiment 4

In this embodiment, structures of transistors that can be used in the memory device 100 and the semiconductor device 200 described in the above embodiment are described. As an example, a structure in which transistors having different electrical characteristics are stacked is described. With the structure, the degree of freedom in design of the semiconductor device can be increased. Stacking transistors having different electrical characteristics can increase the degree of integration of the semiconductor device.

Figure 21:
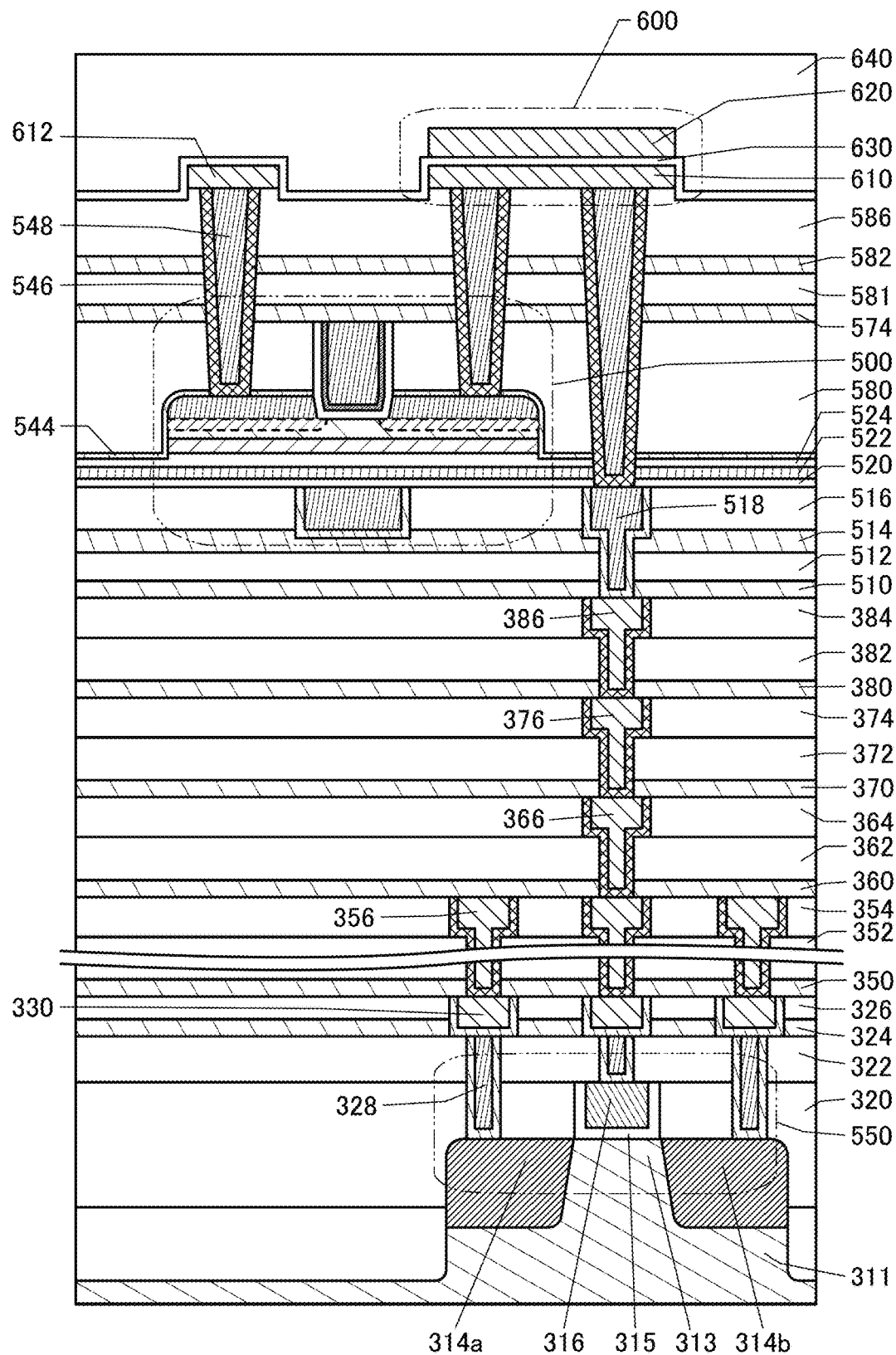
FIG. 21 is a circuit diagram showing a configuration example of a semiconductor device.
Figure 23A:
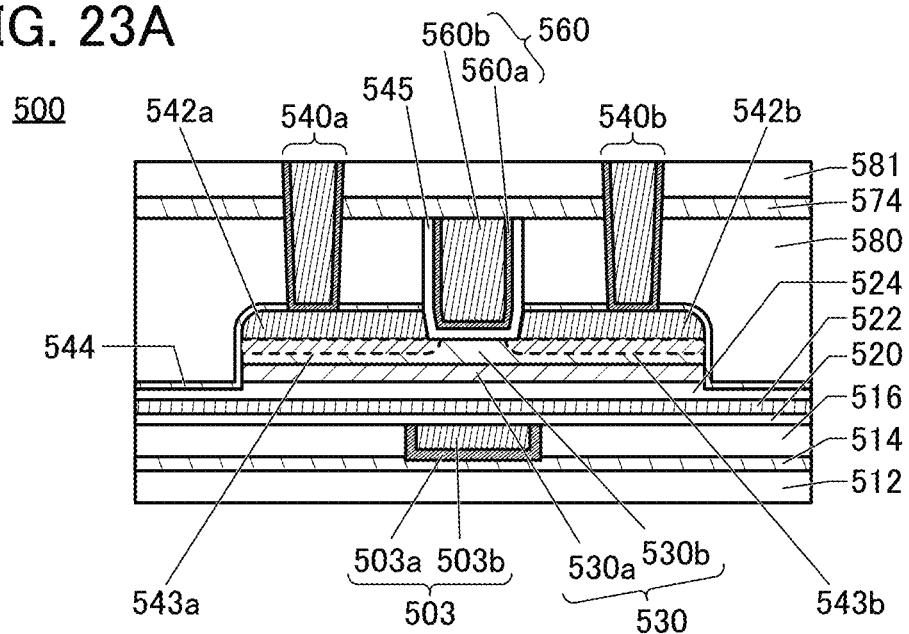
FIG. 23A to FIG. 23C are diagrams showing a configuration example of a transistor.
Figure 23B:
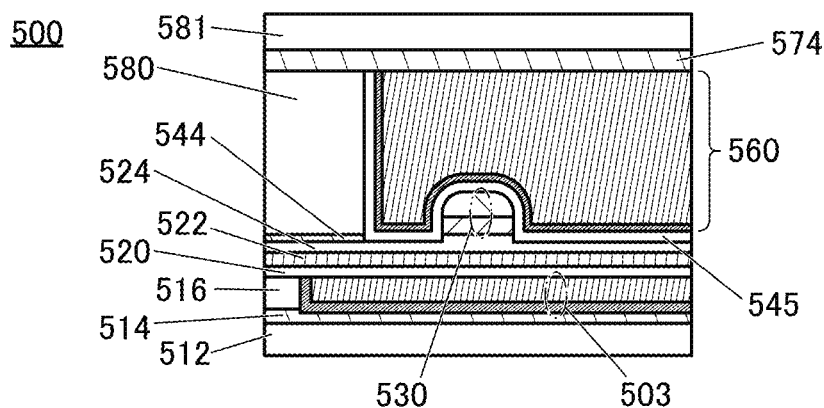
Figure 23C:
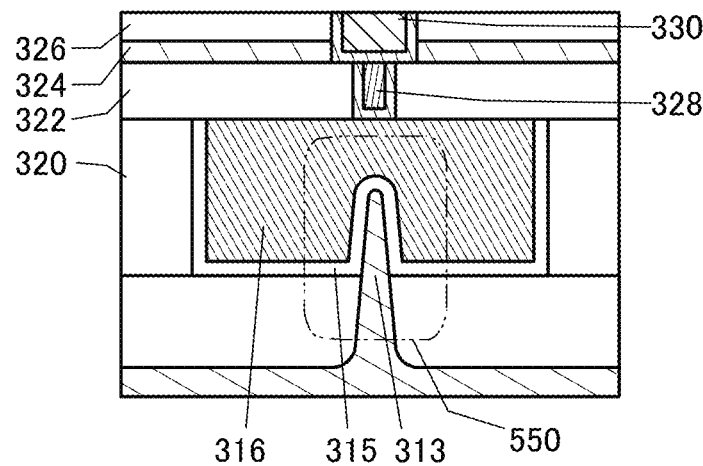

FIG. 21 illustrates part of a cross-sectional structure of a semiconductor device. The semiconductor device illustrated in FIG. 21 includes a transistor 550, a transistor 500, and a capacitor 600. FIG. 23A is a cross-sectional view of the transistor 500 in the channel length direction, FIG. 23B is a cross-sectional view of the transistor 500 in the channel width direction, and FIG. 23C is a cross-sectional view of the transistor 550 in the channel width direction. For example, the transistor 500 and the transistor 550 correspond to the transistor 111 and the transistor 112, respectively, described in the above embodiments. The capacitor 600 corresponds to the capacitor 113.

The transistor 500 is an OS transistor. The off-state current of an OS transistor is extremely low. Accordingly, data voltage or charge written to a storage node through the transistor 500 can be retained for a long time. In other words, power consumption of the semiconductor device can be reduced because a storage node (node ND) has a low frequency of refresh operation or requires no refresh operation.

In FIG. 21, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 23C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

Figure 22:
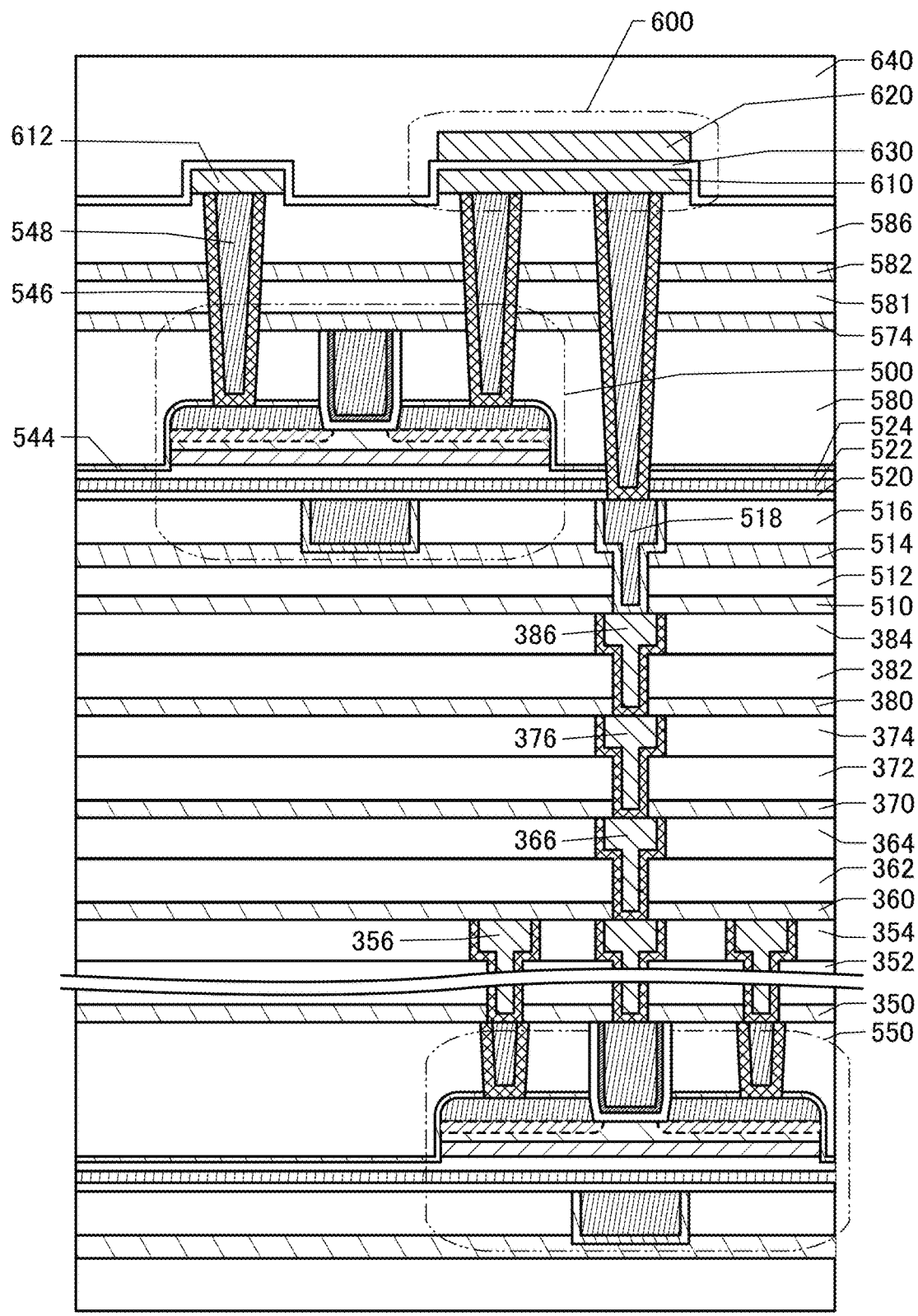
FIG. 22 is a circuit diagram showing a configuration example of a semiconductor device.

Note that the transistor 550 illustrated in FIG. 21 is an example and the structure is not limited thereto; an appropriate transistor can be used in accordance with a circuit structure or a driving method. For example, when the semiconductor device is a single-polarity circuit using only OS transistors (which represent transistors having the same polarity, e.g., only n-channel transistors), the transistor 550 has a structure similar to that of the transistor 500 as illustrated in FIG. 22. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like can be used, for example.

Note that in this specification, silicon oxynitride refers to silicon which contains oxygen at a higher proportion than nitrogen, and silicon nitride oxide refers to silicon which contains nitrogen at a higher proportion than oxygen. Thus, in this specification, "aluminum oxynitride" refers to a material that contains oxygen at a higher proportion than nitrogen, and "aluminum nitride" oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 21, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 21, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 21, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 21, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Thus, a material similar to that for the insulator 324 can be used.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 23A and FIG. 23B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 23A and FIG. 23B, an insulator 544 is preferably positioned between the insulator 580 and the oxide 530a, the oxide 530b, the conductor 542a, and the conductor 542b. Furthermore, as illustrated in FIG. 23A and FIG. 23B, the conductor 560 preferably includes a conductor 560a provided inside the insulator 545 and a conductor 560b provided to be embedded inside the conductor 560a. Moreover, as illustrated in FIG. 23A and FIG. 23B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistors 500 illustrated in FIG. 21, FIG. 22, and FIG. 23A are examples, and the structures are not limited thereto; an appropriate transistor can be used in accordance with a circuit structure, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes referred to as "dehydration" or "dehydrogenation treatment") and to compensate for oxygen vacancies by supplying oxygen to the oxide semiconductor (sometimes referred to as "oxygen adding treatment") in order to obtain an oxide semiconductor whose VoH is sufficiently reduced. When an oxide semiconductor with sufficiently reduced impurities such as VoH is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be $H_2O$, and removed from the oxide 530 or an insulator near the oxide 530 in some cases. Some hydrogen may be gettered into the conductor 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high relative permittivity.

Note that in the transistor 500 in FIG. 23A and FIG. 23B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used for the oxide 530 including a channel formation region. For example, for the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a.

In addition, the energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gradually changes at a junction portion of the oxide 530a and the oxide 530b. In other words, the energy level of the conduction band minimum at the junction portion of the oxide 530a and the oxide 530b continuously changes or is continuously connected. To obtain this, the density of defect states in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 23A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 23A, a region 543a and a region 543b are sometimes formed as low-resistance regions at an interface between the oxide 530 and the conductor 542a (conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or materials that do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b can be inhibited. Furthermore, oxidation of the conductor 542 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIG. 23A and FIG. 23B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

<Modification Example 1 of Transistor>

Figure 24A:
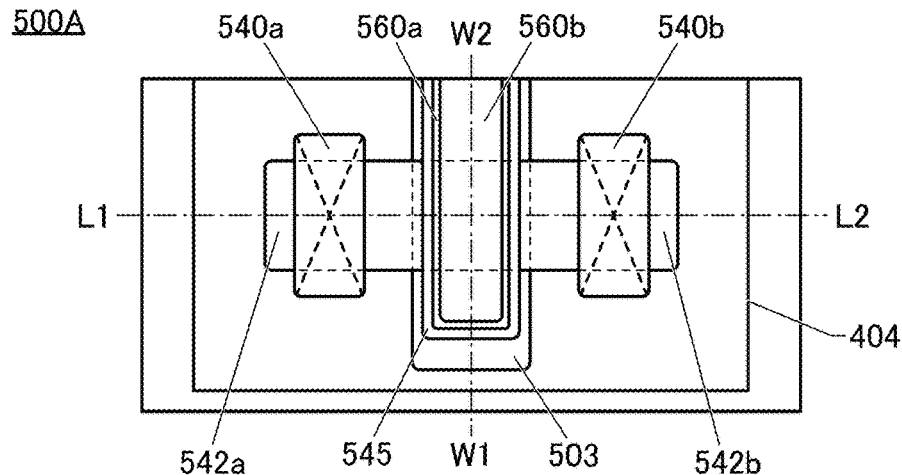
FIG. 24A to FIG. 24C are diagrams showing a configuration example of a transistor.
Figure 24B:
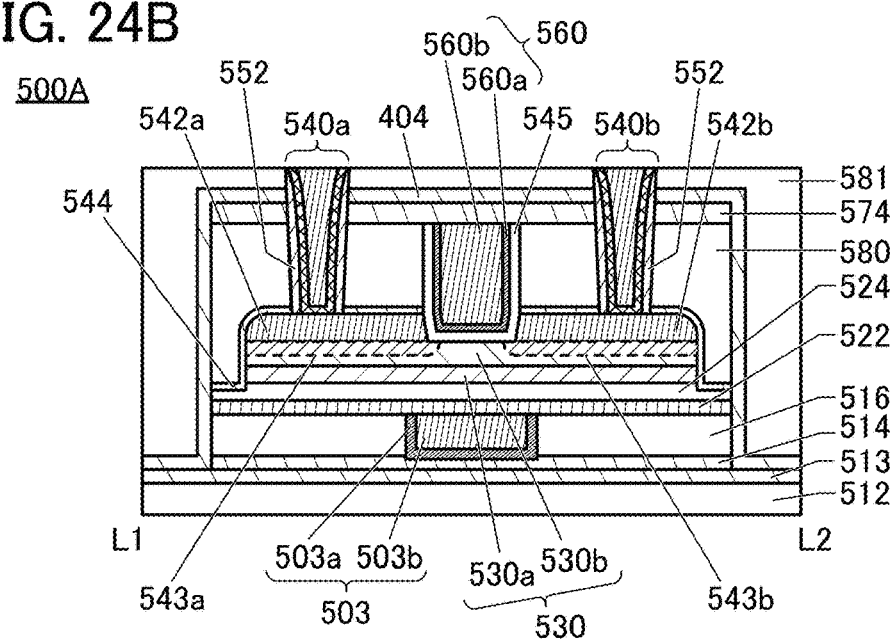
Figure 24C:
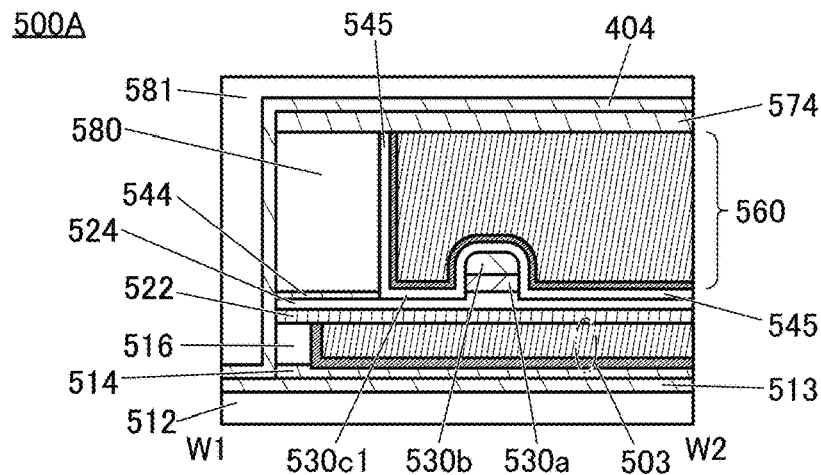

A transistor 500A illustrated in FIG. 24A, FIG. 24B, and FIG. 24C is a modification example of the transistor 500 having the structure illustrated in FIG. 23A and FIG. 23B. FIG. 24A is a top view of the transistor 500A, FIG. 24B is a cross-sectional view of the transistor 500A in the channel length direction, and FIG. 24C is a cross-sectional view of the transistor 500A in the channel width direction. Note that for clarity of the drawing, some components are not illustrated in the top view of FIG. 24A. The structure illustrated in FIG. 24A, FIG. 24B, and FIG. 24C can also be used for other transistors such as the transistor 550 included in the semiconductor device of one embodiment of the present invention.

The transistor 500A having the structure illustrated in FIG. 24A, FIG. 24B, and FIG. 24C is different from the transistor 500 having the structure illustrated in FIG. 23A and FIG. 23B in that an insulator 552, an insulator 513, and an insulator 404 are included. Furthermore, the transistor 500A is different from the transistor 500 having the structure illustrated in FIG. 23A and FIG. 23B in that the insulator 552 is provided in contact with a side surface of the conductor 540a and a side surface of the conductor 540b. Moreover, the transistor 500A is different from the transistor 500 having the structure illustrated in FIG. 23A and FIG. 23B in that the insulator 520 is not included.

In the transistor 500A having the structure illustrated in FIG. 24A, FIG. 24B, and FIG. 24C, the insulator 513 is provided over the insulator 512. The insulator 404 is provided over the insulator 574 and the insulator 513.

In the transistor 500A having the structure illustrated in FIG. 24A, FIG. 24B, and FIG. 24C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

<Modification Example 2 of Transistor>

Figure 25A:
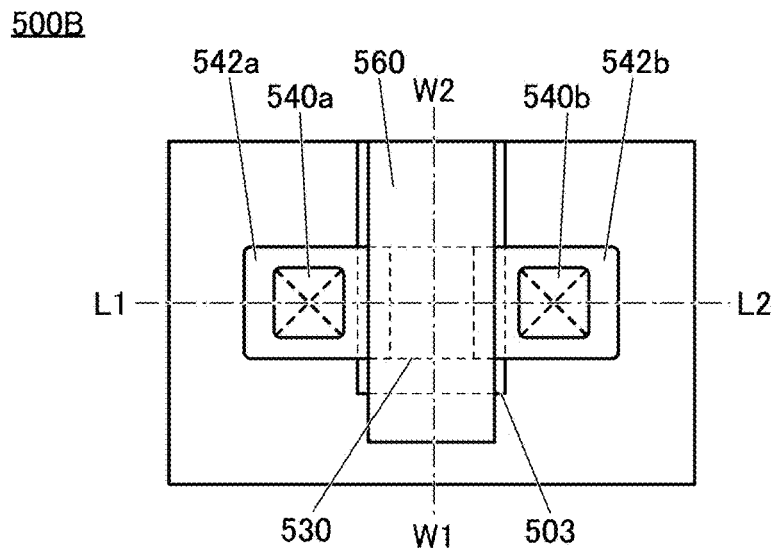
FIG. 25A to FIG. 25C are diagrams showing a configuration example of a transistor.
Figure 25B:
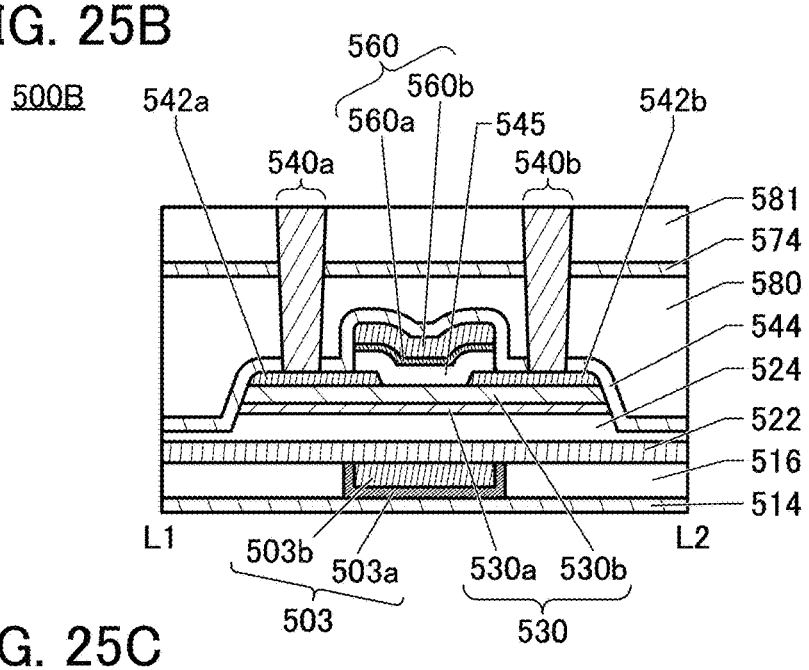
Figure 25C:
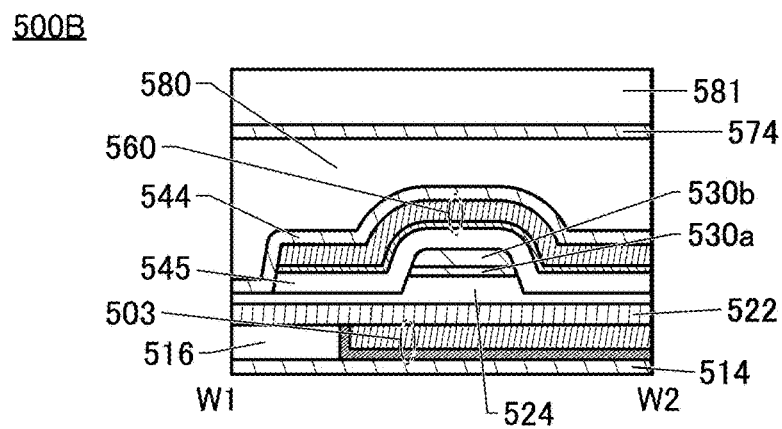

A structure example of a transistor 500B is described with reference to FIG. 25A, FIG. 25B, and FIG. 25C. FIG. 25A is a top view of the transistor 500B. FIG. 25B is a cross-sectional view of a portion indicated by dashed-dotted line L1-L2 in FIG. 25A. FIG. 25C is a cross-sectional view of a portion indicated by dashed-dotted line W1-W2 in FIG. 25A. Note that for clarity of the drawing, some components are not illustrated in the top view of FIG. 25A.

The transistor 500B is a modification example of the transistor 500 and can be replaced with the transistor 500. Accordingly, in order to avoid repeated description, differences of the transistor 500B from the transistor 500 are mainly described.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be extended. That is, the conductor 560a inhibits oxidation of the conductor 560b, thereby preventing the decrease in conductivity.

The insulator 544 is preferably provided to cover the top surface and a side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 5

In this embodiment, a crystal structure of an oxide semiconductor or the like is described in detail.

[Classification of Crystal Structure]

First, the classification of the crystal structures of an oxide semiconductor will be described with reference to FIG. 26A. FIG. 26A is a diagram showing the classification of crystal structures of an oxide semiconductor, typically IGZO (a metal oxide containing In, Ga, and Zn).

As shown in FIG. 26A, an oxide semiconductor is roughly classified into "Amorphous," "Crystalline," and "Crystal." The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 26A are in an intermediate state between "Amorphous" and "Crystal," and belong to a new crystalline phase. That is, these structures are completely different from "Amorphous," which is energetically unstable, and "Crystal."

A crystal structure of a film or a substrate can be evaluated with an X-ray diffraction (XRD) spectrum. FIG. 26B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 26B and obtained by GIXD measurement is hereinafter simply referred to as an XRD spectrum. The CAAC-IGZO film in FIG. 26B has a composition in the vicinity of In:Ga:Zn=4:2:3 [atomic ratio]. The CAAC-IGZO film in FIG. 26B has a thickness of 500 nm.

As shown in FIG. 26B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 26B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 26C shows a diffraction pattern of the CAAC-IGZO film. FIG. 26C shows a diffraction pattern obtained with the NBED method in which an electron beam is incident in the direction parallel to the substrate. The CAAC-IGZO film in FIG. 26C has a composition in the vicinity of In:Ga:Zn=4:2:3 [atomic ratio]. In the nanobeam electron diffraction method, electron diffraction is performed with a probe diameter of 1 nm.

As shown in FIG. 26C, a plurality of spots indicating c-axis alignment are observed in the diffraction pattern of the CAAC-IGZO film.

[Structure of Oxide Semiconductor]

Oxide semiconductors might be classified in a manner different from that in FIG. 26A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface on which the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

[Structure of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be achieved.

Furthermore, an oxide semiconductor with a low carrier concentration is preferably used for a channel formation region of the transistor. For example, the carrier concentration of the channel formation region of the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in a film provided in proximity be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, further preferably lower than $1\times10^{18}$ atoms/cm$^3$.

When an oxide semiconductor with sufficiently reduced impurities is used for the channel formation region of the transistor, stable electrical characteristics can be given.

[Other Semiconductor Materials]

Semiconductor materials that can be used for the oxide 530 are not limited to the above-described metal oxides. A semiconductor material having a bandgap (a semiconductor material that is not a zero-gap semiconductor) may be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

The composition, structure, method, and the like described in this embodiment can be used in combination as appropriate with the compositions, structures, methods, and the like described in the other embodiments, the example, and the like.

Embodiment 6

In this embodiment, an example of a chip 1200 which is a kind of semiconductor device on which the memory device of the present invention is mounted will be described with reference to FIG. 27A and FIG. 27B. A plurality of circuits (systems) are mounted on the chip 1200. A technique for integrating a plurality of circuits (systems) into one chip is referred to as system on chip (SoC) in some cases.

Figure 27A:
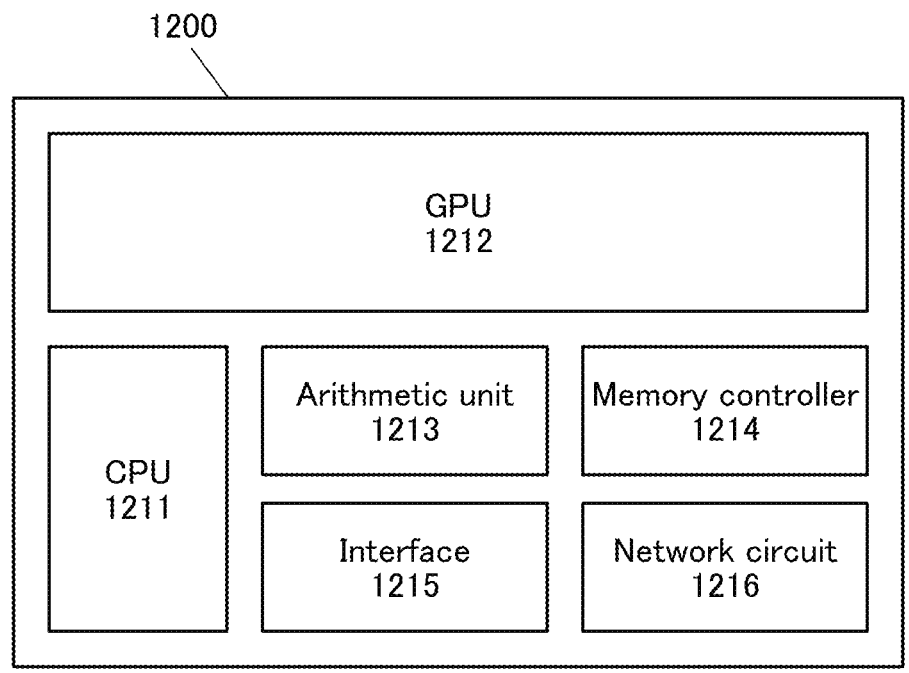
FIG. 27A is a schematic diagram of a semiconductor device and FIG. 27B is a perspective view of the semiconductor device.

As illustrated in FIG. 27A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 27B:
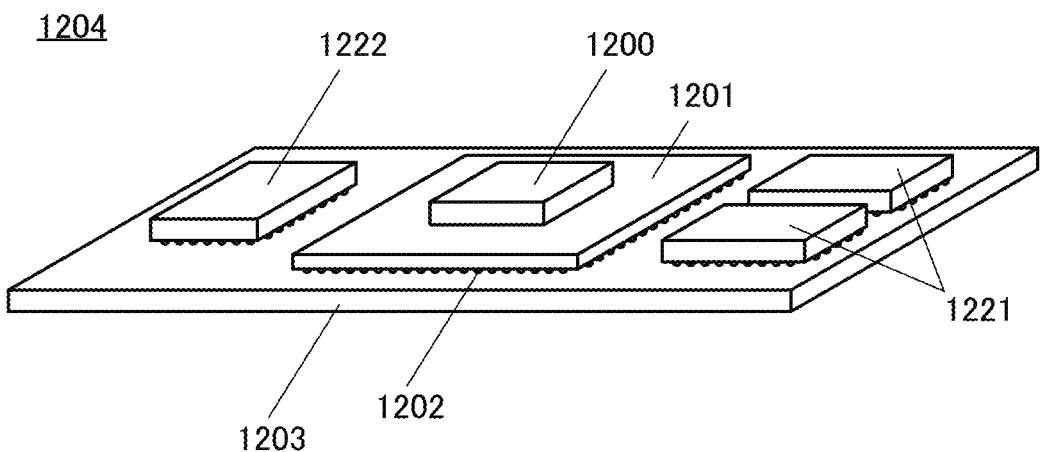

A bump (not illustrated) is provided on the chip 1200, and as illustrated in FIG. 27B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. As the flash memory 1222, any of the semiconductor devices described in the above embodiments is preferably used. When any of the semiconductor devices described in the above embodiments is used as the flash memory 1222, the flash memory 1222 can have large storage capacity.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. Moreover, the GPU 1212 is suitable for parallel computation of a number of data and thus can be used for image processing or a product-sum operation. When an image processing circuit or a product-sum operation circuit is provided in the GPU 1212, image processing and a product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit for the connection to a LAN (Local Area Network) or the like. The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 7

In this embodiment, application examples of the semiconductor device using the memory device described in the above embodiment will be described. The memory device described in the above embodiment can be used for a variety of removable memory devices such as memory cards (e.g., SD cards), USB memories, and SSDs (solid state drives). FIG. 28A to FIG. 28E schematically illustrate some structure examples of removable memory devices. The semiconductor device described in the above embodiment is processed into a packaged memory chip and used in a variety of storage devices and removable memories, for example.

Figure 28A:
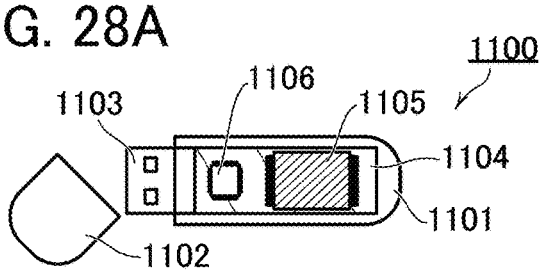
FIG. 28A to FIG. 28E are each a diagram for describing an example of a memory device.

FIG. 28A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device described in the above embodiment can be incorporated in the memory chip 1105 or the like.

Figure 28B:
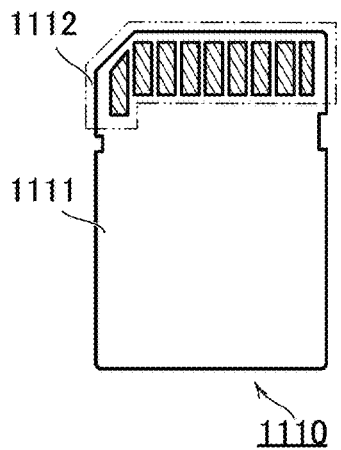
Figure 28C:
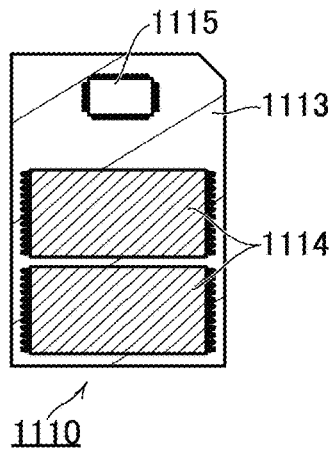

FIG. 28B is a schematic external view of an SD card, and FIG. 28C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The memory device or the semiconductor device described in the above embodiment can be incorporated in the memory chip 1114 or the like.

Figure 28D:
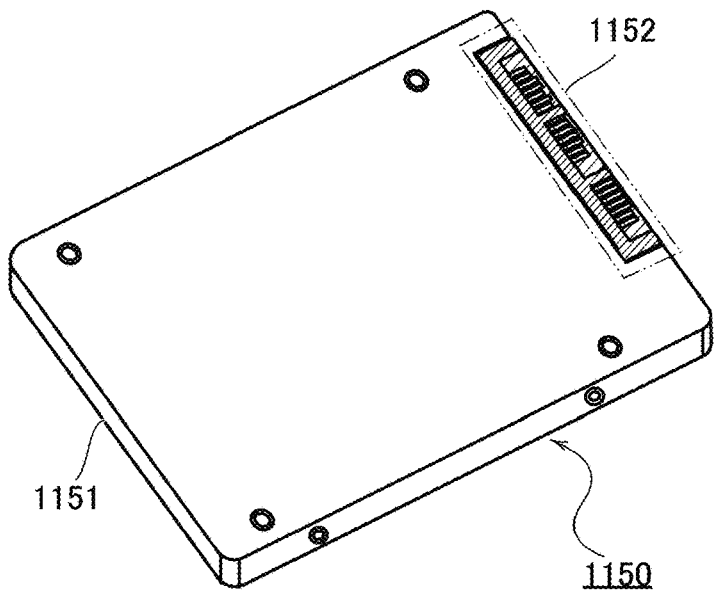
Figure 28E:
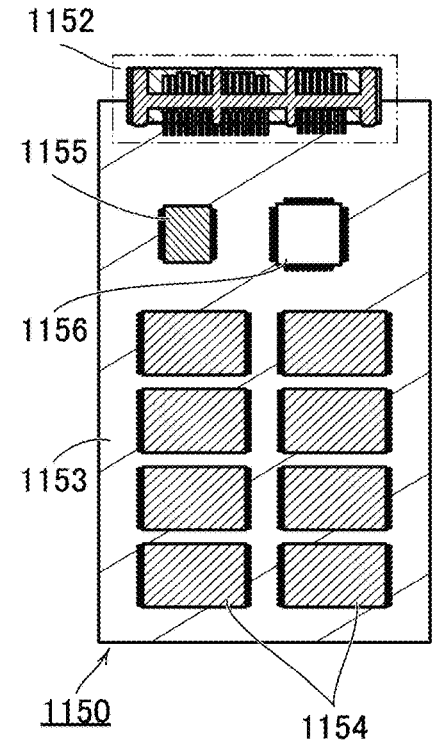

FIG. 28D is a schematic external view of an SSD, and FIG. 28E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The memory device or the semiconductor device described in the above embodiment can be incorporated in the memory chip 1154 or the like.

This embodiment can be implemented in an appropriate combination with the structures described in the other embodiments and the like.

Embodiment 8

FIG. 29A to FIG. 29G illustrate specific examples of electronic devices each provided with the memory device or semiconductor device of one embodiment of the present invention.

<Electronic Device and System>

The memory device or the semiconductor device of one embodiment of the present invention can be mounted on a variety of electronic devices. Examples of electronic devices include an information terminal, a computer, a smartphone, an e-book reader, a television device, digital signage, a large game machine such as a pachinko machine, a digital camera, a digital video camera, a digital photo frame, a mobile phone, a portable game machine, a video recording/reproducing device, a navigation system, and an audio reproducing device. Here, the computer refers not only to a tablet computer, a notebook computer, and a desktop computer, but also to a large computer such as a server system.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

[Information Terminal]

With the memory device or semiconductor device of one embodiment of the present invention, a memory device for storing a microcontroller program can be configured. Thus, according to one embodiment of the present invention, the size of a microcontroller chip can be reduced.

Figure 29A:
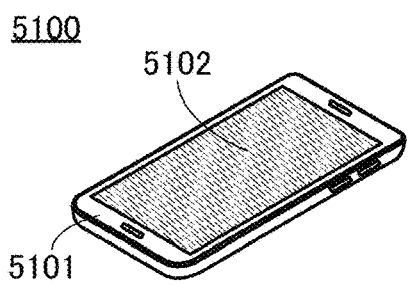
FIG. 29A to FIG. 29G are each a diagram for describing an example of an electronic device.

FIG. 29A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 29B:
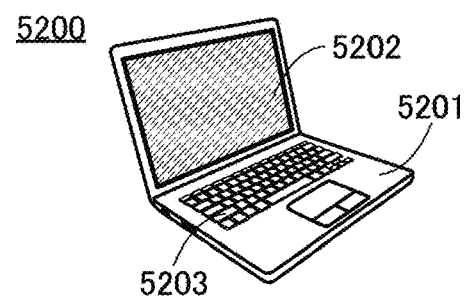

FIG. 29B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIG. 29A and FIG. 29B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 29C:
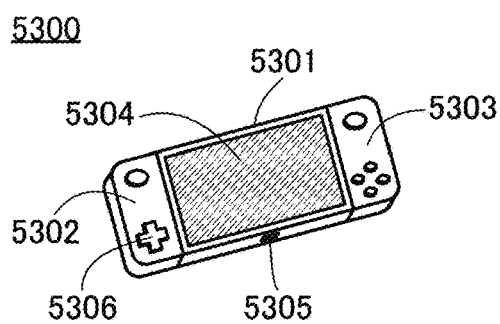

FIG. 29C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The memory device, the semiconductor device, or the like of one embodiment of the present invention can be incorporated into a chip provided on a substrate in the housing 5301, the housing 5302 and the housing 5303, for example.

Figure 29D:
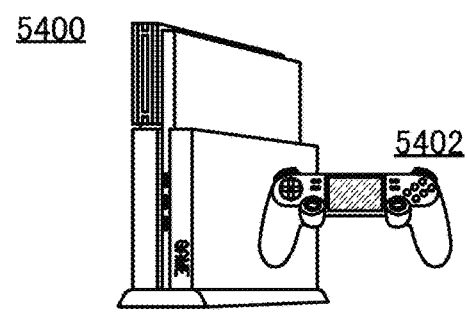

FIG. 29D illustrates a stationary game machine 5400 as an example of a game machine. A controller 5402 is wired or connected wirelessly to the stationary game machine 5400.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although the portable game machine and the stationary game machine are illustrated as examples of game machines in FIG. 29C and FIG. 29D, the game machine using the microcontroller of one embodiment of the present invention is not limited thereto. Examples of game machines using the microcontroller of one embodiment of the present invention include an arcade game machine installed in entertainment facilities (a game center, an amusement park, or the like) and a throwing machine for batting practice installed in sports facilities.

[Large Computer]

The memory device, the semiconductor device, or the like of one embodiment of the present invention can be used in a large computer.

Figure 29E:
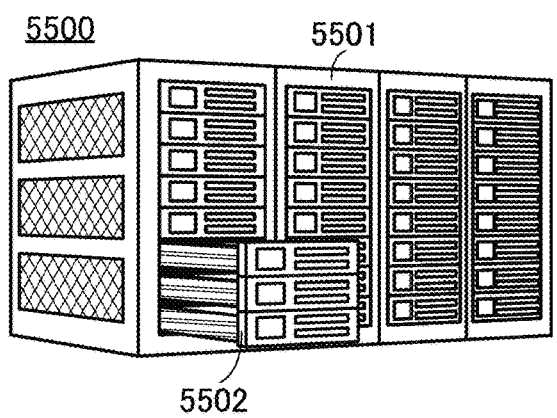
Figure 29F:
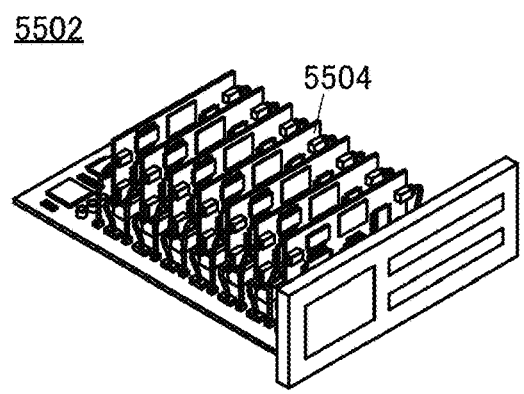

FIG. 29E illustrates a supercomputer 5500 as an example of a large computer. FIG. 29F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, and a microcontroller of one embodiment of the present invention can be mounted on the substrates. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although a supercomputer is illustrated as an example of a large computer in FIG. 29E and FIG. 29F, a large computer using the microcontroller of one embodiment of the present invention is not limited thereto. Examples of a large computer using the microcontroller of one embodiment of the present invention include a computer that provides service (a server) and a large general-purpose computer (a mainframe).

[Household Appliance]

Figure 29G:
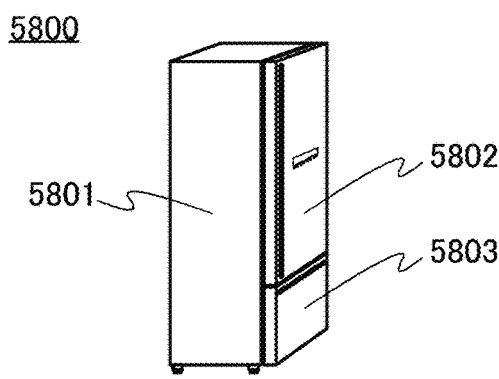

FIG. 29G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

Although the electric refrigerator-freezer is described as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, its effects, and the like described in this embodiment can be combined as appropriate with the description of another electronic device.

This embodiment can be implemented in an appropriate combination with the structures described in the other embodiments and the like.

Example

Figure 30A:
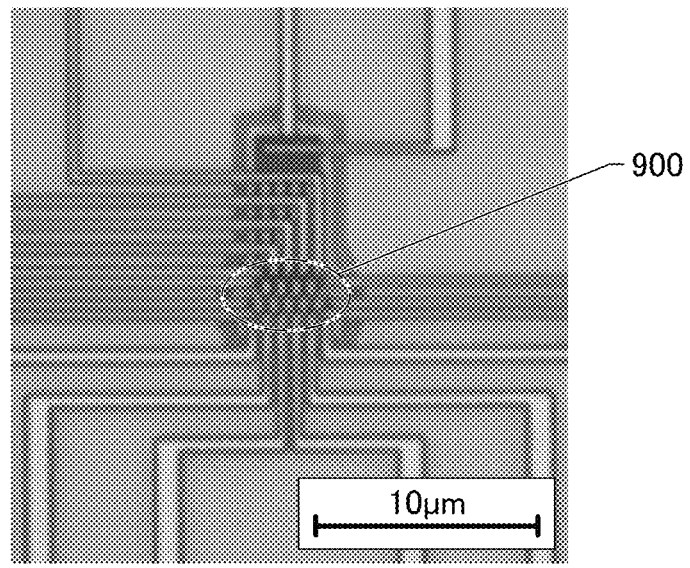
FIG. 30A is an optical micrograph of a memory device and FIG. 30B is a cross-sectional TEM image of a memory device.
Figure 30B:
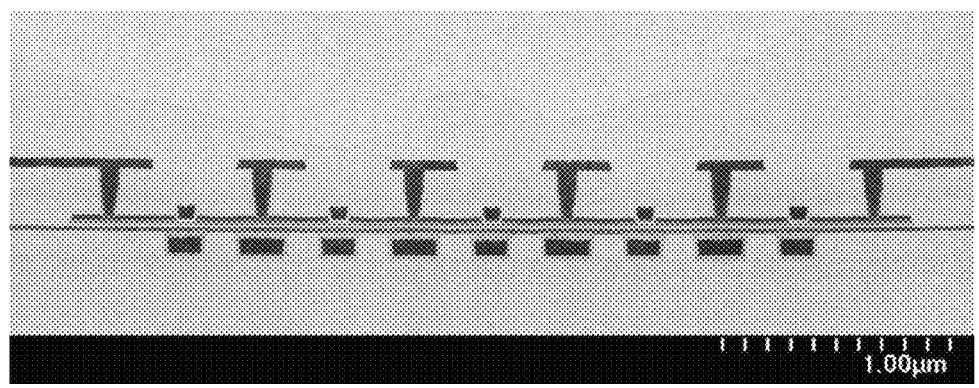

A memory device 900 corresponding to the memory device 100B described in the above embodiment was fabricated and the operation was verified. FIG. 30A shows an optical micrograph of the top surface of the memory device 900. FIG. 30B shows a cross-sectional TEM image of part of the memory device 900.

<Circuit Configuration of Memory Device 900>

Figure 31:
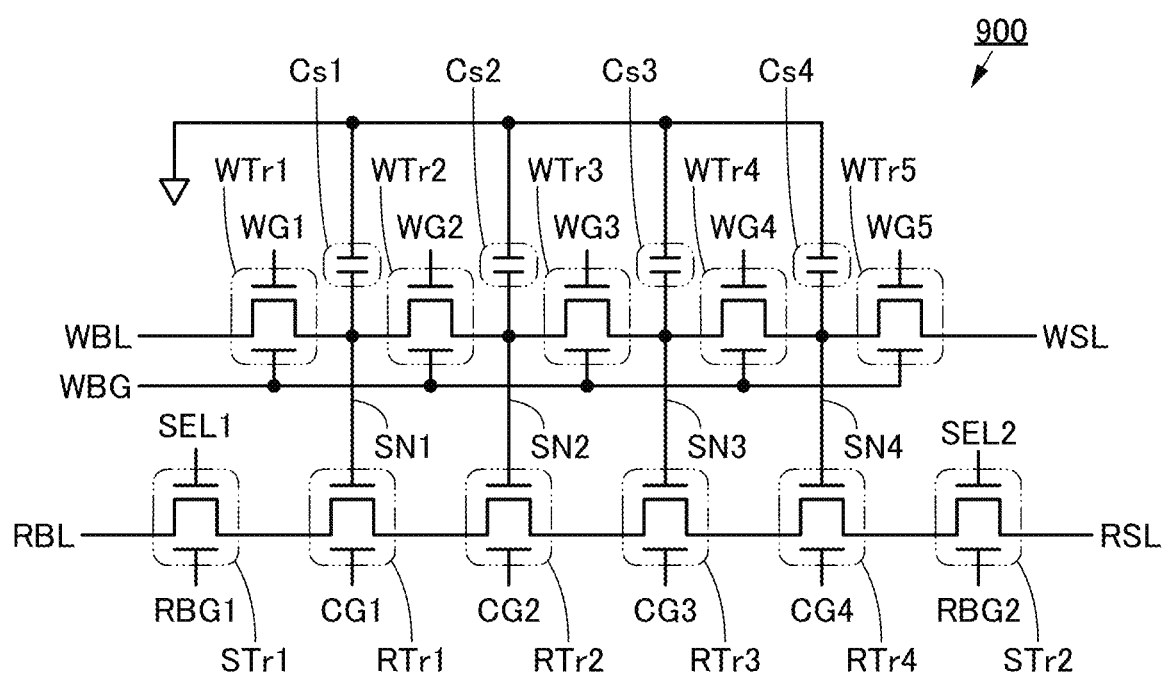
FIG. 31 is a circuit diagram of a memory device.

FIG. 31 shows a circuit diagram of the memory device 900. The memory device 900 includes a transistor WTr1 to a transistor WTr5, which are writing transistors, and a transistor RTr1 to a transistor RTr4, which are reading transistors, a transistor STr1, and a transistor STr2. These transistors are transistors using CAAC-IGZO in a semiconductor layer where a channel is formed (also referred to as "CAAC-IGZO FETs"). In these transistors, the channel length L is 60 nm and the channel width W is 60 nm. These transistors are transistors each having a back gate.

The memory device 900 includes a capacitor Cs1 to a capacitor Cs4. In FIG. 31, a node SN1 to a node SN4 are illustrated. The electrostatic capacitance of each of the capacitor Cs1 to the capacitor Cs4 is 3 fF.

In the memory device 900, the transistor WTr1 corresponds to the transistor 111[1] of the memory device 100B described in the above embodiment and the transistor RTr1 corresponds to the transistor 112[1] of the memory device 100B. The transistor STr1 corresponds to the transistor 131, and the transistor STr2 corresponds to the transistor 132. The capacitor Cs1 corresponds to the capacitor 113[1] and the node SN1 corresponds to the node ND[1].

A gate of the transistor WTr1 is electrically connected to a wiring WG1, a gate of the transistor WTr2 is electrically connected to a wiring WG2, a gate of the transistor WTr3 is electrically connected to a wiring WG3, a gate of the transistor WTr4 is electrically connected to a wiring WG4, and a gate of the transistor WTr5 is electrically connected to the wiring WG5. Back gates of the transistor WTr1 to the transistor WTr5 are electrically connected to the wiring WBG. The transistor WTr1 is electrically connected to the wiring WBL, and the transistor WTr5 is electrically connected to the wiring WSL.

A gate of the transistor RTr1 is electrically connected to the node SN1, a gate of the transistor RTr2 is electrically connected to the node SN2, a gate of the transistor RTr3 is electrically connected to the node SN3, and a gate of the transistor RTr4 is electrically connected to the node SN4.

A back gate of the transistor RTr1 is electrically connected to the wiring CG1, a back gate of the transistor RTr2 is electrically connected to the wiring CG2, a back gate of the transistor RTr3 is electrically connected to the wiring CG3, and a back gate of the transistor RTr4 is electrically connected to the wiring CG4. A gate of the transistor STr1 is electrically connected to the wiring SEL1, and the back gate thereof is electrically connected to the wiring RBG1. A gate of the transistor STr2 is electrically connected to the wiring SEL2, and the back gate thereof is electrically connected to the wiring RBG2. The transistor STr1 is electrically connected to the wiring RBL, and the transistor STr2 is electrically connected to the wiring RSL.

<Verification of Writing and Reading Operations>

Figure 32A:
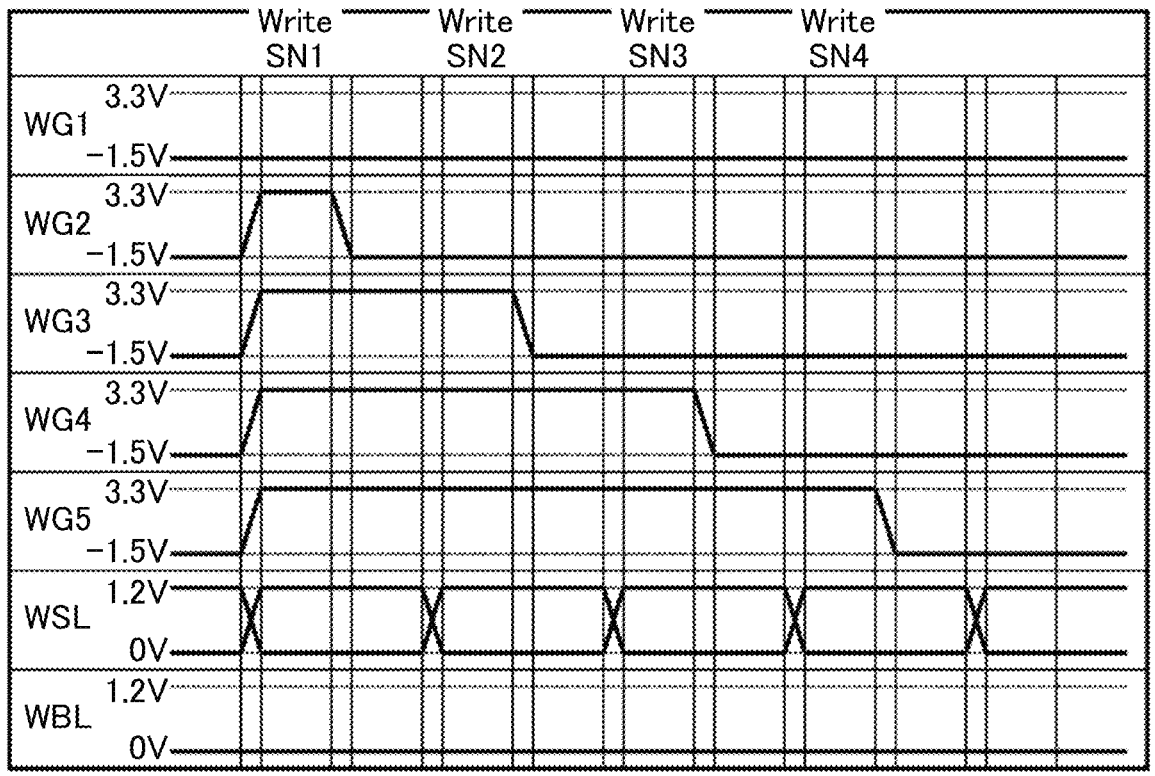
FIG. 32A is a timing chart showing a writing operation and FIG. 32B is a timing chart showing a reading operation.

FIG. 32A shows a timing chart used for verification of a writing operation. The H potential and the L potential supplied to the wiring WG1 to the wiring WG5 were set to 3.3 V and −1.5 V, respectively. The H potential and the L potential supplied to the wiring WSL were set to 1.2 V and 0 V, respectively. Note that the H potential supplied to the wiring WSL corresponds to Data "1", and the L potential supplied to the wiring WSL corresponds to Data "0". To the wiring WBL, 0 V was supplied. In FIG. 32A, Write SN1 to Write SN4 represent periods in which information is written to the node SN1 to the node SN4, respectively.

Figure 32B:
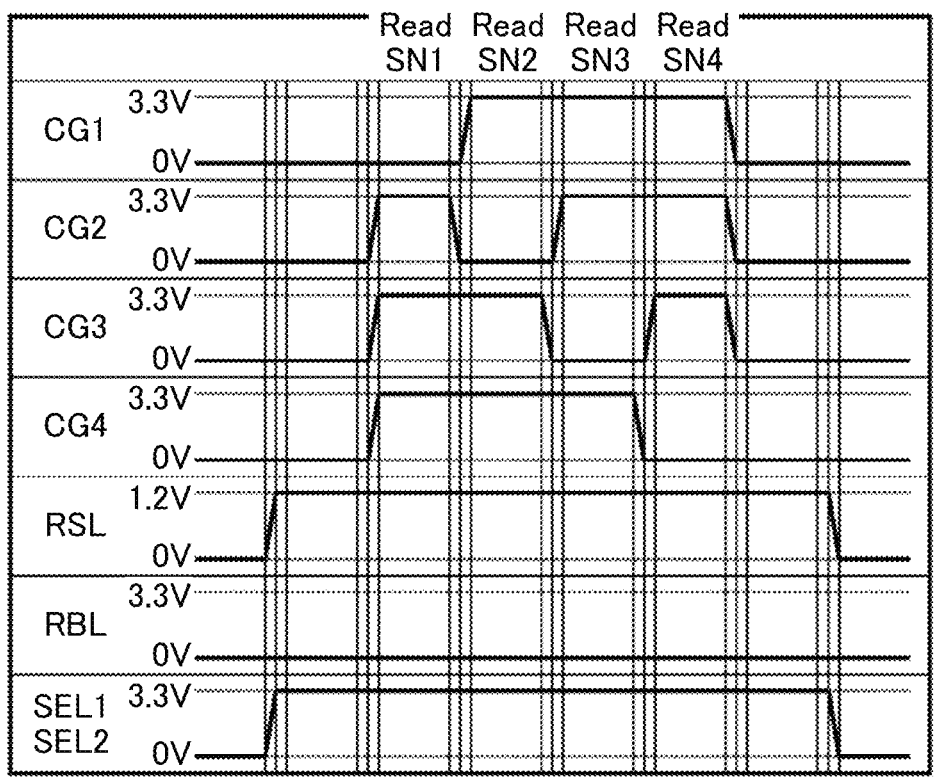

FIG. 32B shows a timing chart used for verification of a reading operation. The H potential and the L potential supplied to the wiring CG1 to the wiring CG4 were set to 3.3 V and 0 V, respectively. The H potential and the L potential supplied to the wiring RSL were set to 1.2 V and 0 V, respectively. The H potential and the L potential supplied to the wiring RBL were set to 3.3 V and 0 V, respectively. The H potential and the L potential supplied to the wiring SEL1 and the wiring SEL2 were 3.3 V and 0 V, respectively. To the wiring RBG1 and the wiring RBG2, 1.0 V was supplied. In FIG. 32B, Read SN1 to Read SN4 represent periods in which information retained in the node SN1 to the node SN4 is read.

<Temperature Dependence of Off-State Current of CAAC-IGZO FET>

Figure 33A:
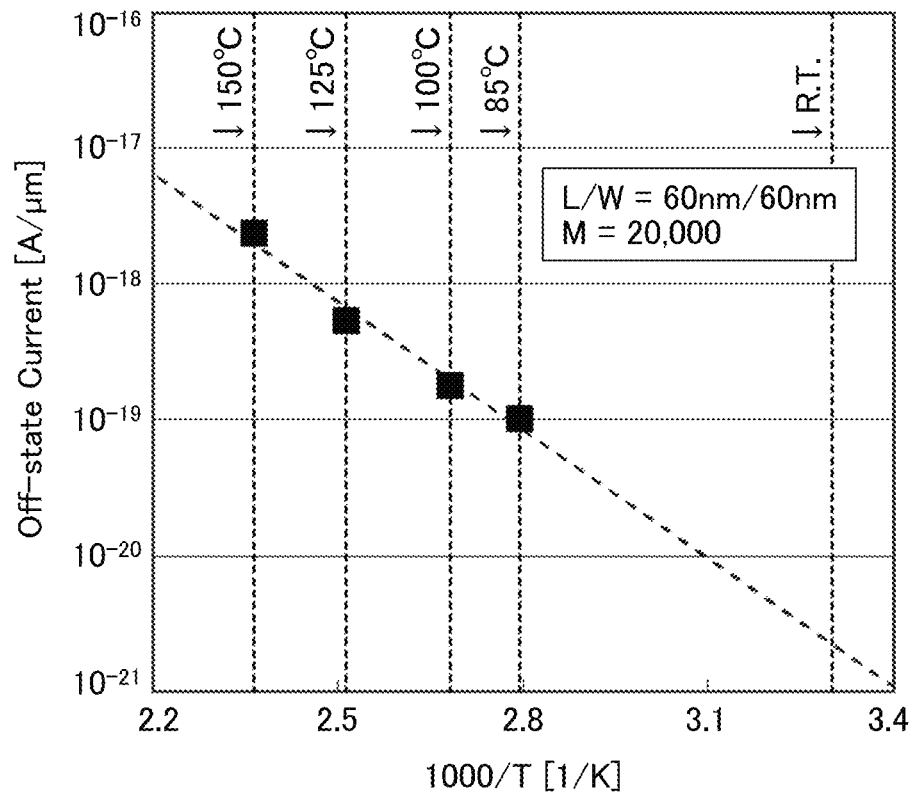
FIG. 33A is a diagram showing temperature dependence of the off-state current of CAAC-IGZO FETs and FIG. 33B is a diagram showing measurement results of the time during which information written to the memory device can be retained.

FIG. 33A shows the temperature dependence of the off-state current (leakage current) of the CAAC-IGZO FETs used in the memory device 900. In FIG. 33A, the horizontal axis represents the reciprocal of temperature T and the vertical axis represents the off-state current per micrometer of channel width. FIG. 33A shows measurement results of 20,000 parallel-connected transistors (M=20,000) with a channel length L of 60 nm and a channel width W of 60 nm.

The Arrhenius plot of the off-state current at 150° C., 125° C., 100° C., and 85° C. indicated that the off-state current at room temperature (R. T.) was approximately 2 [zA/μm].

Figure 33B:
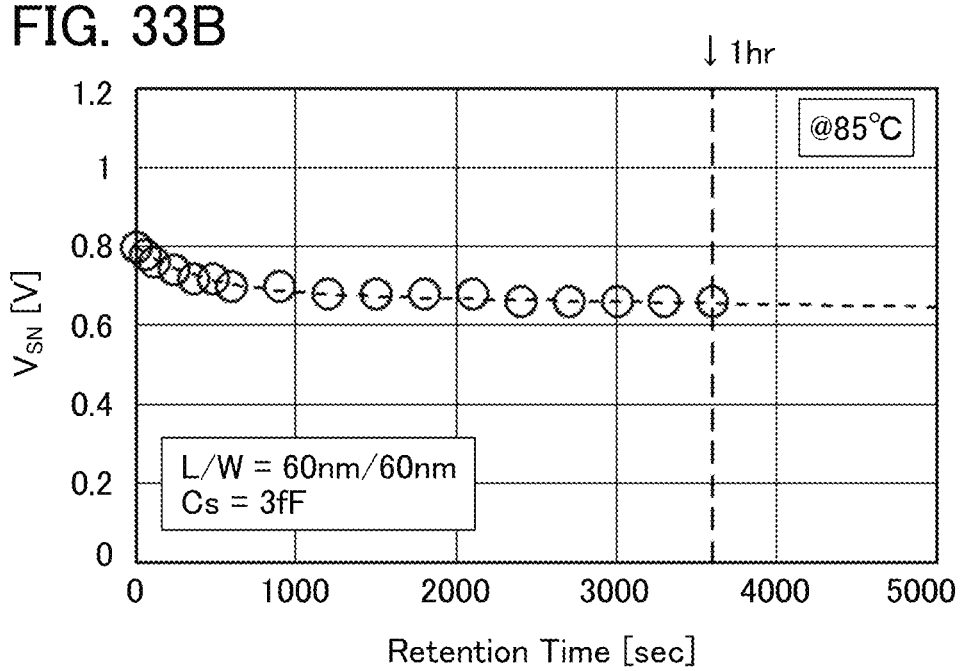

FIG. 33B shows the measurement results of the time during which information written to the memory device 900 can be retained at 85° C. The time during which the information can be retained was regarded as the time taken for a 0.2 V decrease in the potential of the node SN (any one of the node SN1 to the node SN4) from the potential at the time when the transistor WTr (any one of the transistor WTr1 to the transistor WTr5) electrically connected to the node SN is turned off. In FIG. 33B, the horizontal axis represents retention time and the vertical axis represents the potential of the node SN (potential $V_{SN}$). FIG. 33B shows that the information can be retained in an environment at 85° C. for one hour or longer. Since the off-state current at 85° C. is 50 times as high as that at room temperature (see FIG. 33A), it is found that data can be retained at room temperature for about two days.

<Verification of Rewrite Endurance>

Figure 34A:
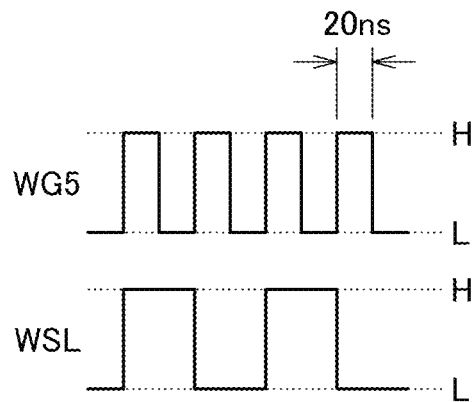
FIG. 34A is a timing chart of signals supplied to a wiring WG5 and a wiring WSL and FIG. 34B is a diagram showing verification results of rewrite endurance.

Next, the rewrite endurance of the memory device 900 was verified. The rewrite endurance was verified in the state where −1.5 V was supplied to the wiring WG1 to the wiring WG4, 0 V was supplied to the wiring WBL, the wiring WBG, and the wiring RBL, 3.3 V was supplied to the wiring CG1 to the wiring CG3, 1 V was supplied to the wiring RBG1 and the wiring RBG2, and 1.2 V was supplied to the wiring RSL. In the above state, the H potential (Data "1") and the L potential (Data "0") were alternately written from the wiring WSL to the node SN4. The information (potential) written to the node SN4 is switched whenever a signal (H potential) with a 20 ns pulse width is supplied to the wiring WG5. FIG. 34A shows a timing chart of the signals supplied to the wiring WG5 and the wiring WSL.

Whenever the number of write cycles reached 10 to the power of X (X is a natural number of 0 or more), the potential $V_{SN}$ at the time when Data "1" was written to the node SN4 and the potential $V_{SN}$ at the time when Data "0"

was written to the node SN4 were derived from the Id-Vg characteristics of the transistors and the current value of the wiring RBL.

Figure 34B:
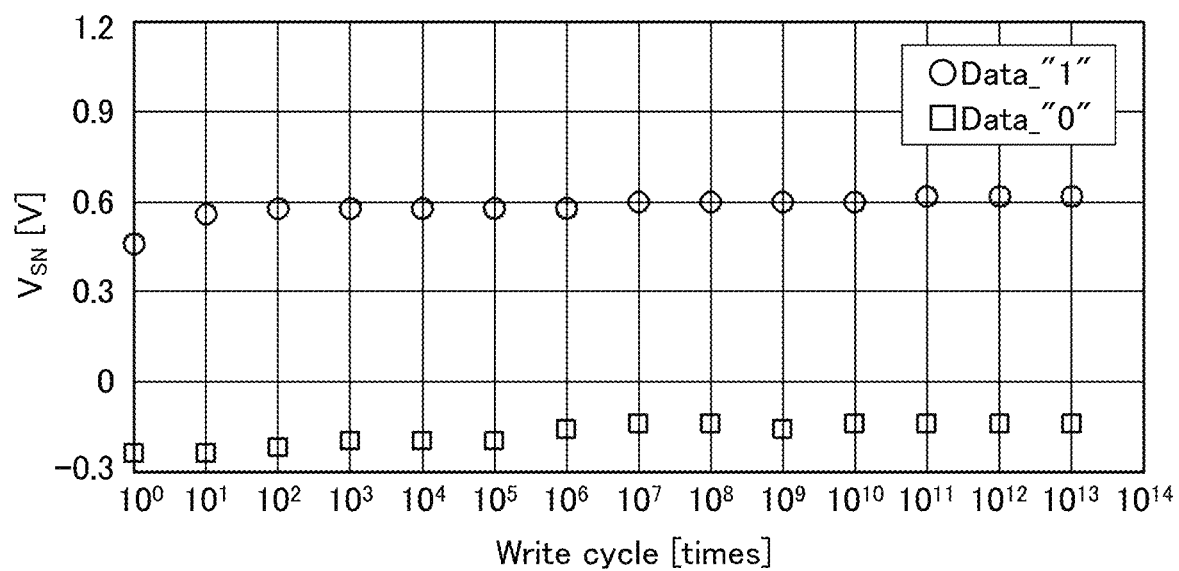

FIG. 34B shows the verification results of the rewrite endurance. In FIG. 34B, the horizontal axis represents the number of write cycles (Write cycle) and the vertical axis represents the potential $V_{SN}$. FIG. 34B reveals a clear potential difference (voltage window) between Data "1" and Data "0" obtained after 10 to the power of 13 cycles of writing operations of the memory device 900, which indicates the excellent rewrite endurance.

<Verification of Write Disturb Endurance>

Next, the write disturb endurance of the memory device 900 was verified. In the memory device 900, the nodes SN are electrically connected to one wiring through the transistors, and information can be written to different nodes SN from both the wiring WBL and the wiring WSL at the same time. In this case, data being retained might be damaged by the influence of the writing operation of an adjacent node SN.

Figure 35A:
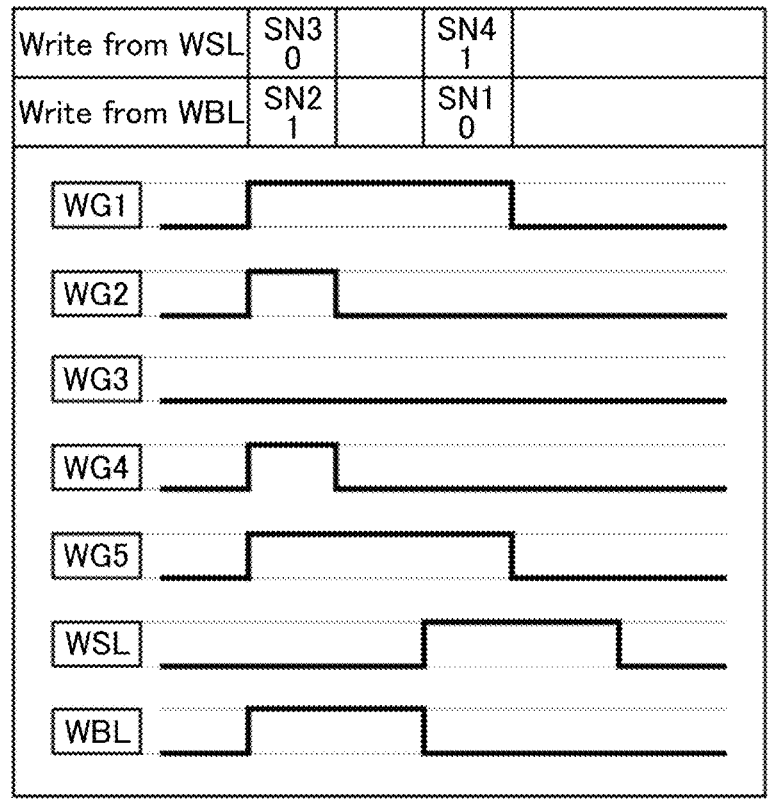
FIG. 35A and FIG. 35B are timing charts for verification of write disturb endurance.

FIG. 35A is a timing chart showing an initial operation for verification of the write disturb endurance. In the initial operation, Data "0" is written to the node SN1 and the node SN3, Data "1" is written to the node SN2 and the node SN4, and information thereon is retained. Note that to the node SN1 and the node SN2, information has been written from the wiring WBL (Write from WBL). To the node SN3 and the node SN4, information has been written from the wiring WSL (Write from WSL).

Figure 35B:
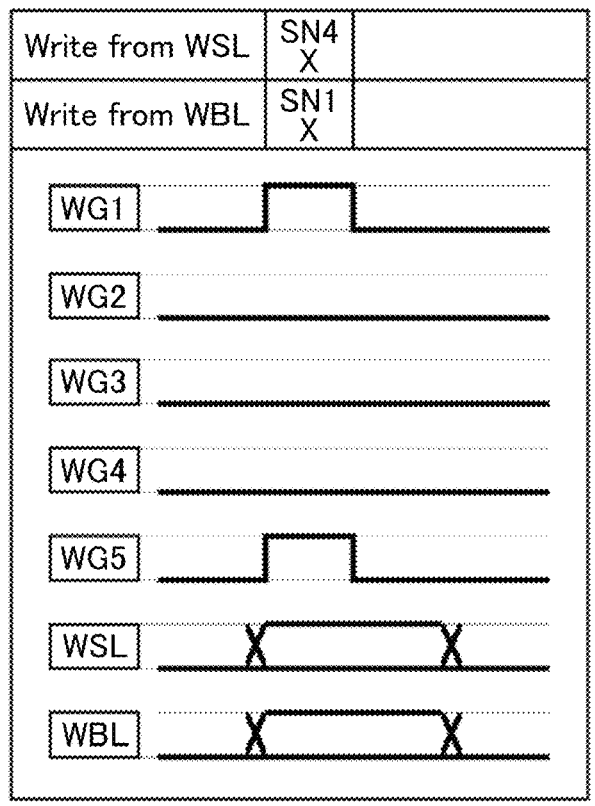

After that, the information on the node SN1 and the node SN4 was repeatedly rewritten in a method similar to that of the verification of the rewrite endurance. FIG. 35B shows a timing chart for verification of the write disturb endurance.

Figure 36A:
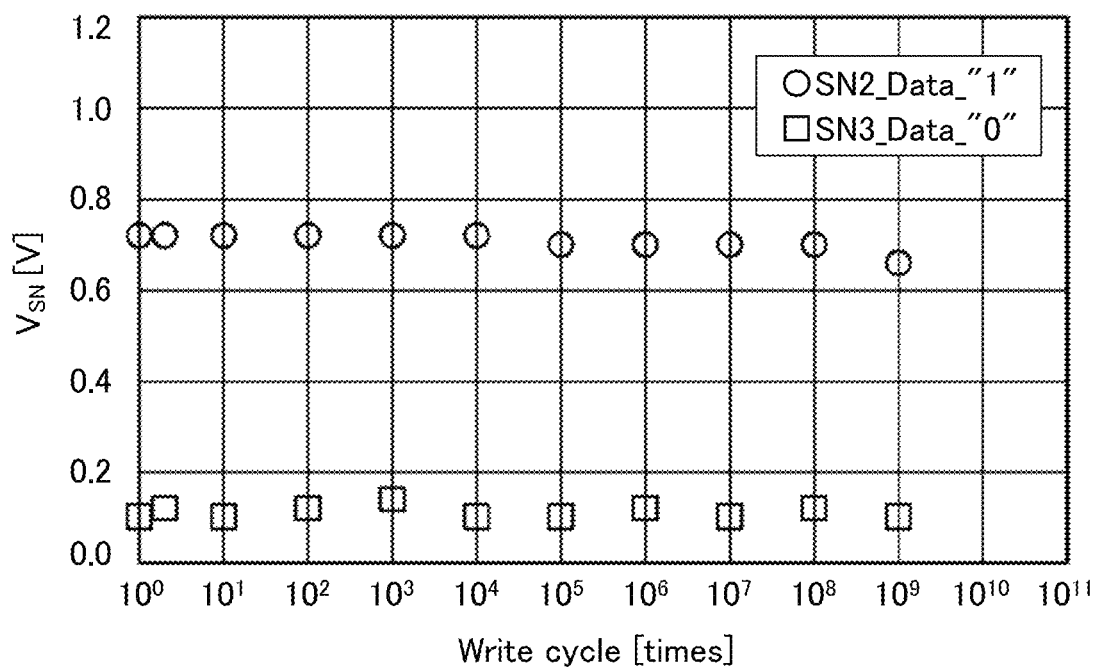
FIG. 36A is a diagram showing verification results of write disturb endurance and FIG. 36B is a Shmoo plot of the gate potential of a writing transistor and a pulse width.

In the verification period, Data "1" is retained in the node SN2, and Data "0" is retained in the node SN3. Whenever the number of cycles of writing (rewriting) to the node SN1 and the node SN4 reached 10 to the power of X (X is a natural number of 0 or more), the information (potential) retained in the node SN2 and the node SN3 was measured. FIG. 36A shows the verification results of the write disturb endurance. In FIG. 36A, the horizontal axis represents the number of cycles of writing (Write cycle) to the node SN1 and the node SN4, and the vertical axis represents the potentials $V_{SN}$ of the node SN2 and the node SN3.

FIG. 36A shows that, after the elapse of 10 to the power of 9 cycles, the potentials of the node SN2 and the node SN3 are not significantly changed and the information is retained. This indicates that the memory device 900 is unlikely to be affected by Write disturb. In a CAAC-IGZO FET, parasitic capacitance such as a fringe factor is small. Accordingly, even though the capacitor Cs is small, the memory device 900 is presumed unlikely to be affected by Write disturb.

<Shmoo Plot of Gate Potential of Transistor WTr and Writing Speed>

Figure 36B:
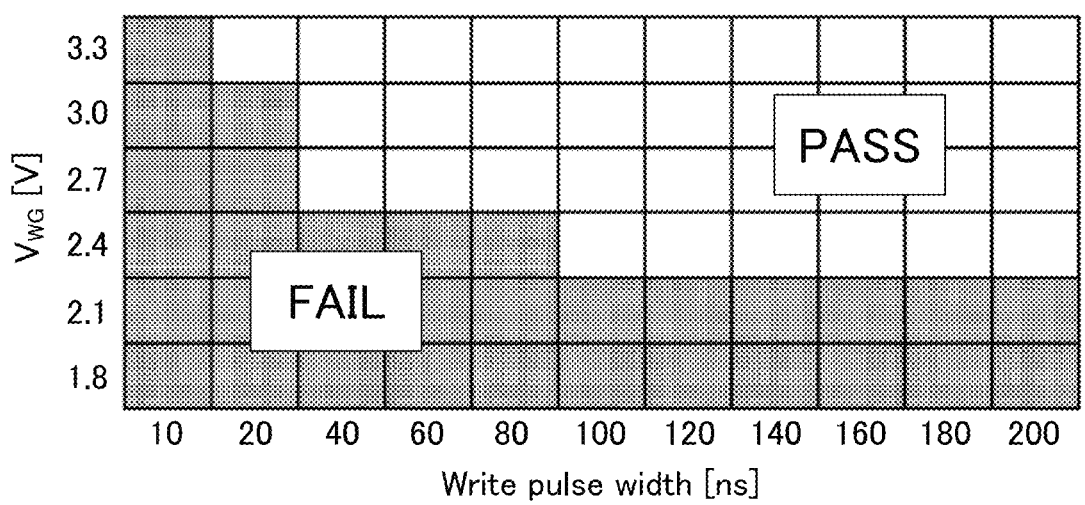

FIG. 36B shows a shmoo plot of a potential $V_{WG}$ of a signal, which is supplied to the gate of the writing transistor WTr when information is written to the memory cell, and the pulse width of the signal. In FIG. 36B, the horizontal axis represents the pulse width (Write pulse width) of the signal and the vertical axis represents the potential $V_{WG}$. In FIG. 36B, "PASS" denotes the combination of the potential $V_{WG}$ and the pulse width at the time of normal information writing, and "FAIL" denotes the combination at the time of a failure in normal information writing.

FIG. 36B shows that, even at a 20 ns pulse width, information writing is normally performed as long as the potential $V_{WG}$ is 3.3 V. The same applies to the case where Data "1" is rewritten to Data "0" and the case where Data "0" is rewritten to Data "1". Note that the pulse width corresponds to writing speed. It can be said that, as the pulse width at the time of normal information writing is shorter, the writing speed becomes higher.

Table 1 shows a comparison between the fabricated memory device 900 (This work), a NAND flash, a PCM, and an STT-MRAM.

TABLE 1

|  | This work | NAND flash | PCM | STT-MRAM |
| --- | --- | --- | --- | --- |
| Process node | 60 nm | 20 nm | 20 nm | 28 nm |
| Write Voltage | 3.3 V | >10 V | <1.5 V | <1.0 V |
| Write time | 20 ns | 1 µs | 300 ns | 10 ns |
| Endurance | $10^{13}$ | $10^4$ | $10^7$ | $10^{12}$ |
| Batch Erase | No need | Need | No need | No need |
| Selector/ Peripheral | Simple | Complex | Complex | Complex |
| Cell size | Small | Small | Small | Small |

Figure 37:
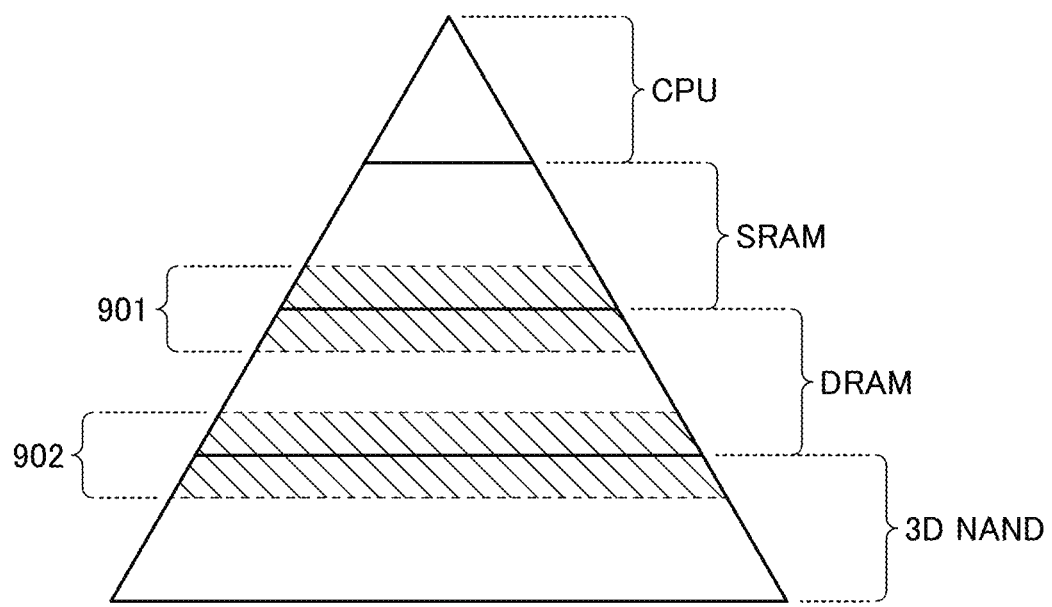
FIG. 37 is a diagram showing a hierarchy of a variety of memory devices.

In general, a variety of memory devices are used in semiconductor devices such as computers in accordance with the intended use. FIG. 37 shows a hierarchy of a variety of memory devices. The memory devices at the upper levels require high access speeds, and the memory devices at the lower levels require large storage capacity and high record density. In FIG. 37, sequentially from the top level, a memory included as a register in an arithmetic processing device such as a CPU, an SRAM (Static Random Access Memory), a DRAM (Dynamic Random Access Memory), and a 3D NAND memory are shown.

A memory included as a register in an arithmetic processing device such as a CPU is used for temporary storage of arithmetic operation results, for example, and thus is frequently accessed by the arithmetic processing device. Accordingly, high operation speed is required rather than storage capacity. The register also has a function of retaining settings of the arithmetic processing device, for example.

An SRAM is used for a cache, for example. The cache has a function of retaining a copy of part of information retained in a main memory. Copying data which is frequently used and retaining the copy of the data in the cache facilitates rapid data access.

A DRAM is used for the main memory, for example. The main memory has a function of retaining a program or data which are read from the storage. The record density of a DRAM is approximately 0.1 to 0.3 Gbit/mm$^2$.

A 3D NAND memory is used for the storage, for example. The storage has a function of retaining data that needs to be stored for a long time and a variety of programs used in an arithmetic processing device, for example. Therefore, the storage needs to have large storage capacity and a high memory density rather than operating speed. The record density of a memory device used for the storage is approximately 0.6 to 6.0 Gbit/mm$^2$.

The memory device of one embodiment of the present invention operates fast and can retain data for a long time. The memory device of one embodiment of the present invention can be favorably used as a memory device positioned in a boundary region 901 including both the level where the cache is positioned and the level where the main memory is positioned. The memory device of one embodiment of the present invention can be favorably used as a memory device positioned in a boundary region 902 including both the level where the main memory is positioned and the level where the storage is positioned.

<Device Simulation of 3D OS NAND-Type Memory Device>

The CAAC-IGZO used for the memory device 900 can also be formed by an ALD method. This indicates that the transistor of one embodiment of the present invention or the like can be manufactured not only in the X-Y plane direction but also in the three-dimensional direction (Z-axis direction). The device simulation was performed on the assumption that a 3D OS NAND-type memory device in which a NAND-type memory device of one embodiment of the present invention is provided in the three-dimensional direction.

Figure 38:
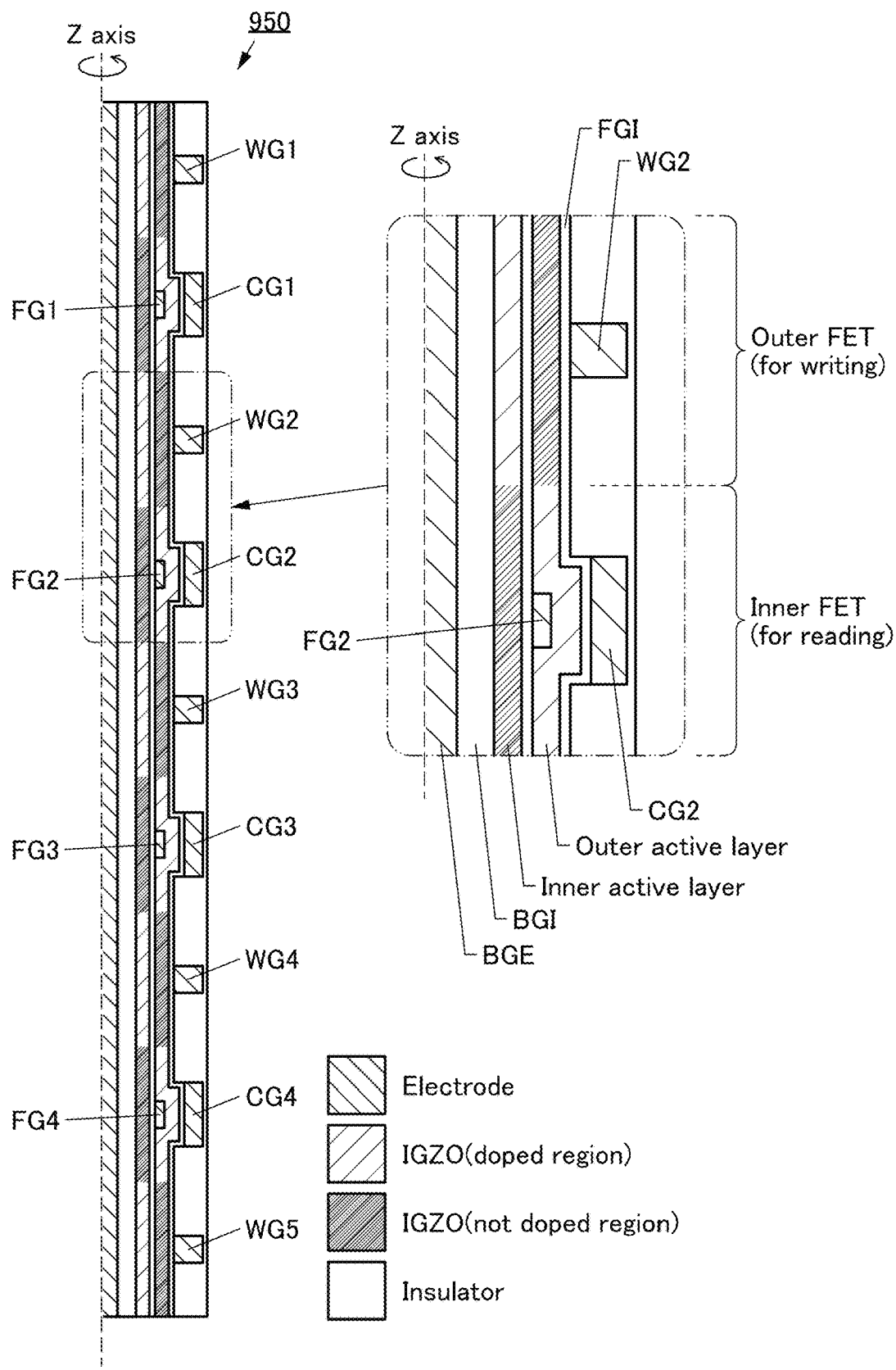
FIG. 38 is a two-dimensional structural view of a memory device used for device simulation.

The device simulation was performed using TCAD Sentaurus of Synopsys Inc. FIG. 38 illustrates a two-dimensional structural view of a memory device 950 used for the device simulation. The device simulation was performed on the assumption of the memory device 950 having a circular cylinder structure obtained by rotating the two-dimensional structure illustrated in FIG. 38 about the z-axis by 360°. For the memory device 950, a conductor FG1 to a conductor FG4 corresponding to the node SN1 to the node SN4, respectively, are assumed. A region where an impurity is introduced (doped region) and a region where no impurity is introduced (not doped region) are arranged in each of an IGZO layer of Inner active layer and an IGZO layer of Outer active layer.

Table 2 shows parameters for calculation used in the device simulation.

TABLE 2

| Software | | Sentaurus (Synopsys. Inc.) | | |
|---|---|---|---|---|
| Cell pitch | | | 300 | nm |
| Backgate Electrode(BGE) | | Work function | 4.7 | eV |
| Inner FET (for reading) Lgate = 30 gm | Backgate insulator (BGI) | Relative permittivity | 3.9 | |
| | | Thickness | 20 | nm |
| | Inner active layer | Material | IGZO | |
| | | Thickness | 15 | nm |
| | Insulator between active layers | Relative permittivity | 3.9 | |
| | | Thickness | 5 | nm |
| | Floating gate electrode (FG1~FG4) | Work function | 4.7 | eV |
| | | Thickness | 10 | nm |
| Outer FET (for writing) Lgate = 30 nm | Outer active layer | Material | IGZO | |
| | | Thickness | 15 | nm |
| | Frontgate insulator (FGI) | Material | 3.9 | |
| | | Thickness | 5 | nm |
| | Writing gate Electrode (WG1~WG5) | Work function | 4.7 | eV |
| | | Thickness | 50 | nm |
| Storage capacitor | Insulator | Making use of FGI\Outer active layer | | |
| | Control gate electrode (CG1~OG5) | Work function | 4.7 | eV |
| | | Thickness | 20 | nm |
| Semiconductor material parameter | IGZO | Electron affinity | 4.6 | eV |
| | | Bandgap | 3.0 | eV |
| | | Relative permittivity | 15 | |
| | | Electron mobility | 8 | $cm^2 V^{-1} s^{-1}$ |
| | | Hole mobility | 0.01 | $cm^2 V^{-1} s^{-1}$ |
| | | Nc | $1 \times 10^{15}$ | $cm^{-3}$ |
| | | Nv | $1 \times 10^{15}$ | $cm^{-3}$ |
| | | Doping density (Only doped regions in fig.) | $1 \times 10^{15}$ | $cm^{-3}$ |

Figure 9:
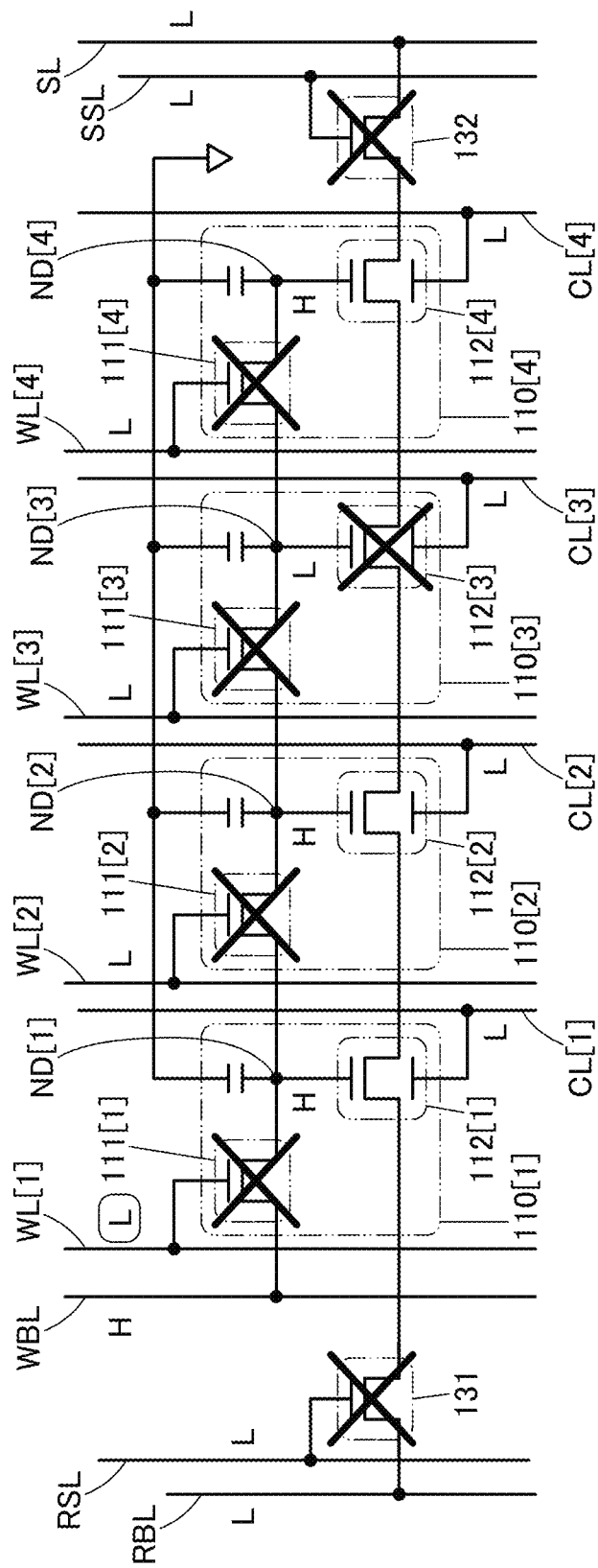
FIG. 9 is a circuit diagram for describing the writing operation.
Figure 10A:
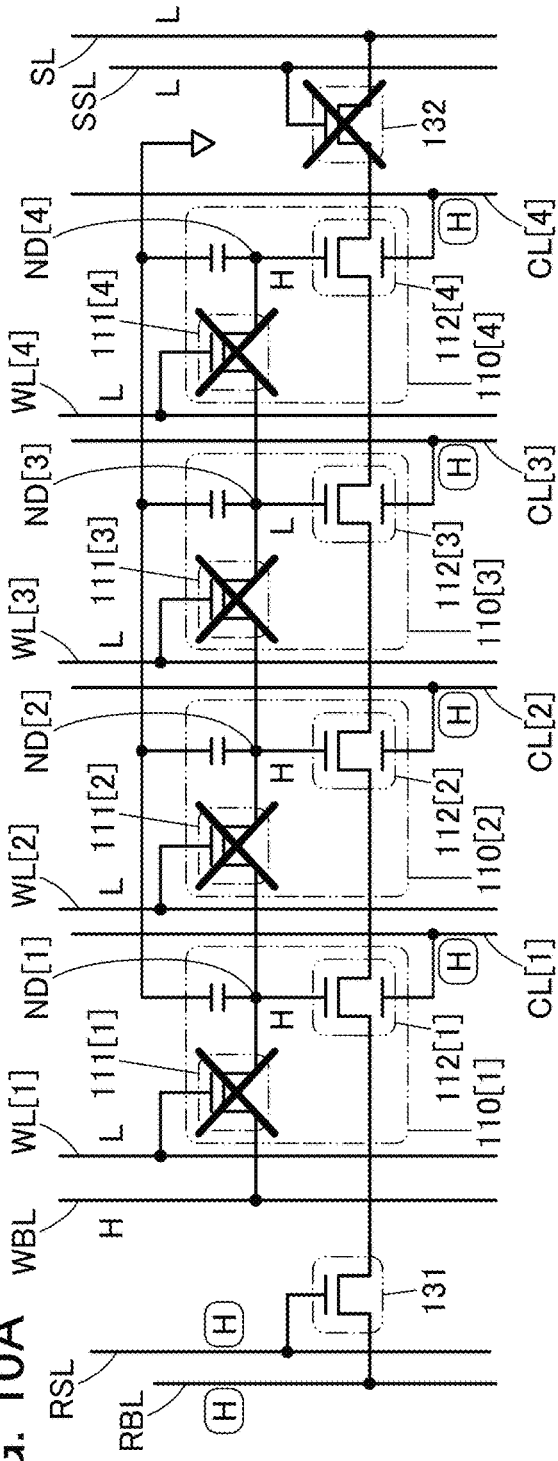
FIG. 10A and FIG. 10B are circuit diagrams for describing the reading operation.
Figure 10B:
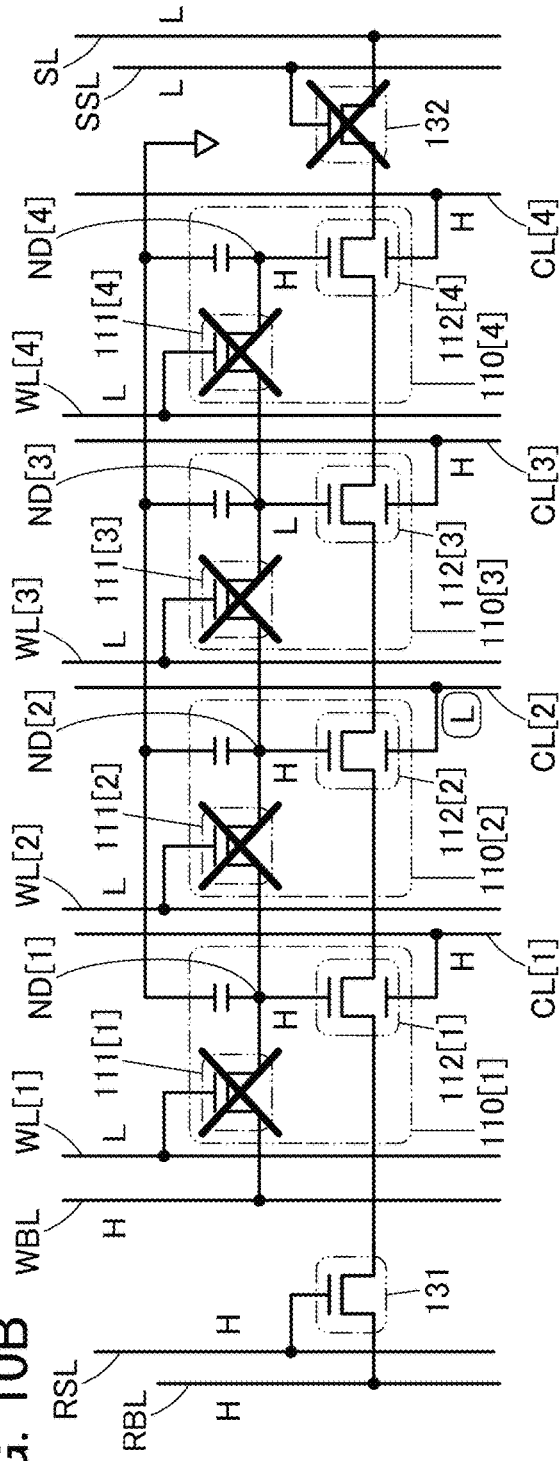
Figure 39:
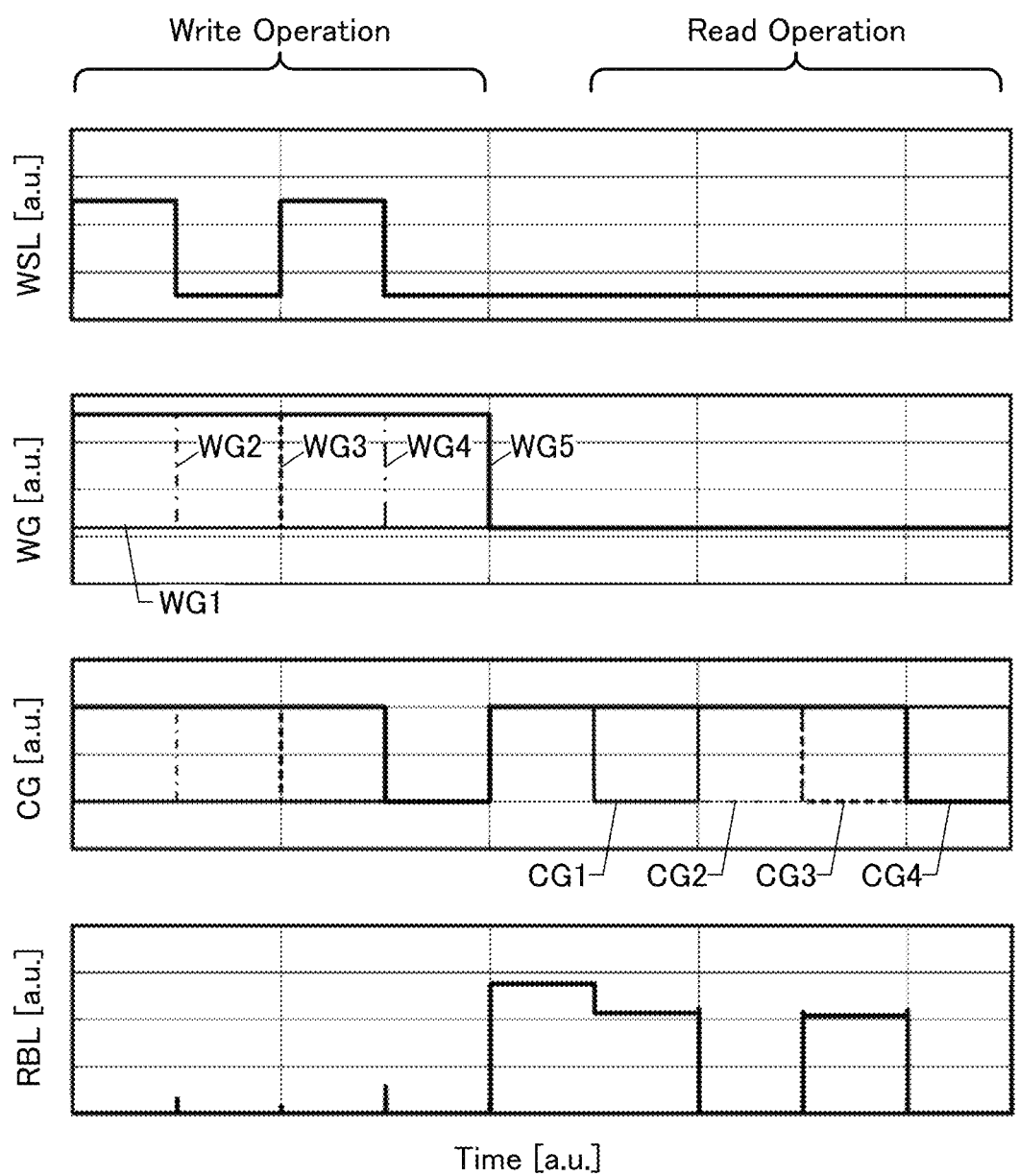
FIG. 39 shows calculation results of a writing operation and a reading operation.

FIG. 39 shows calculation results of the writing operation and the reading operation of the memory device 950. FIG. 9 shows changes in the potentials of the wiring RBL, the wiring CG, the wiring WG, and the wiring WSL in the writing operation (Write Operation) and the reading operation (Read Operation). The horizontal axis in FIG. 39 represents elapsed time (Time).

As can be seen from FIG. 39, the memory device 950 is capable of operations of data writing and reading in the same principle as that of the memory device described in the above embodiment or the like. This revealed that the fabricated memory device 900 can be manufactured longitudinally, which leads to further miniaturization and higher integration.

This example can be implemented in combination with any of the structures described in the other embodiments and the like, as appropriate.

REFERENCE NUMERALS

100: memory device, 110: memory cell, 111: transistor, 112: transistor, 121: terminal, 122: terminal, 123: terminal, 131: transistor, 132: transistor, 133: terminal, 134: terminal, 200: semiconductor device, 210: driver circuit, 211: peripheral circuit, 212: control circuit, 215: peripheral circuit, 220: memory array, 221: row decoder, 222: column decoder, 223: row driver, 224: column driver, 225: input circuit, 226: output circuit, 227: sense amplifier, 228: voltage generation circuit

The invention claimed is:

1. A memory device comprising n memory cells (n is an integer greater than or equal to 3), n first wirings, n second wirings, and a third wiring,
   wherein an i-th memory cell (i is an integer greater than or equal to 2 and less than n) comprises a first transistor [i], a second transistor[i], and a capacitor[i],
   wherein an i−1-th memory cell comprises a first transistor [i−1], a second transistor[i−1], and a capacitor[i−1],
   wherein an i+1-th memory cell comprises a first transistor [i+1], a second transistor[i+1], and a capacitor[i+1],
   wherein a gate of the first transistor[i] is electrically connected to an i-th first wiring,
   wherein a source of the first transistor[i] is electrically connected to a drain of the first transistor[i−1],
   wherein a drain of the first transistor[i] is electrically connected to a source of the first transistor[i+1],
   wherein a gate of the second transistor[i] is electrically connected to the drain of the first transistor[i],
   wherein a source of the second transistor[i] is electrically connected to a drain of the second transistor[i−1],
   wherein a drain of the second transistor[i] is electrically connected to a source of the second transistor[i+1],
   wherein a back gate of the second transistor[i] is electrically connected to an i-th second wiring,
   wherein a back gate of the second transistor[i−1] is electrically connected to an i−1-th second wiring,
   wherein a back gate of the second transistor[i+1] is electrically connected to an i+1-th second wiring,
   wherein the capacitor[i] is between the gate of the second transistor[i] and the third wiring,
   wherein the capacitor[i−1] is between a gate of the second transistor[i−1] and the third wiring, and
   wherein the capacitor[i+1] is between a gate of the second transistor[i+1] and the third wiring.

2. The memory device according to claim 1,
   wherein the first transistor[i] comprises an oxide semiconductor in a semiconductor layer.

3. The memory device according to claim 2,
   wherein the oxide semiconductor comprises at least one of indium and zinc.

4. The memory device according to claim 1,
wherein the second transistor[i] comprises an oxide semiconductor in a semiconductor layer.

5. The memory device according to claim 4,
wherein the oxide semiconductor comprises at least one of indium and zinc.

6. The memory device according to claim 1,
wherein the first transistor[i] comprises a back gate electrically connected to the gate of the first transistor[i].

7. A memory device comprising a plurality of memory cells, a plurality of first wirings, a plurality of second wirings, and a third wiring,
wherein each of the plurality of memory cell comprises a first transistor, a second transistor, and a capacitor,
wherein the plurality of the memory cell comprises first to third memory cells arranged continuously,
wherein a gate of the first transistor of the first memory cell is electrically connected to a first one of the plurality of first wirings,
wherein a gate of the first transistor of the second memory cell is electrically connected to a second one of the plurality of first wirings,
wherein a source of the first transistor of the second memory cell is electrically connected to a drain of the first transistor of a first memory cell,
wherein a drain of the first transistor of the second memory cell is electrically connected to a source of the first transistor of a third memory cell,
wherein a gate of the second transistor of the second memory cell is electrically connected to a drain of the first transistor of the second memory cell,
wherein a source of the second transistor of the second memory cell is electrically connected to a drain of the second transistor of the first memory cell,
wherein a drain of the second transistor of the second memory cell is electrically connected to a source of the second transistor of the third memory cell,
wherein a back gate of the second transistor of the first memory cell is electrically connected to a first one of the plurality of second wirings,
wherein a back gate of the second transistor of the second memory cell is electrically connected to a second one of the plurality of second wirings,
wherein a back gate of the second transistor of the third memory cell is electrically connected to a third one of the plurality of second wirings,
wherein the capacitor of the first memory cell is provided between the gate of the second transistor of the first memory cell and the third wiring,
wherein the capacitor of the second memory cell is provided between the gate of the second transistor of the second memory cell and the third wiring, and
wherein the capacitor of the third memory cell is provided between the gate of the second transistor of the third memory cell and the third wiring.

8. The memory device according to claim 7,
wherein in at least one of the plurality of memory cells, the first transistor comprises an oxide semiconductor in a semiconductor layer.

9. The memory device according to claim 8,
wherein the oxide semiconductor comprises at least one of indium and zinc.

10. The memory device according to claim 7,
wherein in at least one of the plurality of memory cells, the second transistor comprises an oxide semiconductor in a semiconductor layer.

11. The memory device according to claim 10,
wherein the oxide semiconductor comprises at least one of indium and zinc.

12. The memory device according to claim 7,
wherein in at least one of the plurality of memory cells, the first transistor comprises a back gate electrically connected to the gate of the first transistor.

* * * * *